United States Patent
Goto

(10) Patent No.: US 6,836,365 B2
(45) Date of Patent: Dec. 28, 2004

(54) DIFFRACTIVE OPTICAL ELEMENT, METHOD OF FABRICATING THE ELEMENT, ILLUMINATION DEVICE PROVIDED WITH THE ELEMENT, PROJECTION EXPOSURE APPARATUS, EXPOSURE METHOD, OPTICAL HOMOGENIZER, AND METHOD OF FABRICATING THE OPTICAL HOMOGENIZER

(75) Inventor: Akihiro Goto, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/549,720

(22) Filed: Apr. 14, 2000

(65) Prior Publication Data

US 2002/0080491 A1 Jun. 27, 2002

(30) Foreign Application Priority Data

Apr. 15, 1999 (JP) ............................................ 11-107747
Oct. 5, 1999 (JP) ............................................ 11-284498
Feb. 14, 2000 (JP) ............................................ 2000-035910

(51) Int. Cl.[7] ........................... G02B 27/44; G02B 5/18; G02B 5/32; G03B 27/52
(52) U.S. Cl. ........................ 359/569; 359/565; 359/599; 359/900; 355/67
(58) Field of Search ................................. 359/9, 15, 19, 359/20, 565, 566, 569, 570, 599, 900; 355/67

(56) References Cited

U.S. PATENT DOCUMENTS

| | | | | |
|---|---|---|---|---|
| 3,536,371 A | * | 10/1970 | Post | 359/20 |
| 3,547,546 A | * | 12/1970 | Schier | 353/34 |
| 4,547,037 A | | 10/1985 | Case | |
| 5,300,971 A | | 4/1994 | Kudo | 355/67 |
| 5,335,044 A | | 8/1994 | Shiraishi | 355/53 |
| 5,357,311 A | | 10/1994 | Shiraishi | 355/53 |
| 5,412,506 A | * | 5/1995 | Feldblum et al. | 359/569 |
| 5,420,417 A | | 5/1995 | Shiraishi | 250/205 |
| 5,631,721 A | * | 5/1997 | Stanton et al. | 355/71 |
| 5,638,211 A | | 6/1997 | Shiraishi | 359/559 |
| 5,703,675 A | | 12/1997 | Kirukawa et al. | 355/53 |

(List continued on next page.)

FOREIGN PATENT DOCUMENTS

| | | |
|---|---|---|
| EP | A2-0 486 316 | 5/1992 |
| EP | A1-0 747 772 | 12/1996 |
| EP | 0844529 A2 * | 5/1998 |
| EP | 1 008 914 A2 * | 11/1999 |
| EP | 1 014 196 A2 | 6/2000 |
| EP | 1 069 600 A1 | 1/2001 |
| EP | 1 109 067 A2 | 6/2001 |
| JP | A-7-263313 | 10/1995 |
| JP | A-10-197788 | 7/1998 |
| JP | A-11-176721 | 7/1999 |

OTHER PUBLICATIONS

U.S. patent application No. 09/667,606 filed Mar. 3, 1999.
U.S. patent application No. 09/540,874 filed Mar. 31, 2000.
Pepler et al., "Binary–phase Fresnal zone plate arrays for high–power laser beam smoothing", SPIE, vol. 2404, pp. 258–265, Mar., 1995.

(List continued on next page.)

Primary Examiner—John Juba, Jr.
(74) Attorney, Agent, or Firm—Oliff & Berridge PLC

(57) ABSTRACT

A diffractive optical element efficiently converts an input light beam into an output light beam having a specified cross-sectional shape. The diffractive optical element includes a plurality of partial optical elements. The plurality of partial optical elements convert the input light beam to respective partial light beams, each of which has a shape that does not correspond to the specified cross-sectional shape. The sum of the partial light beams matches the shape of the output light beam (i.e., having the specified cross-sectional shape).

29 Claims, 47 Drawing Sheets

U.S. PATENT DOCUMENTS

| | | | |
|---|---|---|---|
| 5,719,704 A | | 2/1998 | Shiraishi et al. ............ 359/558 |
| 5,815,248 A | | 9/1998 | Nishi et al. .................... 355/71 |
| 5,896,188 A | * | 4/1999 | McCullough ................. 355/67 |
| 5,917,622 A | * | 6/1999 | Diffin et al. ................... 359/15 |
| 5,920,380 A | * | 7/1999 | Sweatt ......................... 355/71 |
| 5,963,305 A | * | 10/1999 | Mizouchi ..................... 355/67 |
| 6,002,520 A | * | 12/1999 | Hoch et al. ................. 359/565 |
| 6,025,938 A | * | 2/2000 | Kathman et al. ............. 359/15 |
| 6,033,094 A | * | 3/2000 | Sohn ........................... 362/332 |
| 6,072,631 A | * | 6/2000 | Guenther et al. ........... 359/565 |
| 6,107,000 A | * | 8/2000 | Lee et al. .................... 430/296 |
| 6,120,950 A | * | 9/2000 | Unno .......................... 356/399 |
| 6,198,793 B1 | | 3/2001 | Schultz et al. ................ 378/34 |
| 6,211,944 B1 | | 4/2001 | Shiraishi ....................... 355/53 |
| 6,243,206 B1 | | 6/2001 | Wangler ....................... 355/53 |
| 6,259,512 B1 | * | 7/2001 | Mizouchi ..................... 355/53 |
| 6,285,443 B1 | | 9/2001 | Wangler et al. ............... 355/67 |
| 6,392,742 B1 | * | 5/2002 | Tsuji ....................... 250/492.2 |
| 6,445,442 B2 | * | 9/2002 | Von Bunau et al. .......... 355/67 |
| 6,452,662 B2 | * | 9/2002 | Mulkens et al. ............... 355/67 |
| 2001/0001247 A1 | * | 5/2001 | Finders et al. ................. 355/53 |
| 2001/0046038 A1 | | 11/2001 | Mulkens et al. ............... 355/67 |

OTHER PUBLICATIONS

Gruetzner et al., "Optical and control modeling for adaptive beam–combining experiments", SPIE, vol. 2534, pp. 94–104, May, 1995.

Neal et al., "A Multi–Tiered Wavefront Sensor using Binary Optics", SPIE, vol. 2201, Adaptive Optics in Astronomy, pp. 574–585, Apr., 1994.

Jain, "Multi–beam, two–dimensional binary optics laser scanner", SPIE, vol. 2152, pp. 72–83, Jun., 1984.

Shaver et al., "A Small–Field Stepper for 193–nm Lithography Process Development", SPIE, vol. 1674, Optical/Laser Microlithography V, pp. 766–775, Aug., 1992.

Jahns, "Integrated Microoptics for Computing and Switching Application", SPIE, vol. 1544, Miniature and Micro–Optics: Fabrication and System Applications, pp. 246–262, Apr., 1991.

Guest et al., "Design of computer generated holograms for electron beam fabrication by means of a computer–aided design system", SPIE, vol. 884, Computer–Generated Holography II, pp. 32–39, 1988.

Bett et al., "Binary phase zone–plate arrays for laser–beam spatial–intensity distribution conversion", Applied Optics, vol. 34, No. 20, pp. 4024–4036, Jul. 10, 1995.

Feng et al., "Texture information processing system with binary optical wavelet element", SPIE, vol. 2866, pp. 84–89, Aug. 26–28, 1996.

Sincerbox, "Miniature optics for optical recording", SPIE, vol. 935, Gradient–Index Optics and Miniature Optics, pp. 63–76, 1988.

Zarschizky et al., "A Multifacet Diffractive Mirror for Optical Clock Signal Distribution", SPIE, vol. 1732, Holographics International, pp. 297–306, Jul. 1993.

Logue et al., "General approaches to mask design for binary optics", SPIE, vol. 1052, Holographic Optics: Optically and Computer Generated, pp. 19–24, 1989.

* cited by examiner

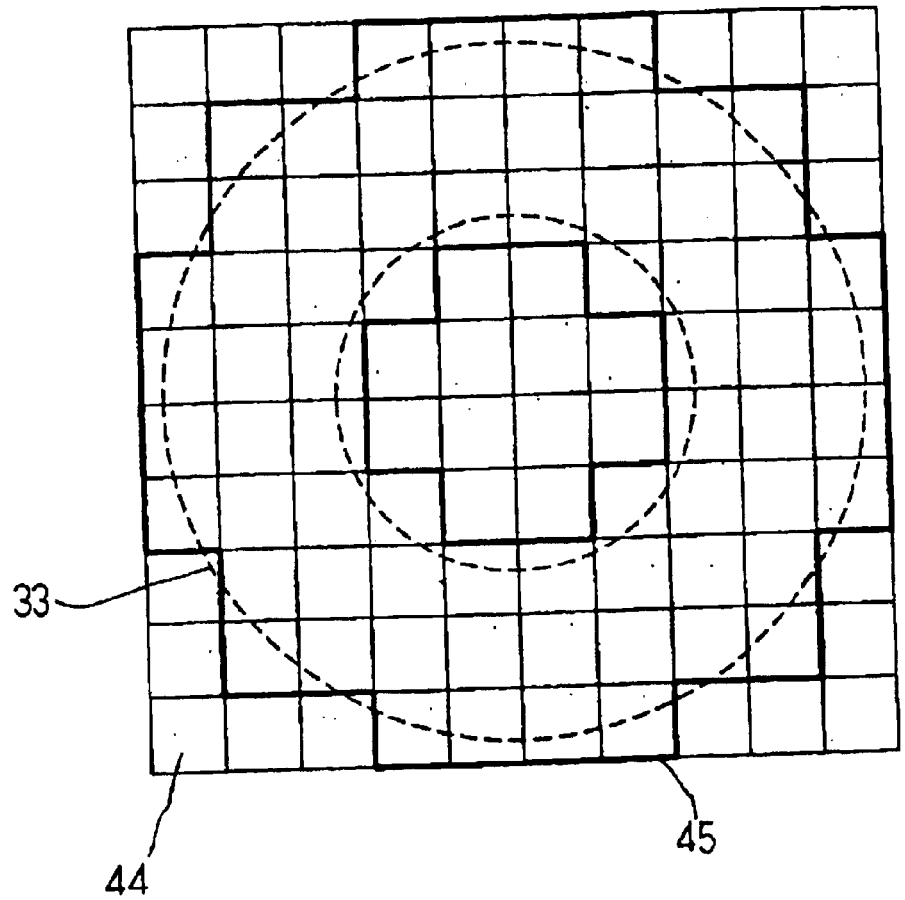
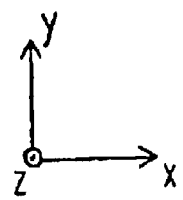
Fig.5

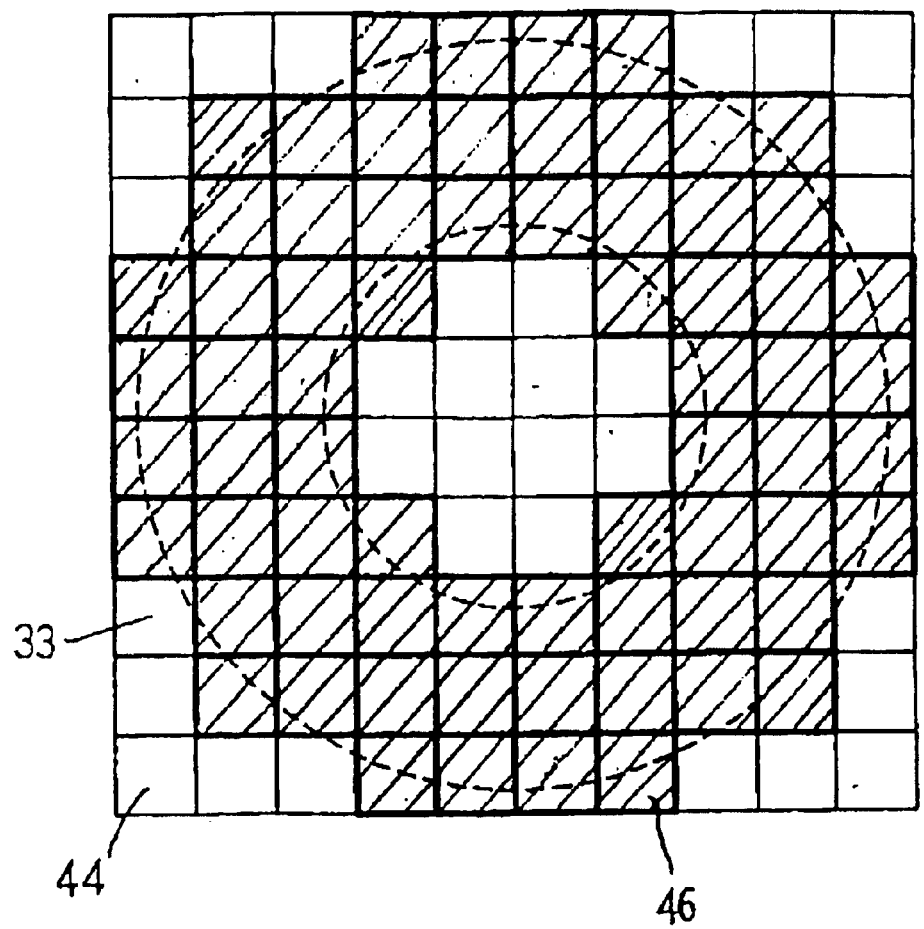
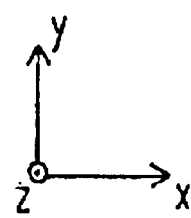
Fig. 6

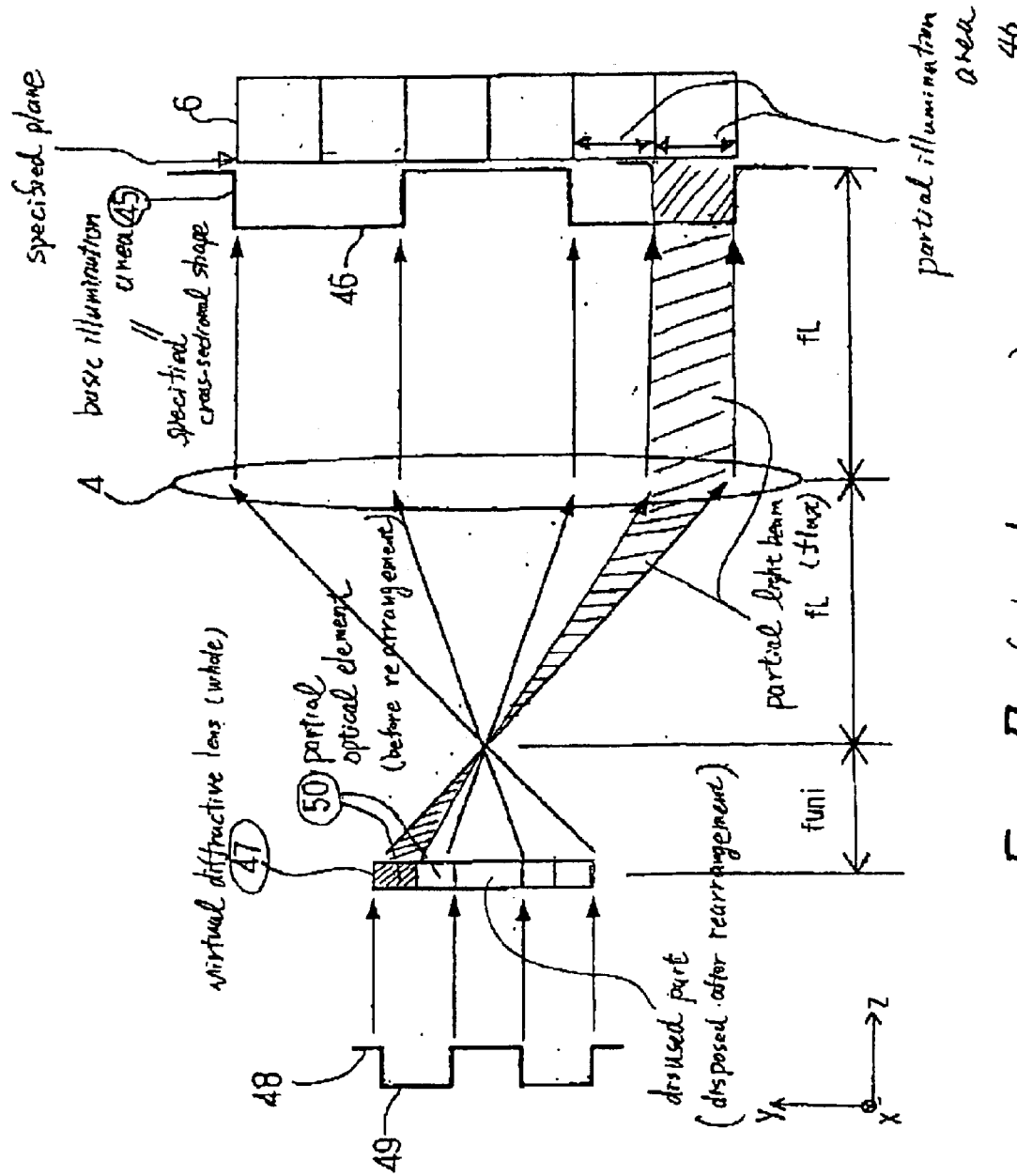
Fig. 7 (detail version)

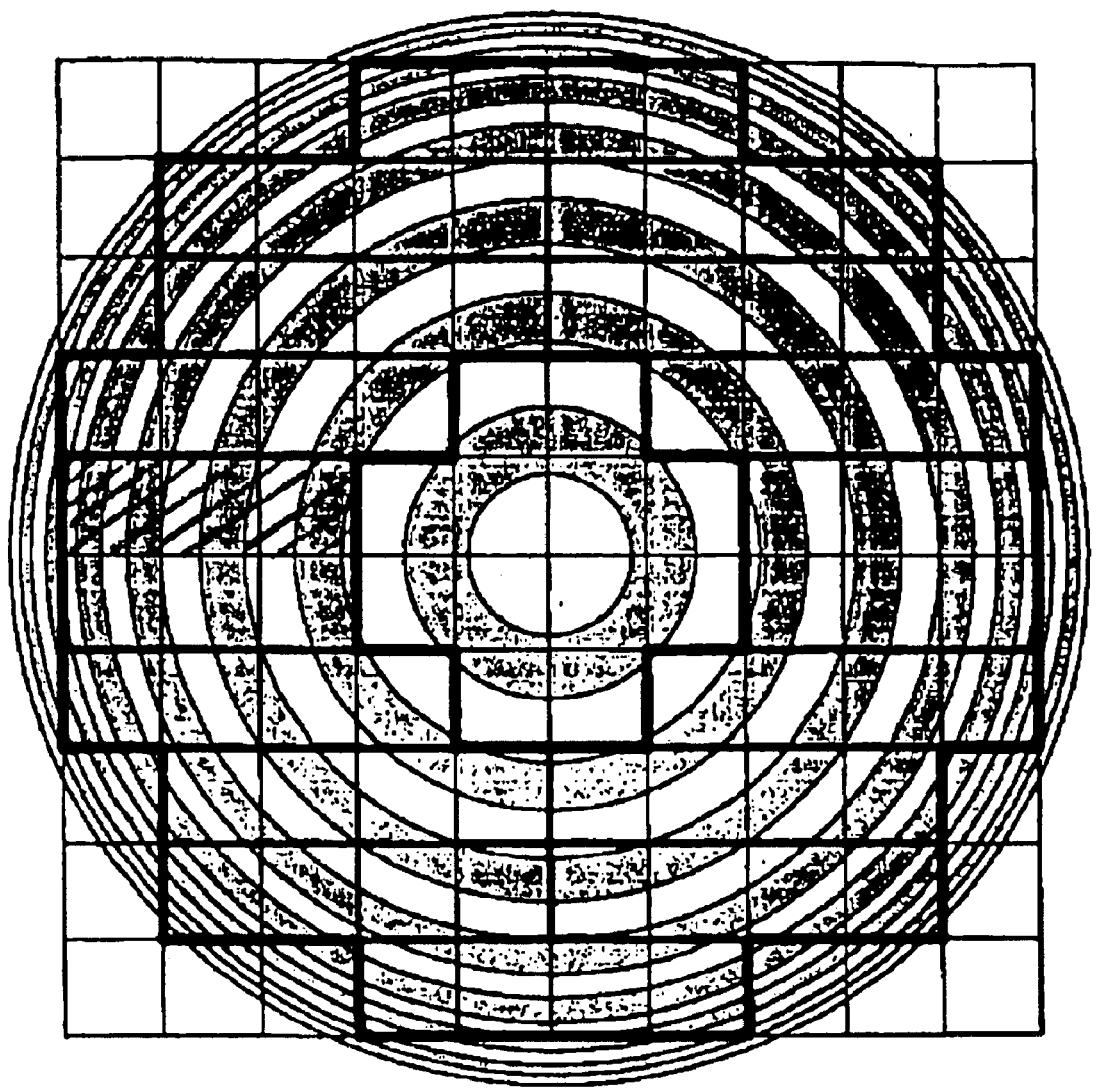
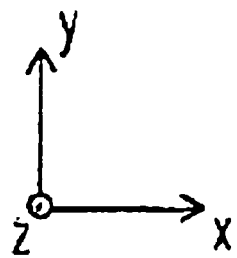
Fig. 15

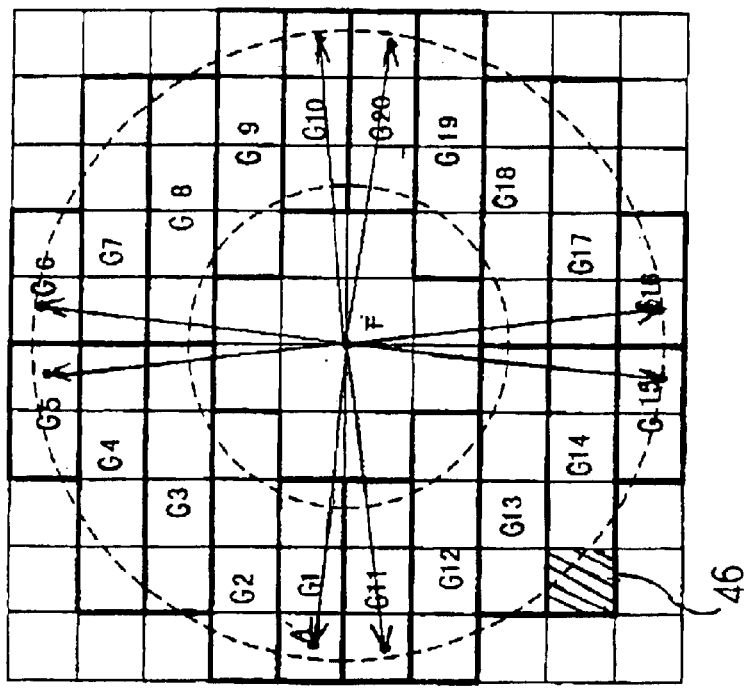
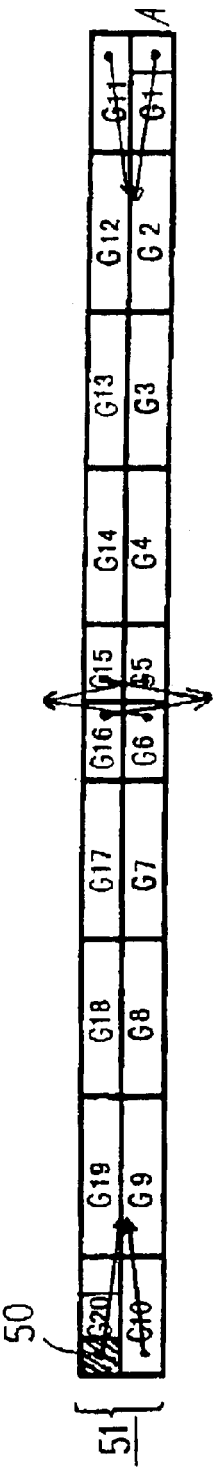
Fig. 34A
Fig. 34B

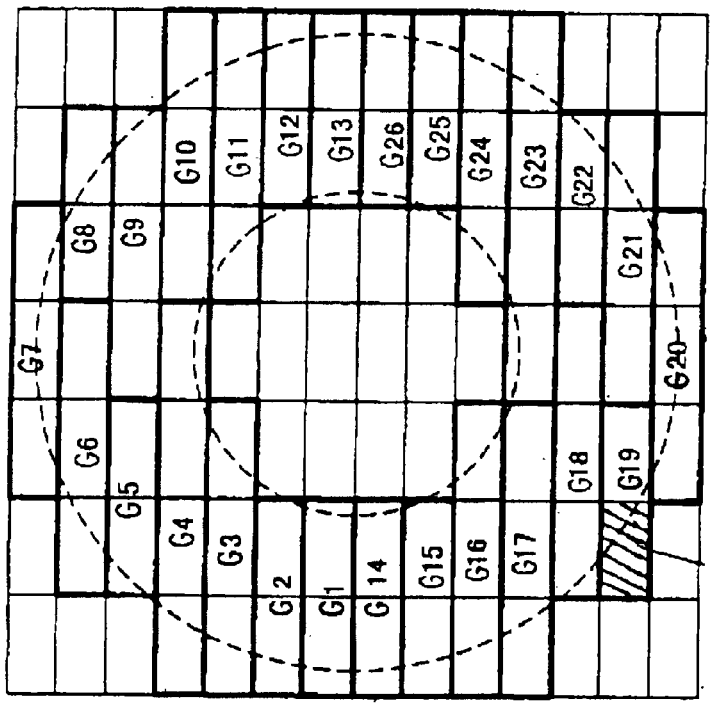
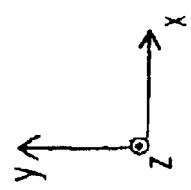
Fig. 37A
Fig. 37B

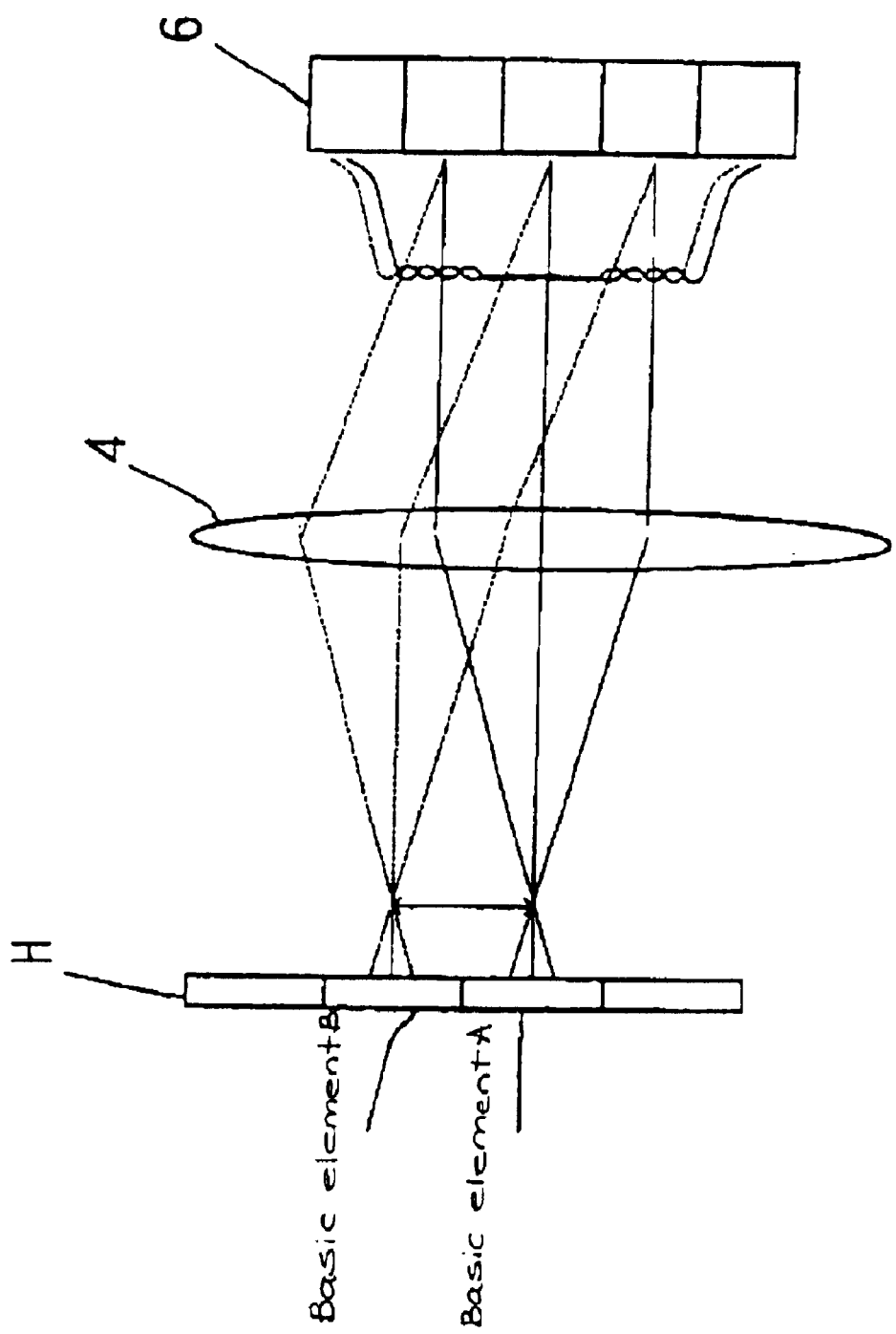

DIFFRACTIVE OPTICAL ELEMENT, METHOD OF FABRICATING THE ELEMENT, ILLUMINATION DEVICE PROVIDED WITH THE ELEMENT, PROJECTION EXPOSURE APPARATUS, EXPOSURE METHOD, OPTICAL HOMOGENIZER, AND METHOD OF FABRICATING THE OPTICAL HOMOGENIZER

INCORPORATION BY REFERENCE

The disclosures of the following priority applications are incorporated herein by reference in their entireties: Japanese Patent Application No. 11-107747, filed Apr. 15, 1999; Japanese Patent Application No. 11-284498, filed Oct. 5, 1999; and Japanese Patent Application No. 2000-35910, filed Feb. 14, 2000.

BACKGROUND OF THE INVENTION

1. Field of Invention

This invention relates to a diffractive optical element and its fabrication method, an illumination device provided with the diffractive optical element, a projection exposure apparatus, and an exposure method. In particular, the invention relates to a device that illuminates a mask pattern for a semiconductor integrated circuit, a liquid crystal device, or the like, and an exposure method using the illumination device and a projection exposure apparatus that is suitable to the illumination device.

2. Description of Related Art

A process that is generally called photolithography is used for circuit pattern formation on a semiconductor substrate or the like. In this process, a reticle (mask) pattern is transferred onto a substrate such as a semiconductor wafer. First, a photosensitive photoresist is coated on the substrate, and a circuit pattern is transferred to the photoresist by an irradiated optical image, formed, e.g., from a transparent part of a reticle pattern. Furthermore, in a projection exposure apparatus, an image of a circuit pattern to be transferred, which was formed on the reticle, is projected and exposed onto the substrate (wafer) via a projection optical system. An illumination optical system of this projection exposure apparatus includes an optical integrator such as a fly eye lens to make an intensity distribution of the illumination light irradiated onto the reticle homogeneous. The following describes the reason why the intensity distribution of the illumination light irradiated onto the reticle is made homogeneous by using an optical integrator such as a fly eye lens.

FIG. 27A is a schematic diagram of an optical system of a projection exposure apparatus using a fly eye lens. The light beam generated from a light source (e.g., a KrF excimer laser) 100 is guided to a fly eye lens 103 via a beam expander optical system 101 and an oscillating mirror 102. Furthermore, the light emitted from the fly eye lens passes through an aperture diaphragm and illuminates a reticle 105 via a condenser lens 104. The pattern on the reticle 105 is then projected by a projection optical system 106 onto a substrate 107. The surface of the reticle 105 and the input surfaces of the respective lenses that constitute the fly eye lens 103 are located at conjugate positions relative to the condenser lens 104. Accordingly, the light beam input to the fly eye lens is divided by element lens units of the fly eye lens, and the divided light beams are then overlapped on the reticle surface. Because of this, even if there is a significant distribution of contrast difference in, for example, a Gaussian distribution of the light beam input to the fly eye lens, this distribution does not become significant at the element lens units of the fly eye lens, and is made to be uniform on the reticle surface because they overlap each other, and illumination distribution with extremely high homogeneousness can be obtained on the reticle surface 105.

A system is conventionally known in which processing such as beam splitting and overlapping thereof is repeated twice, and this system is hereafter called a double fly eye lens system. One example of an optical system of a conventional projection exposure apparatus using a double fly eye lens is shown in FIG. 27B. A shape of a light beam from a light source 201 such as an excimer laser is converted into a light beam with an arbitrary cross-sectional shape via an expander 202. The light beam then is input to a first fly eye lens (second light source) 205 formed of a plurality of optical elements via a mirror 203 and a quartz prism 204 for alleviating polarization of the light beam, and a plurality of second light source images are formed at the output surface of the first fly eye lens 205. The light beams output from the plurality of second light sources are condensed by a relay lens 206 and are superimposed on each other so as to homogeneously illuminate the input surface of a second fly eye lens 207. As a result, a number of third light source images that is equal to the product of the number of lens elements of the first fly eye lens and the number of lens elements of the second fly eye lens can be formed. Furthermore, the diameter of the light beam from the third light source is restricted by a diaphragm 208, condensed by condenser lens groups 209 and 211 (which includes bending mirror 212), and are superimposed so as to homogeneously illuminate a pattern on a reticle or mask 213. Here, a field diaphragm 210 to determine an illumination area is arranged among the condenser lens groups 209 and 211. Furthermore, based on the illumination light that has been homogeneously illuminated, a pattern formed on the reticle or the mask 213 is projected onto a substrate 215, which is the object of optical exposure, via projection lenses 214.

The characteristics of a system called a double fly eye lens as compared to a system using only one fly eye lens are described below. Furthermore, in order to simplify the description, the system using only one fly eye lens is called a single fly eye lens system.

(1) With respect to the effect that makes the illumination light that illuminates a reticle homogeneous, the greater the number of divisions of the fly eye lens (i.e., the more lens units within the fly eye lens), the more significant the effect becomes. However, the fabricating cost of the fly eye lens is substantially proportional to the number of divisions of the fly eye lens. Because of this, if many beam splittings are implemented by a single fly eye lens system, the fabricating cost of the lens becomes unacceptable. In the double fly eye lens system, the number of divisions of the first fly eye lens multiplied by the number of divisions of the second fly eye lens becomes the total number of divisions of the optical system. Accordingly, in a double fly eye lens system, there is an advantage that an illumination system with high performance can be obtained without unacceptably high fabricating cost. For example, if the first fly eye lens has 100 divisions and the second fly eye lens has 100 divisions, an illumination system that is equivalent to 10,000 (=100×100) divisions can be obtained at the fabricating cost of two lenses with 100 divisions.

(2) In a single fly eye lens system, the light distribution of the light source is input to the fly eye lens as-is. Therefore, if the light distribution changes with oscillation of the light source or the like, the spatial coherence of the projection exposure apparatus changes, which is not desirable. However, in the double fly eye lens system, the light distribution input to the second fly eye lens has been made homogeneous by the first fly eye lens. Accordingly, the light distribution hardly changes even if the light source is oscillated or the like. Therefore, there is an advantage such that it is difficult to affect the image performance even if oscillation or the like is generated in the light source.

(3) Another advantage of the double fly eye lens system is that the amount of change of the illumination homogeneousness when the aperture diaphragm is replaced, that is, the amount of change from an ideal Koehler illumination state, is less.

In addition to the above considerations, performance capability such as, e.g., resolution, which is demanded for these exposure apparatus has been approaching the theoretical limit. As is generally well known, a setting value of the optimum constant (e.g., numerical aperture of a projection lens, and numerical aperture of an illumination system, or the like) of the optical system varies depending on the pattern of a reticle. However, a device is demanded such that the optimum constant of the optical system can be selected according to the pattern of the mask because exposure is performed near the theoretical limit of the device performance capability.

Considering this fact in an illumination system, at least the numerical aperture of the illumination system needs to be variable. For the double fly eye lens system shown in FIG. 27B to be made with a variable numerical aperture, the diameter of the aperture diaphragm 208 could be made to be variable just like a diaphragm of a camera, or the diaphragm could be made to be switchable. However, if the diaphragm diameter is merely switched, in the case of changing the diaphragm diameter to a small diaphragm diameter, the area in which the light beam is shielded becomes large, and illumination power deteriorates.

Illumination power deterioration in this type of exposure apparatus means throughput deterioration. This increases the cost of the fabricated product. The profit margin per product is extremely low, especially for memory products, so the fabricating cost is a particularly important factor in the field of fabricating semiconductors or the like. Because of this, one of the most important issues in various specifications of exposure apparatus is "illumination power," and it is necessary to avoid illumination power deterioration as much as possible.

In the double fly eye lens system, as a strategy against illumination power deterioration, a method has been proposed in which the first fly eye lens is switched to a lens having a different focal length along with a diaphragm. For example, in the case of making the aperture diaphragm diameter small, the first fly eye lens is switched to a lens having a long focal length. By this technique, because the light beam is condensed in the vicinity of the center of the second fly eye lens input surface, illumination power hardly deteriorates even if the aperture diaphragm diameter is small.

Thus, if the aperture diaphragm diameter merely changes, illumination power deterioration can be avoided by switching the focal length of the first fly eye lens. However, recently, there is a case in which a diaphragm having a shape other than a round shape is used as an aperture diaphragm. Examples are the ring diaphragm shown in FIG. 28 and the multiple aperture diaphragm shown in FIG. 29.

The aperture diaphragms of FIGS. 28 and 29 are briefly explained. When the pattern of the reticle becomes microsmall and exposure is performed near the resolution limit of the device, among the light beams generated from the aperture diaphragm of the illumination system, it is only the light generated from the part surrounding the aperture diaphragm that contributes to resolution; the light generated from the center of the aperture merely decreases the image contrast. In other words, when the information of the reticle is transmitted to the wafer, it is only the light generated from the surrounding part of the aperture diaphragm that provides the information transmission energy. The light generated from the center of the aperture merely generates so-called noise. Therefore, it is preferable that light should not be generated from the center of the aperture diaphragm. The diaphragm shown in FIG. 28 was employed to address this phenomenon. The diaphragm shown in FIG. 29 is a diaphragm that is used when the pattern to be resolved is limited to only lines of the vertical and horizontal directions. In this case, the light generated from upper, lower, right and left portions of the aperture diaphragm merely generates noise. The diaphragm shown in FIG. 29, which further shields the top, bottom, right and left of the aperture diaphragm, was employed to address this phenomenon.

In the case of this type of aperture that is not a round aperture, there is a problem in that loss of the light amount can occur because only one part of the transparent light amount of the fly eye lens is used; i.e., the light is shielded by the variable aperture diaphragm in many parts including the center, i.e., in the vicinity of the optical axis. Illumination power deteriorates at the reticle surface, and throughput decreases.

SUMMARY OF THE INVENTION

This invention addresses the above-mentioned and/or other problems.

An object of this invention is to provide a diffractive optical element that effectively converts an input light beam to a light beam having a predetermined cross-sectional shape, and to provide a method of fabricating such a diffractive optical element.

Other objects of this invention are to provide an illumination device that is provided with the diffractive optical element and that can form various light intensity distributions at a specified surface, to provide a projection exposure apparatus that is suitable to use with the illumination device, and to provide an exposure method that uses the projection exposure apparatus.

In order to address the above and/or other problems, one aspect of this invention provides a diffractive optical element that converts an input light beam to an output light beam having a specified cross-sectional shape, in which the diffractive optical element includes a plurality of partial optical elements. Each of the plurality of partial optical elements converts the input light beam to respective specified partial light beams. Although each of the partial light beams does not have the specified shape, a sum of the partial light beams matches the specified cross-sectional shape of the output light beam.

Preferably the diffractive optical element includes a plurality of basic optical elements, each including a plurality of the partial optical elements.

Furthermore, it is preferable that the partial optical elements have a shape corresponding to a phase distribution that combines a phase distribution of a rotationally symmetrical lens component and a phase distribution of a diffractive grid that deflects input light in a specified direction.

Another aspect of this invention provides a method of fabricating a diffractive optical element having at least one basic optical element that includes a plurality of partial optical elements, the diffractive optical element converting an input light beam into an output light beam having a specified cross-sectional shape. The method includes the steps of:

dividing the specified cross-sectional shape into a plurality of partial areas; and arranging the plurality of partial optical elements, which correspond to the plurality of partial areas, into a condensed state, thereby defining the basic optical element.

Furthermore, another aspect of this invention provides an illumination device that illuminates a mask in which a specified pattern is formed, including a light source, a light beam converter, an optical integrator and a condenser optical system. The light source supplies a light beam. The light beam converter includes a diffractive optical element as described above, and receives the light beam from the light source. The optical integrator receives the output light beam from the light beam converter and forms a substantially planar light source at a specified plane based on the light beam that is diffracted by the light beam converter. The condenser optical system guides the light beam from the optical integrator to the mask. The light beam converter can change an optical intensity distribution on the specified plane.

Additionally, another aspect of this invention provides a projection exposure apparatus including: a first stage for holding the mask, the illumination device set forth above that illuminates the mask, a second stage for holding a substrate to be exposed, and a projection optical system to project and expose an image of a pattern of the mask that has been illuminated by the illumination device onto the substrate.

Another aspect of this invention provides an exposure method, including the steps of (1) illuminating a mask utilizing the illumination device set forth above, and (2) forming an image of a pattern of the illuminated mask onto a substrate that is coated by a photosensitive material.

Another aspect of this invention relates to an optical homogenizer having a plurality of basic optical elements formed by etching a substrate, each of the basic optical elements illuminating different areas which are overlapped but shifted relative to each other to average the noise in a specified plane.

An optical homogenizer is not limited to a diffractive element, but includes an optical intensity homogeneous element having a refractive type element, both a diffractive element and a refractive element, or the like.

It is preferable that an amount by which an area to be illuminated by each of the basic optical elements is shifted is equal to an amount that satisfies a relationship that fills in concave and convex parts of an intensity distribution of noise pattern due to Fresnel diffraction, or a noise pattern due to fabricating errors. Additionally, while the substrate can be a glass substrate, it is preferable to use a fluorite substrate if the wavelength of the input light beams becomes short.

By this technique, after the light beam passes the basic optical elements, the interference noise generated at the input surface of the optical integrator can be made homogeneous. As a result, illumination homogeneousness at the output surface of the optical integrator improves, and the illumination homogeneousness on the reticle plane (and on the wafer plane) is ultimately improved.

Another aspect of this invention relates to an optical homogenizer having a plurality of basic optical elements formed by etching a substrate, in which the basic optical elements are arranged so as to be shifted relative to each other based on an intensity cycle of an interference noise pattern generated by the plurality of basic optical elements.

By this technique, the interference noise formed by the optical integrator can be effectively made homogenous. As a result, much higher illumination homogeneousness can be obtained.

In conventional devices, a first fly eye lens was arranged at a position of the optical homogenizer, and the alignment accuracy of the element lens (that is, the basic optical elements) of the first fly eye lens was determined by the outer-diameter difference of the element lens. Because of this, a random average effect was obtained. On the contrary, the alignment accuracy of the basic optical elements is much higher in the etched optical homogenizer of this aspect of the invention. Therefore, a patterned average, that can obtain a better result than a random result, can be implemented. Furthermore, this effect is also good for a refractive type optical homogenizer that is fabricated by etching, instead of a diffractive type element.

Another aspect of this invention relates to a method of making an optical homogenizer comprising the steps of:

creating a reticle on which a pattern of a basic optical element is formed;

coating a sensitive material onto a substrate;

reduction exposing the pattern onto the sensitive material on the substrate via a reduction projection optical system;

shifting a position of the substrate and repeating the reduction exposing step, thereby generating latent images of the basic optical element in an arrayed state on the sensitive material; and developing and etching the latent images.

It is also preferable that the reticle includes a plurality of patterns of the basic optical element.

By this technique, compared to a proximity method, pattern resolution can be improved. As a result, patterning with less fabricating errors is possible, and transmission efficiency and illumination homogeneousness of the optical homogenizer are further improved. Additionally, because this is not a batch exposure method, an optical homogenizer with a better interference noise decreasing effect can be fabricated.

Furthermore, because a pattern of a plurality of basic optical elements is written on a reticle in advance, it is possible to decrease the number of exposures that are needed for fabricating the optical homogenizer. Accordingly, fabrication throughput of the optical homogenizer is improved, and the cost of the optical homogenizer can be decreased. Furthermore, writing errors generated during the plurality of basic pattern writings vary, and the respective elements are eventually used in parallel, so there is an effect in that the reticle writing errors are canceled. That is, illumination homogeneousness of the optical homogenizer is further improved.

It also is preferable that the pattern is formed on the reticle in the creating step by writing the pattern on the reticle with an electron beam.

By this process, because the optical homogenizer is fabricated by electron beam writing, patterning can be performed with high accuracy. As a result, patterning with less fabricating errors is possible, and the transmission efficiency and illumination homogeneousness of the optical homogenizer are further improved.

It is further preferable that the pattern is formed on the reticle in the creating step by projection exposing the reticle with the pattern from an original substrate that was fabricated by electron beam writing.

By this process, patterning can be performed with high accuracy. As a result, patterning with less fabricating errors is possible, and the transmission efficiency and illumination homogeneousness of the optical homogenizer are further improved. Furthermore, if a reticle is fabricated by exposing a substrate that has been EB written a plurality of times, the final number of exposures that are needed for fabricating the optical homogenizer can be decreased. That is, fabrication throughput of the optical homogenizer is improved, and the cost of the optical homogenizer can be decreased.

BRIEF DESCRIPTION OF THE DRAWINGS

The invention will be described in conjunction with the following drawings in which like reference numerals designate like elements and wherein:

FIG. 5 is a diagram showing an illumination area on a fly eye integrator;

FIG. 6 is a diagram explaining a partial illumination area;

FIG. 7 is a diagram explaining a principle of determining a surface shape of a diffractive optical element;

FIG. 15 is a diagram showing a structure of a binary diffractive lens;

FIG. 34A is a diagram showing the division of a basic illumination area of a fourth embodiment of this invention, and FIG. 34B is a diagram showing a condensed alignment of the corresponding partial elements;

FIGS. 37A and 37B are diagrams showing the division of a basic illumination area of a sixth embodiment of this invention, and a condensed alignment of the corresponding partial elements, respectively;

FIG. 38 is a diagram explaining a principle of a seventh embodiment of this invention;

DETAILED DESCRIPTION OF PREFERRED EMBODIMENTS

The following explains preferred embodiments of this invention, based on the attached drawings.

First Embodiment

Figure 1:
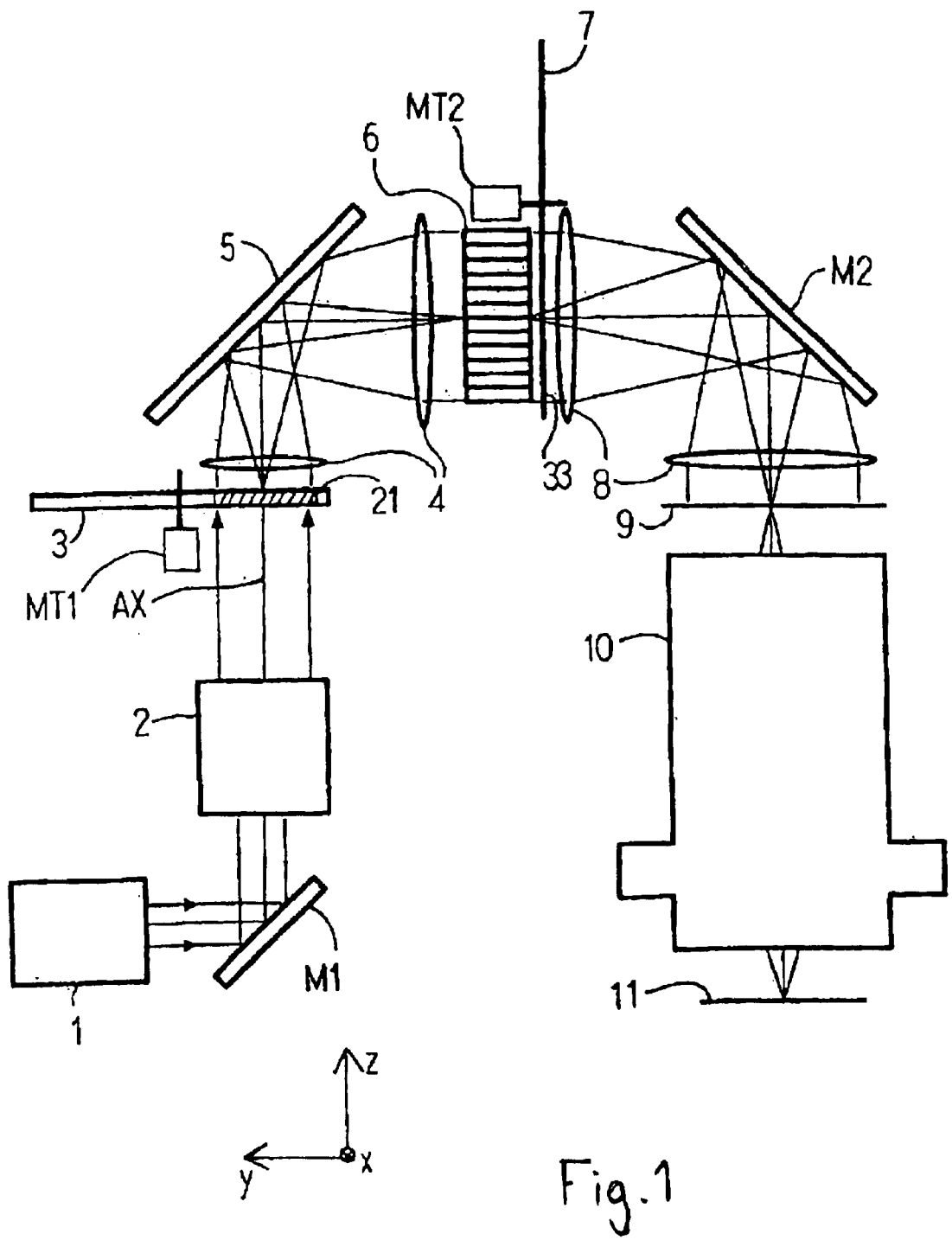
FIG. 1 is a diagram showing a schematic structure of a projection exposure apparatus according to a first embodiment of this invention.

FIG. 1 is a diagram showing a structure of a projection exposure apparatus according to a first embodiment of this invention. A light beam from an excimer laser 1 is bent at a reflection mirror M1, converted into a light beam having a desired cross-sectional shape by a beam adjusting optical system 2, and input to a diffractive optical element 21 disposed in a revolver 3. Consequently, a desired second light source array (i.e., a plurality of second light sources) is formed in the vicinity of the output surface of the diffractive optical element 21. Next, the input surface of a fly eye integrator 6 is superimposingly and homogeneously illuminated at a desired light intensity distribution by the output from element 21. As a result, a substantially planar light source, referred to as a third light source, is formed at the output surface of the respective element lenses of the fly eye integrator 6. The shape of the light beam output by the planar light source is controlled by an aperture diaphragm 33 disposed in a revolver 7, and the light is condensed via a condenser lens group 8 and a reflection mirror M2. Furthermore, the reticle or mask 9 on which the pattern is formed is superimposingly and homogeneously illuminated. Based on the illuminated light that has been homogeneously illuminated, a projection lens 10 projects and exposes the pattern formed on the reticle or the mask 9 onto a wafer or other substrate 11. Furthermore, one exposure is performed by the combination of several tens of pulses of laser exposure, the angle of an oscillating mirror 5 is changed over the exposure time, and interference noise generated by the fly eye integrator 6 or the like is made homogeneous.

In this embodiment, the complex lens system of the relay lens 4 and the fly eye integrator 6 is an image magnifying optical system, and the entire effective aperture within the X-Y plane of the second light source array in the vicinity of the output surface of the diffractive optical element 21 is imaged as a third light source array in the vicinity of the output surface of the respective element lenses of the fly eye integrator 6.

Figure 2A:
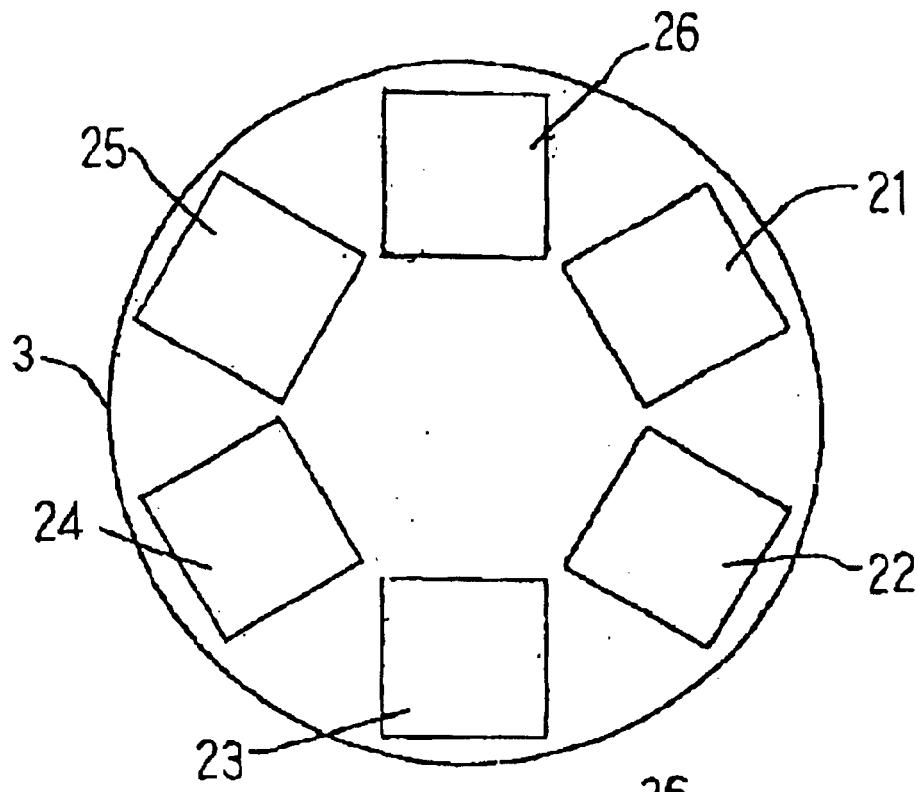
FIGS. 2A and 2B are diagrams showing a structure of a revolver.
Figure 2B:
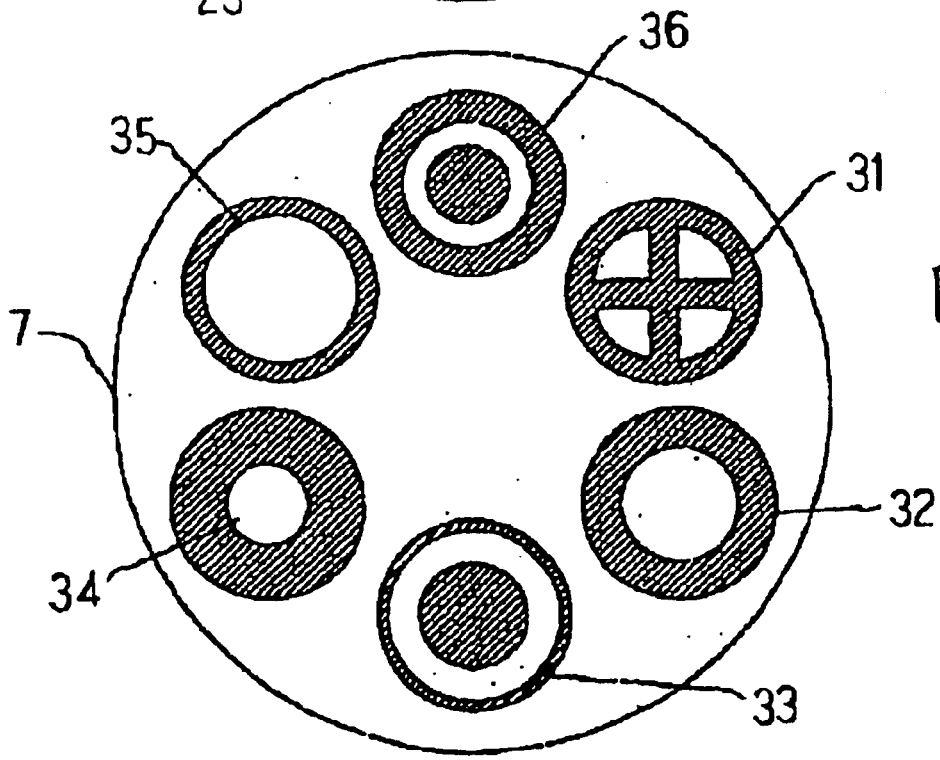

Furthermore, the diffractive optical elements 21, 22, 23 and 24, and the auxiliary fly eye integrators 25 and 26 are disposed in the revolver 3 as shown in FIG. 2A. By rotating the revolver 3 around the optical axis AX by a motor MT1, an arbitrary one of the diffractive optical elements and auxiliary fly eye integrators can be selectively switched into the optical path. Additionally, in the same manner, as shown in FIG. 2B, with respect to the aperture diaphragms 31–36, diaphragms with various aperture shapes can be selectively switched into the optical path by the revolver 7, rotated by motor MT2.

By rotating the revolver 3, when the auxiliary fly eye integrator 25 or 26 is selected, the overall system becomes a double fly eye lens system that can form a number of third light source images equivalent to the product m×n of n lens elements of the fly eye integrator 6 and m lens elements of the auxiliary fly eye integrator (25 or 26). Here, the auxiliary fly eye integrator 25 can be used with the aperture diaphragm 32, and in the same manner, the fly eye integrator 26 can be used with the diaphragm 34. As with the conventional devices, by switching the first fly eye integrator corresponding to the auxiliary fly eye integrator of this embodiment, the overall system can be made to correspond to an aperture diaphragm with a small diameter.

In contrast, one of the characteristics of this embodiment is that first through fourth diffractive grids 21, 22, 23 and 24, having a structure that will be described later, can also be selected by increasing the number of available selections for changing the first fly eye integrator (the auxiliary fly eye integrator in this embodiment).

The diffractive optical elements 21–24 can be used with the aperture diaphragms 33, 35, 36, and 31, respectively.

Figure 3:
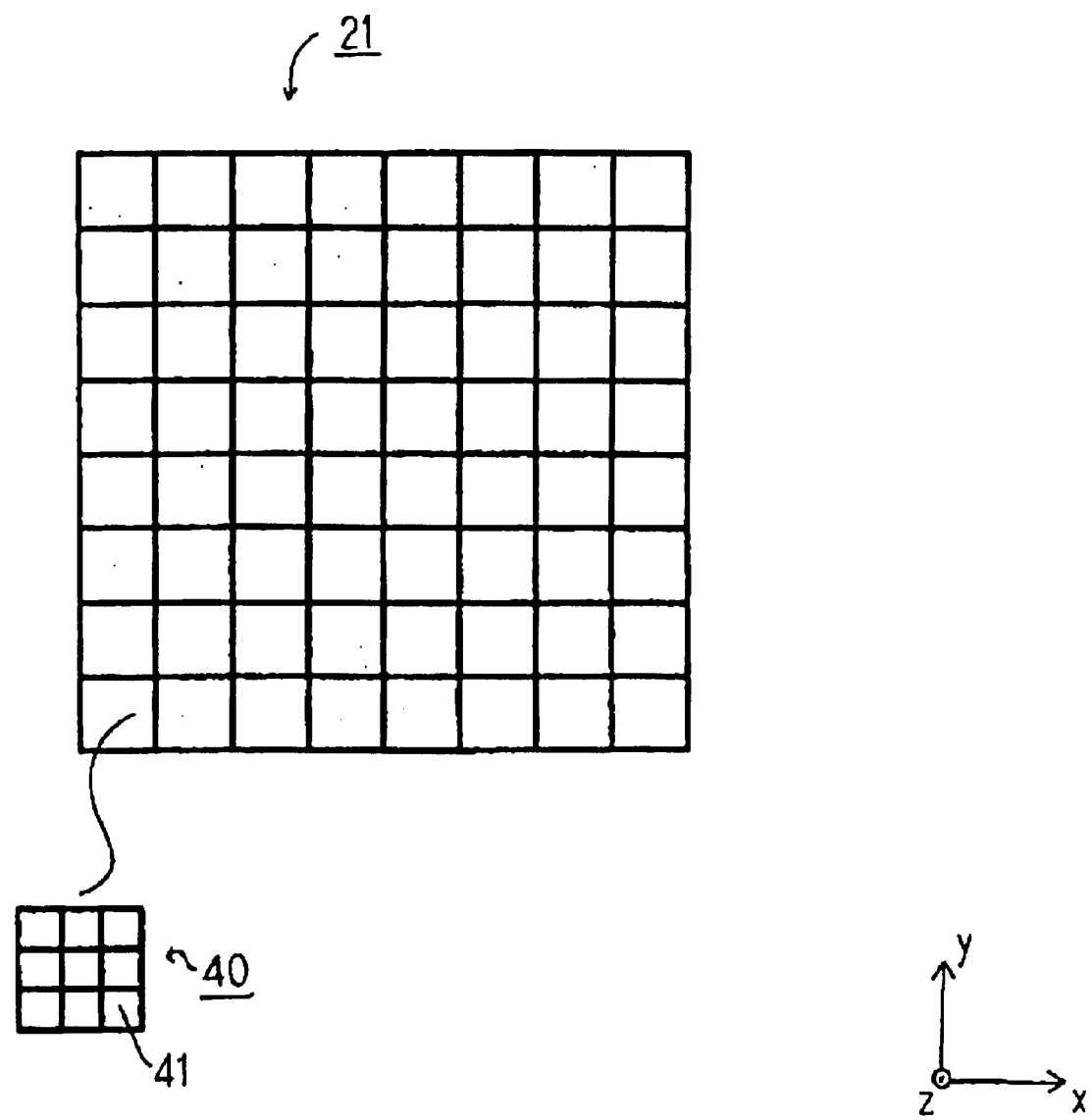
FIG. 3 is a conceptual diagram explaining a diffractive optical element.

With respect to the diffractive optical elements, the diffractive optical element 21 is explained as a typical example. FIG. 3 is a diagram explaining a basic concept of the diffractive optical element 21. The diffractive optical element 21 includes a plurality of basic optical elements 40. Each of the respective basic optical elements 40 includes a plurality of partial optical elements 41. The plurality of basic optical elements 40 have the same partial optical elements 41, and the plurality of basic optical elements 40 are arranged in a repeated array. This corresponds to the entire effective diameter of the diffractive optical element 21. Additionally, an arrangement is also possible in which the diffractive optical element 21 matches the effective diameter in an X direction and in a Y direction of the basic optical elements.

Figure 4:
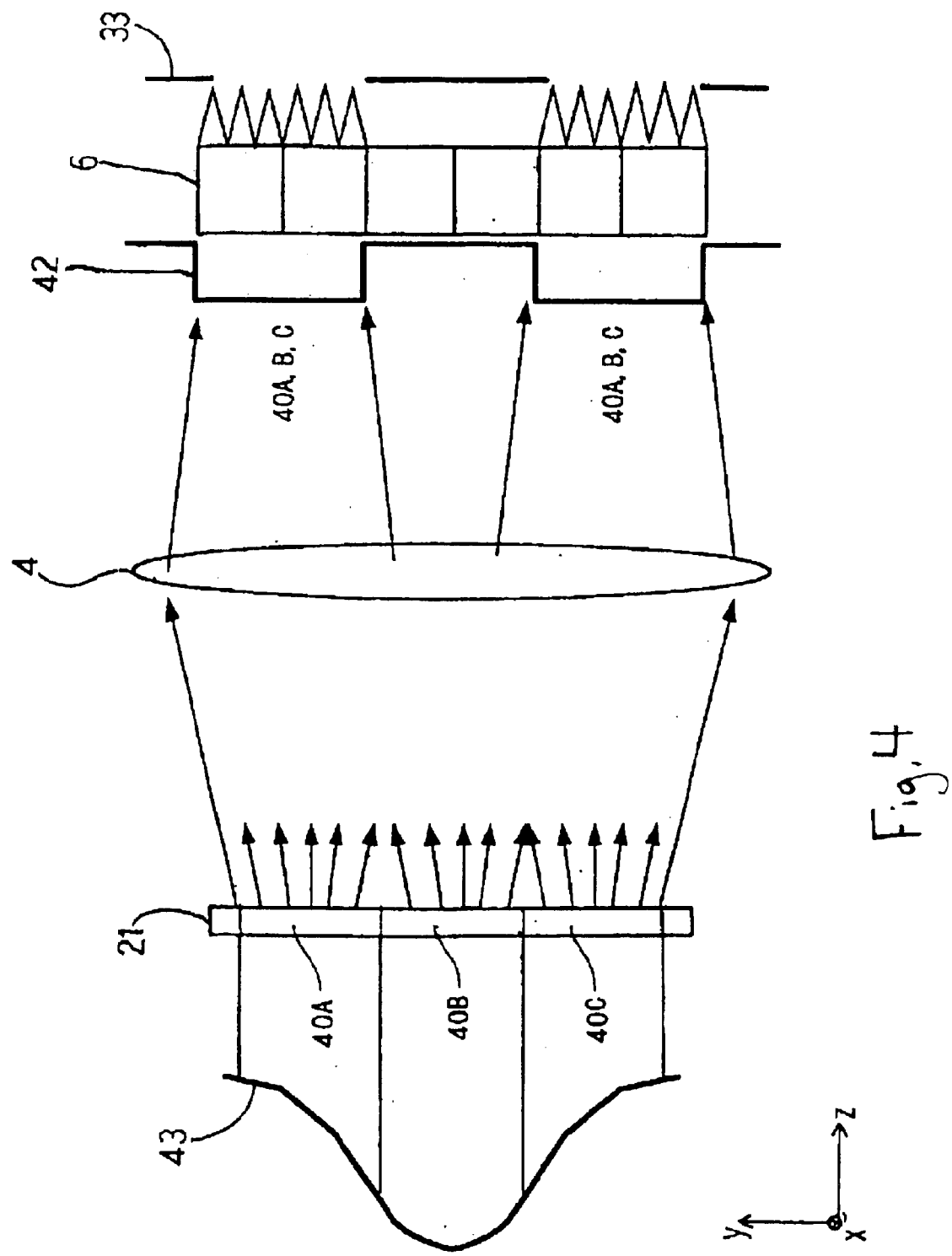
FIG. 4 is a diagram explaining a principle of integration (smoothing) using a diffractive optical element.

Next, a function in which the basic optical elements 40 superimpose incident light, a so-called integration function, is explained with reference to FIG. 4. In order to simplify the explanation, the relay lens 4 is schematically shown as a single lens. A case is considered here in which a light 43 with a homogeneous intensity distribution is input to the basic optical elements 40A, 40B, and 40C as shown in FIG. 4. After the input light beam 43 is divided into the respective areas of the basic optical elements 40A–40C, the light beams from the three areas are superimposed at the same specified position of the fly eye integrator 6. Because of this, the effect of the homogenization of the intensity distribution can be obtained on the input surface of the fly eye integrator 6. In the example of FIG. 4, the light input to the respective basic optical elements 40A–40C forms a ring-shaped intensity distribution 42 on the input surface of the fly eye integrator 6. Therefore, even if a light beam 43 with an unhomogeneous intensity distribution is input to the diffractive optical element 21, light with a specified substantially homogeneous intensity distribution can be obtained by the light integration function of the diffractive optical element 21. Furthermore, because a light beam with a ring-shaped intensity distribution is superimposed on the reticle after being further divided by the fly eye integrator 6, the effect of the double fly eye lens system can be obtained.

Next, the principle in which the loss of the light amount can be decreased by using the diffractive optical element 21 is explained. First, a shape of an illumination area that is formed at the input surface of the fly eye integrator 6 by one basic optical element 40 is explained. FIG. 5 shows an X-Y cross section of the input surface of the fly eye integrator 6, and shows the element lenses 44 that form the fly eye integrator 6. Here, the fly eye integrator 6 is formed by 10×10=100 element lenses. In addition, a ring aperture diaphragm 33 arranged at the output surface of the fly eye integrator 6 is shown by dotted lines. A basic illumination area 45 shown by a thick line on the input surface of the fly eye integrator 6 is illuminated by one basic optical element 40. Here, the input surface of each element lens 44 is conjugate with the exposure area of the reticle surface. Accordingly, it is necessary to illuminate all of the element lenses that are located in a position where the aperture portion of the ring diaphragm 33 and the third light source array formed at the output surface of each lens are superimposed. Because of this, the illumination area becomes a shape such as the basic illumination area 45 shown in FIG. 5 even if the aperture diaphragm is a ring shape.

The basic illumination area 45 can be divided into a plurality of partial illumination areas 46. The relationship between the partial optical elements 41 and the partial illumination areas 46 is explained with reference to FIG. 6. In FIG. 6, a case is considered in which the partial illumination areas 46 are in the same shape as the fly eye element lenses 44. In this case, the basic illumination area 45 is divided into 68 partial areas. Furthermore, in this embodiment, one partial optical element 41 illuminates one partial illumination area 46. Furthermore, as described hereafter, the basic illumination area 45 and the area formed by the illumination areas of all of the partial optical elements 41 included in the basic optical elements 40 can be designed to match.

Furthermore, the basic optical elements 40 are arranged in a state without a space therebetween (hereafter referred to as a "condensed state"), and form the diffractive optical element 21. Therefore, if the effective diameter of the diffractive optical element 21 is illuminated, the input light is converted into the shape of the basic illumination area 45 on the input surface of the fly eye integrator 6 by the respective basic optical elements 41 without losing light intensity. Furthermore, the output light of the plurality of basic optical elements 41 are superimposed on the input surface. In other words, the diffractive optical element 21 can illuminate the basic illumination area 45 that is needed for ring illumination without losing the input light amount from the light source and obtain the optical integrator effect as mentioned above.

Next, a design procedure of a diffractive optical element formed of basic optical elements arrayed in a condensed state is explained. Here, by assuming that there is a virtual diffractive lens corresponding to the diffractive optical element, a procedure is used in which the virtual diffractive lens is divided into partial optical elements. Here, a case of designing the diffractive optical element 21 to illuminate the ring aperture diaphragm 33 shown in FIG. 2B is explained as an example.

As shown in FIG. 7, it is assumed that the virtual diffractive lens 47 corresponds to the surface of the diffractive optical element 21. Furthermore, if the focal length of the virtual diffractive lens 47 is funi and the focal length of the relay lens 4 is fL, the virtual diffractive lens 47 and the relay lens 4 are arranged at an interval of funi+fL, and the combination of both lenses becomes an image magnifying optical system. Furthermore, in order to simplify the explanation, the relay lens 4 is schematically shown as a single lens. The basic illumination area 45 on the input surface of the fly eye integrator 6 is a projection basic area 48 that is projected from the input surface of the virtual diffractive lens via the image magnifying optical system. That is, because the virtual diffractive lens 47 illuminates the basic illumination area 45 on the fly eye integrator 6, it has the same function as the basic optical element 40. Furthermore, in the same manner as the basic illumination area, the partial illumination areas 46 also correspond to the projection partial areas 49. Here, the light beam input to the virtual diffractive lens 47 is substantially parallel light, so the respective light beams corresponding to the partial projection areas 49 is directly input to the virtual diffractive lens 47 as-is. Furthermore, the areas to which the respective light beams of the partial projection areas 49 are input are considered to be partial optical elements 50 on the virtual diffractive lens. As a result, because the pattern of the partial illumination areas 46 on the fly eye integrator 6 shown in FIG. 6 are projected onto the virtual diffractive lens at a specified magnification, the pattern of the projected partial illumination areas corresponds to the partial optical elements of the virtual diffractive lens. However, 68 partial optical elements are needed for the ring illumination, corresponding to the partial illumination areas 46, so the partial optical elements in the center and in the surrounding (corner) parts are not needed.

A new basic optical element 51 is defined in which the partial optical elements are rearranged, that is, in which partial optical elements unnecessary for the ring illumination are removed. Only the needed partial optical elements are selected, and the selected partial optical elements are arranged in a condensed state so as to be effectively illuminated.

Figures 8A, 8B:
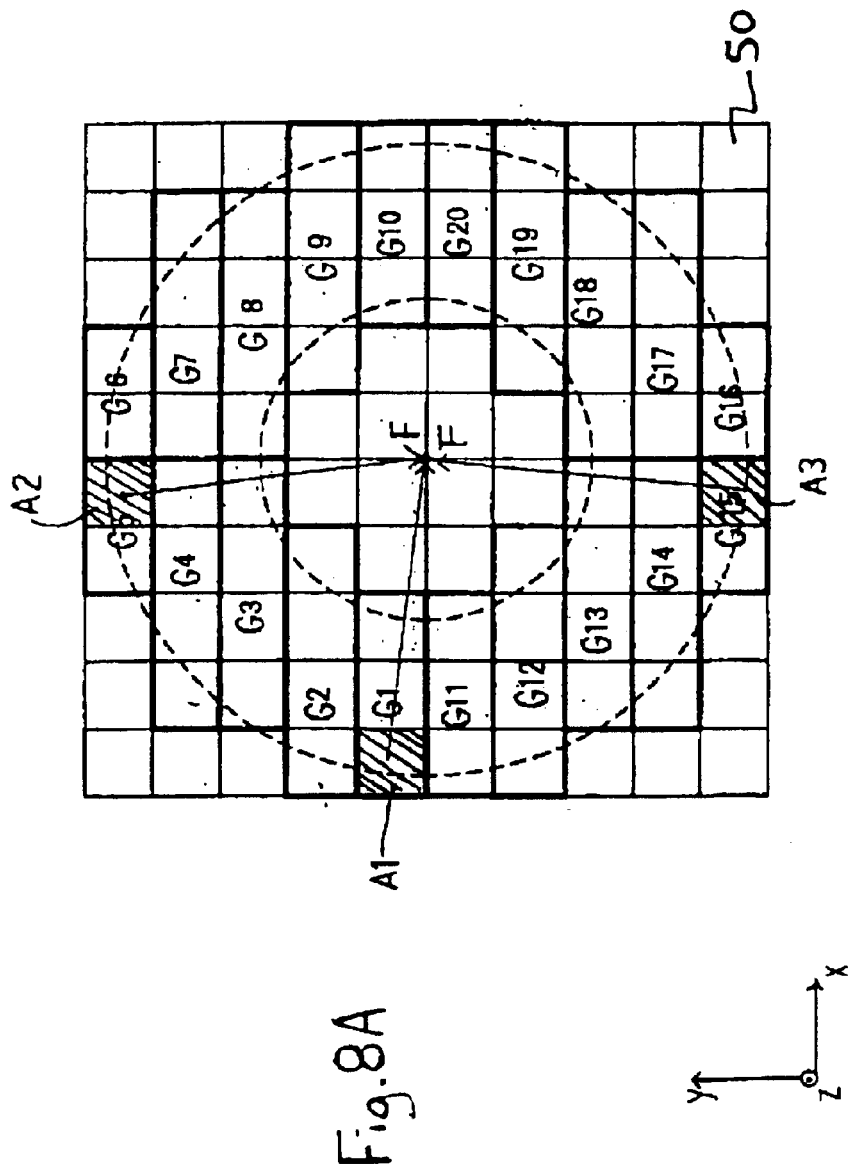
FIGS. 8A and 8B are diagrams explaining division and rearrangement of a virtual diffractive lens.

A procedure that rearranges the partial optical elements 50 is explained with reference to FIGS. 8A and 8B. FIG. 8A is a diagram showing a structure of partial optical elements on a virtual diffractive lens before being rearranged, and FIG. 8B is a diagram showing a structure of the basic optical element after the partial optical elements have been rearranged. Furthermore, as shown in FIG. 8A, 68 partial optical elements 50 that are needed for the ring illumination are divided into 20 groups numbered G1–G20. For example, the group G1 is formed by three partial optical elements 50. In the structure shown in FIG. 8A, groups G1–G20 are arranged in a substantially ring shape, but as shown in FIG. 8B, the respective groups are rearranged in a rectangular state. Furthermore, groups formed of only the 68 partial optical elements 50 needed for the ring illumination are rearranged, so that the partial optical elements that are not used for the ring illumination can be removed. The new elongate basic optical element 51 is shown in FIG. 8B. As clarified from FIG. 8B, the basic optical element 51 includes two elongated rows of partial optical elements 50 extending in an X direction. Each of the two rows includes 34 partial optical elements. Furthermore, with respect to the respective partial optical elements 50, the virtual diffractive lens 47 is divided, so that the focal lengths of the respective partial optical elements are all equal to fsub, and fsub is equal to the focal length funi of the virtual diffractive lens.

Here, as shown in FIG. 8A, considering two to four partial optical elements 50 to be one group, when these partial optical elements are classified into groups G1–G20, because the partial optical elements 50 within the respective groups are formed by adjacent partial optical elements, the diffractive pattern is continuous. In this case, considering the respective group units to be new partial optical elements, patterning (rearrangement) can also be performed. Furthermore, in the structure of FIG. 8B, groups G1 and G11 or G10 and G20 and the like can also be considered as a series of patterns. That is, group G10 is above group G20 in the Y direction in FIG. 8B, just as it is in FIG. 8A. Furthermore, in the case of rearrangement, groups that are in a symmetrical positional relationship with respect to the optical axis F before rearrangement are in a symmetrical positional relationship around a specified point after rearrangement. That is, the four pairs of groups G1–G5, G6–G10, G11–G15 and G16–G20 are symmetrical with respect to the optical axis F before rearrangement, so these groups are arranged so as to be symmetrical with respect to the center point F' of the basic optical element 51 after rearrangement. By having this type of arrangement structure, the optical point group (third light source) generated at the output surface of the fly eye integrator 6 can be made homogeneous. Furthermore, when interference of the light source is high, it is preferable that rearrangement is performed by separating and rearranging as groups, such as by switching G11 and G20, for example, so that these groups can be adjacent in the final illumination area and can be partially superimposed. In this case, optical axis symmetry is not necessarily guaranteed, but it is preferable to be symmetrical around the optical axis as much as possible.

Figure 9:
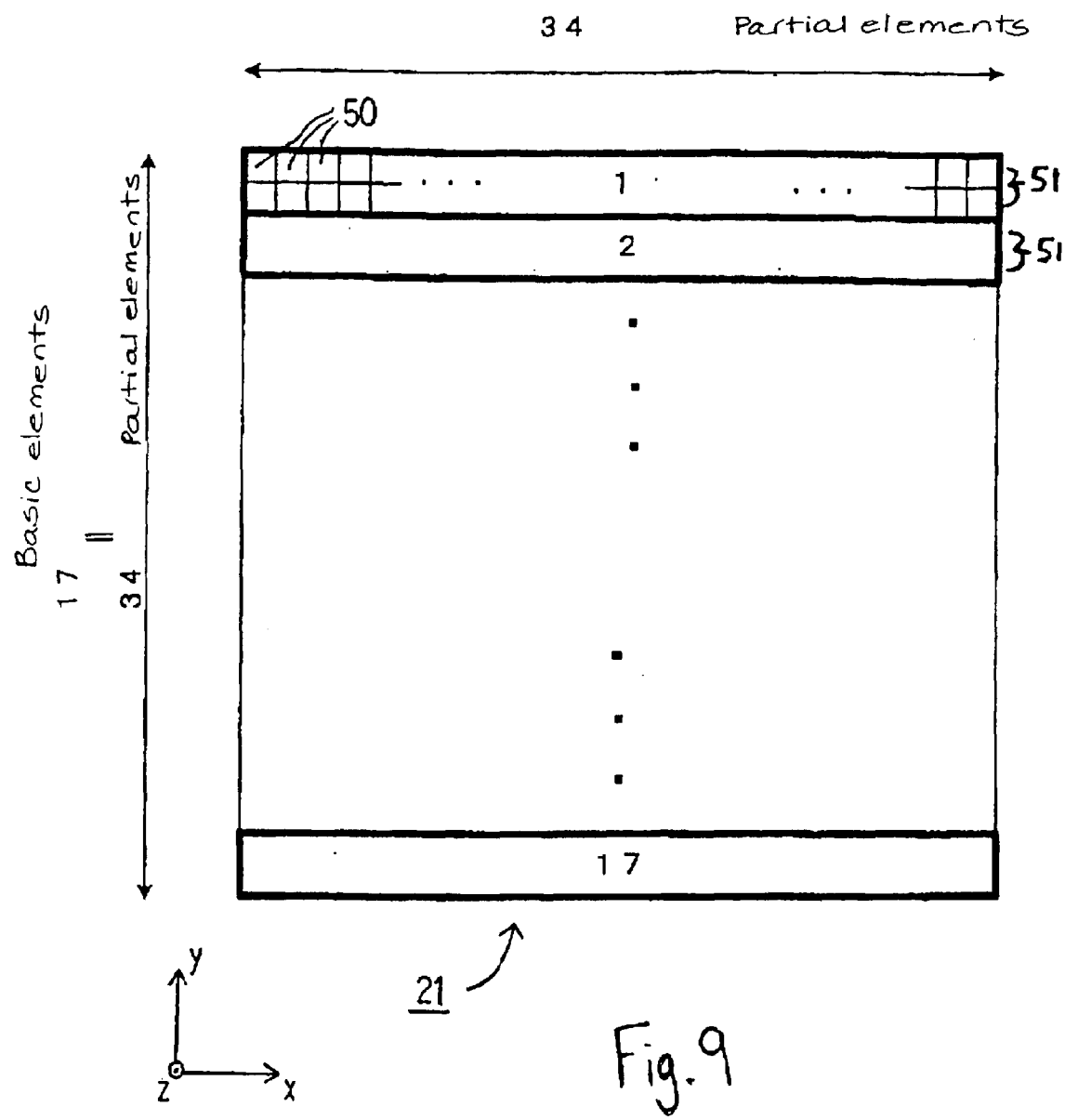
FIG. 9 is a diagram showing an arrangement of basic optical elements.

Furthermore, by providing an array of new elongate basic optical elements 51 as shown in FIG. 9, the diffractive optical element 21 is formed. In the example of FIG. 9, 17 basic optical elements 51 of FIG. 8B are repeatedly arranged in the Y direction to form a square-shaped area formed of 34×34 partial optical elements 50.

Figure 10:
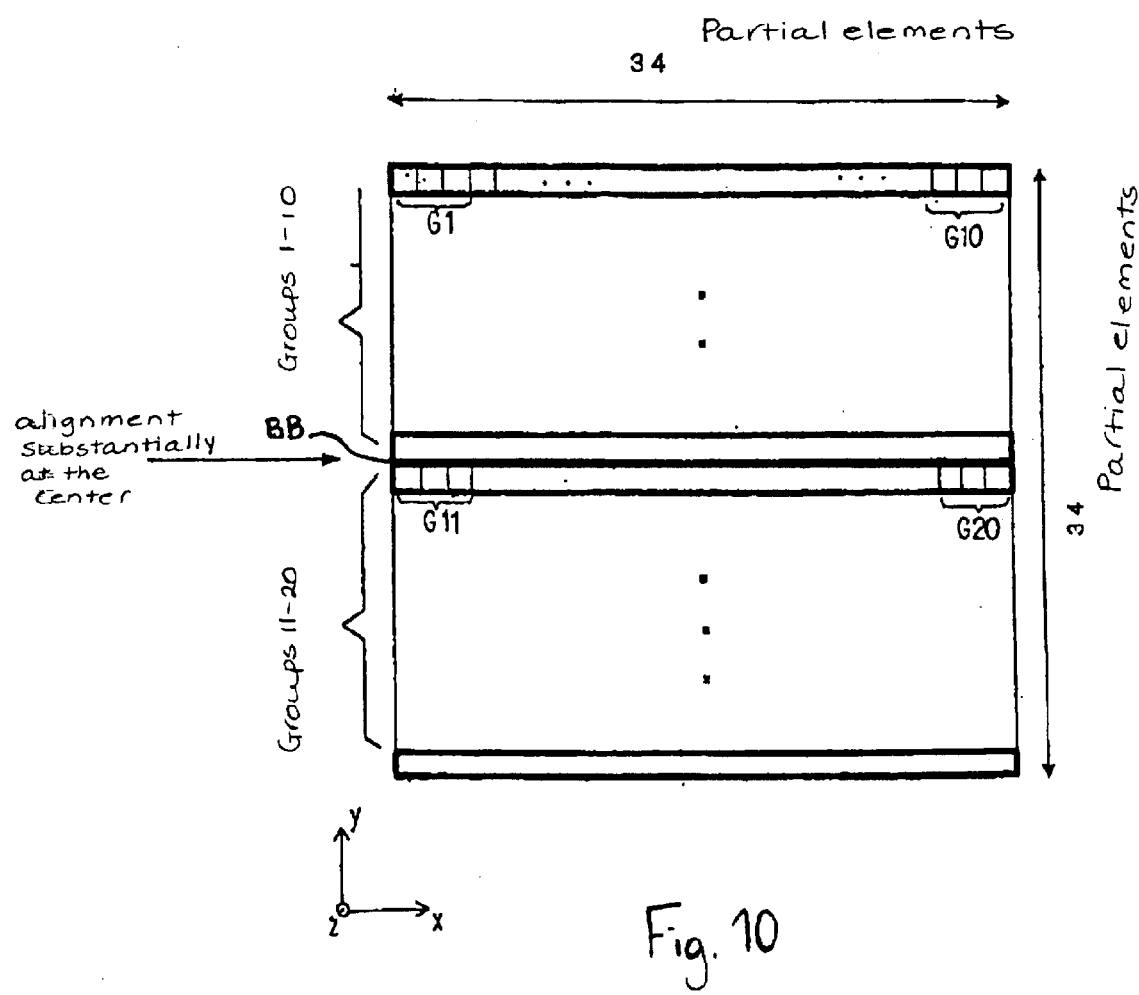
FIG. 10 is a diagram showing another arrangement of basic optical elements.

FIG. 10 is diagram showing another structure of rearrangement. A first set includes groups G1–G10 arranged in an elongate shape in the X direction repeated 17 times in the Y direction. Furthermore, a second set includes groups G11–G20 arranged in an elongate shape in the X direction repeated 17 times in the Y direction. As a result, a diffractive optical element is provided having 34×34 partial optical elements. It is further preferable that the cross-sectional shape of the light beam from an excimer laser light source is aligned with respect to the Y direction so as to become a Gaussian intensity distribution, and is aligned with respect to the X direction so as to become a top-hat type of distribution. Furthermore, it is preferable that a peak position of the Gaussian intensity distribution is substantially the same as the position of the boundary line BB between the sets of groups G1–G10 and the sets of groups G11–G20.

Figure 11:
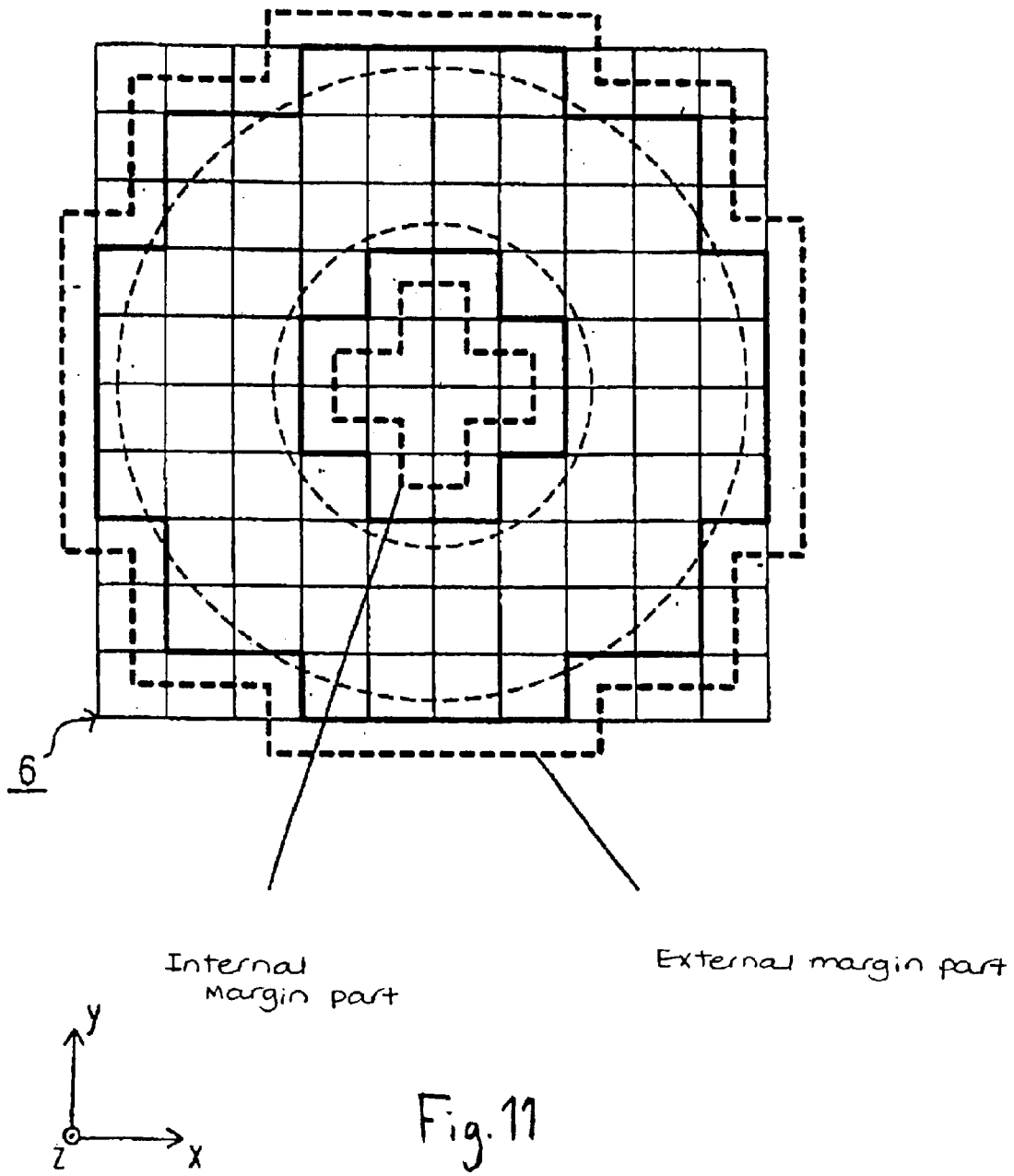
FIG. 11 is a diagram showing the margins of an illumination area on a fly eye integrator.

Furthermore, in the above explanation, the basic illumination area is equal to the minimum area needed for the ring illumination; but it is also acceptable to provide an internal margin and an external margin with respect to the ring illumination area. FIG. 11 shows a case with margins shown in dotted lines in the basic illumination area 45. Thus, by having an area with an extra space as a basic illumination area, in addition to the needed minimum area, it is possible to make the allowable amount of the shift of the relative alignment between the basic illumination area and the fly eye integrator 6 large, so alignment becomes easy. Furthermore, the surrounding part, in which homogeneousness of the optical intensity distribution is not very good, is not used, so evenness of the intensity distribution of the reticle surface can be improved. In the case of the basic illumination area with margins, in the same manner as the above-mentioned procedure, the basic illumination area shown in the dotted lines is divided into partial illumination areas, the corresponding virtual diffractive lens is set, and the partial optical elements are determined. Furthermore, by rearranging these partial optical elements in a condensed state, a new basic optical element is structured. Additionally, a plurality of the new basic optical elements are arranged to form the diffractive optical element.

The diffractive optical element 21 that has been rearranged in a condensed state as explained above is not limited to the structure shown in FIG. 9; other structures are also acceptable as long as a second light source array is substantially homogeneously formed at the output surface of the diffractive optical element 21. Furthermore, it is preferable that, with respect to the final arrangement of the partial optical elements within the diffractive optical element 21, the second light source array is symmetrical around the center axis of the diffractive optical element, and is rearranged so as to be evenly distributed within the effective diameter plane of the diffractive optical element 21. In order to accomplish such rearrangement, various generally known optimizing algorithms can be applied. The optimizing algorithm would be used to optimize the homogeneousness of the optical intensity at the input surface of the element lenses of the fly eye integrator and the homogeneousness of the optical intensity at the output surface.

Furthermore, the above-mentioned optimization is not limited to this first embodiment, but can be applied to the second through the sixth embodiments and to the case of quadru-pole illumination, which will be discussed later. This optimization can be applied to the case of an arbitrary illumination state using a diffractive optical element of this invention.

The following explains a procedure that determines a focal length and an effective diameter of partial optical elements. An effective diameter $\phi$sub of the partial optical elements 50 can be given by the following equation (1).

$$\phi\text{sub}=\phi\text{DOE}/k \qquad (1)$$

Here, $\phi$DOE is the entire effective diameter of the diffractive optical element 21, and k is the number of partial optical elements.

Figure 12A:
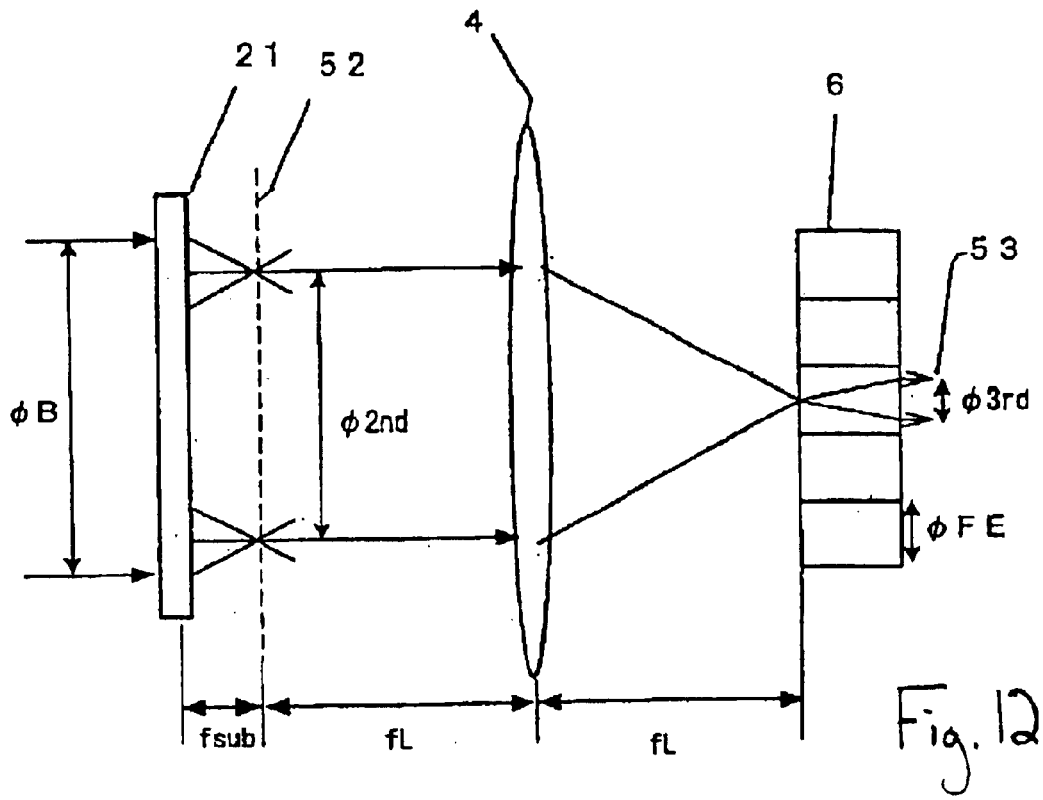
FIGS. 12A and 12B are diagrams explaining a principle for determining a focal length of partial optical elements.

Furthermore, before the focal length fsub is determined, it is necessary to determine the focal length fL of the relay lens. As shown in FIG. 12A, in this embodiment, a light beam that has been adjusted and input to the diffractive optical element 21 has a beam diameter $\phi$B that is substantially equal to the effective diameter $\phi$DOE of the diffractive optical element. Furthermore, a second light source plane 52 (effective diameter $\phi$2nd) is formed in the vicinity of the diffractive optical element 21, and the second light source is imaged as a third light source plane 53 (effective diameter $\phi$3rd) in the vicinity of the output surface of the fly eye element lens 6.

From the image magnifying relationship, based on the following equation (2), the focal length fL of the relay lens can be obtained.

$$fL=\phi2\text{nd}/\phi3\text{rd}\cdot fFE. \qquad (2)$$

Here, fFE is the focal length of the fly eye element lens. With respect to the focal length fFE and the diameter $\phi$FE of the fly eye element lens, the approximate values are determined by the limit of the entire length of the optical system and the exposure area. Therefore, $\phi$3rd is determined by setting a filling factor (=$\phi$3rd/$\phi$FE) to a desired value. Furthermore, $\phi$2nd is determined by $\phi$sub, which was obtained in equation (1), and by the arrangement of the diffractive optical element 21. Therefore, fL is obtained because the right side of equation (2) is determined.

A procedure that determines $\phi$2nd now is explained. For example, in the case of the diffractive optical element 21 that has been rearranged in a condensed state as explained in conjunction with FIGS. 8 and 9, a procedure that determines $\phi$2nd is described. First, it is assumed that the effective diameter $\phi$sub of the partial optical elements are already determined. Because the basic optical element is rearranged in a condensed state so as to fill in an empty part (the partial optical elements that are not used) of the virtual diffractive lens of FIG. 7, the focal point of the virtual diffractive lens also can be divided and rearranged. As a result, along with the rearrangement of the partial optical elements, the focal point is formed by a plurality of optical point groups. Therefore, it is necessary to make an area including the optical point groups that have been generated due to the rearrangement be the effective diameter $\phi$2nd of the second light source surface.

As shown in FIG. 8A, the central position within the effective diameter of each partial optical element within the X-Y plane does not match the focal position (point F in the center of FIG. 8A). For example, the light beam that is input to the partial optical element A1 at the far left end of group G1, the partial optical element A2 at the right end of group G5, and the partial optical element A3 at the right end of group G15, are focused in a direction shown by the arrows in FIG. 8A.

The following shows the difference between the position of point F and the central position of the partial optical elements A1, A2 and A3 as a coordinate displacement ($\Delta x$, $\Delta y$).

For the partial optical element A1 at the left end of group G1, ($\Delta x$, $\Delta y$)=(4.5$\phi$sub, −0.5$\phi$sub);

for the partial optical element A2 at the right end of group G5, ($\Delta x$, $\Delta y$)=(0.5+sub, −4.5+sub); and for the partial optical element A3 at the right end of Group G15, ($\Delta x$, $\Delta y$)=(0.5$\phi$sub, 4.5$\phi$sub).

Here, with reference to FIG. 8B, the light beam from the partial optical element A1 at the left end of group G1 has the above-mentioned displacement, so the light beam is focused to a position that is advanced in the X direction by +4.5$\phi$sub and in the Y direction by −0.5$\phi$sub from the central position of the partial optical element A1, and one light point is formed. Because of this, the light beam is focused into the effective diameter of the elongate basic optical element 51.

Meanwhile, the light beam that has exited the partial optical element A2 at the right end of group G5 is focused to a position that is advanced by −4.5$\phi$sub in the Y direction from the central position of the partial optical element A2, so that the light beam is focused to a position that exceeds the effective diameter of the basic optical element 51 by 3$\phi$sub and another light point is formed. In the same manner, the light beam from the partial optical element A3 at the right end of group G15 is focused to a position that exceeds the effective diameter of the basic optical element 51 by 3$\phi$sub with respect to the Y direction, and another light point is formed.

If the same phenomenon is considered with respect to the light beams from all the partial optical elements, the effective diameter of the second light source formed by the basic optical element 51 requires a size of 24$\phi$sub×8$\phi$sub in the X-Y plane as an elongate area including all the groups of the above-mentioned light points. Therefore, if a plurality of the basic optical elements 51 are arranged as shown in FIG. 9, the effective diameter of the second light source that is generated adjacent to the diffractive optical element 21 requires a size of 24$\phi$sub×40$\phi$sub in the X-Y plane. Upon considering a system symmetrical to the X and Y directions as the image magnifying optical system of FIG. 12A, it is seen that it is necessary to have $\phi$2nd=40$\phi$sub. Thus, the effective diameter $\phi$2nd of the second light source cannot be simply equal to $\phi$DOE (=34$\phi$sub).

Figure 12B:
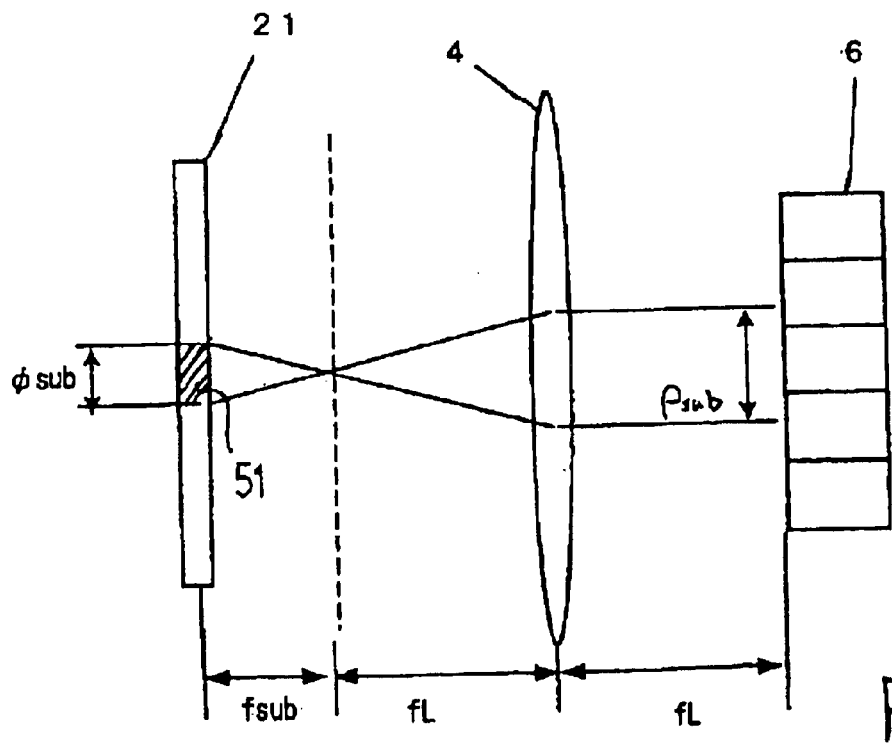

Next, as shown in FIG. 12B, the focal length fsub of the partial optical elements can be given by the following equation (3) from the relationship of the beam expansion ratio between the effective diameter $\phi$sub and the diameter $\rho$sub of the partial illumination area.

$$f\text{sub}=fL \cdot \phi\text{sub}/\rho\text{sub} \tag{3}$$

Here, $\phi$sub and fL were already obtained by equations (1) and (2), respectively. Furthermore, $\rho$sub is the diameter of the partial illumination area. Here, the effective diameter $\phi$FE of the fly eye element lens is used as $\rho$sub.

In order to simplify the preceding explanation, it was assumed that the illumination area is point-symmetrical with respect to the optical axis and the concept of one-dimensional direction was expanded to two-dimensions. However, if the effective diameter becomes non-symmetrical with respect to the X and Y directions, such as in a scan-type exposure apparatus, the above-mentioned equations for the respective X and Y directions can be used.

Next, the shape of the respective partial optical elements and the shape of the basic optical element are explained. The shape of the respective partial optical elements can be determined by dividing the surface shape of the virtual diffractive lens 47. Because of this, it is necessary to first determine the surface shape of the virtual diffractive lens 47. The surface shape of the virtual diffractive lens 47 is determined by the focal length fvir of the lens. In this embodiment, fvir=fsub, and fsub can be determined by the above-mentioned method, so that the shape of the virtual diffractive lens can be determined. The following explains the procedure that determines this shape.

Figure 13A:
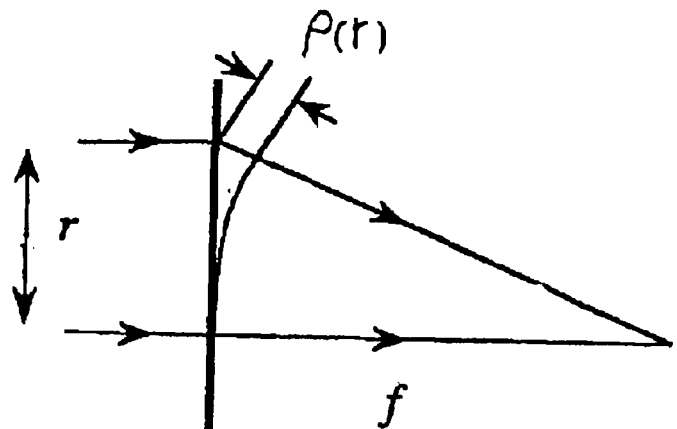
FIGS. 13A–13C are diagrams showing a design principle of a diffractive lens.

A diffractive lens having a focal length f is generally known as an element that converts parallel light to an ideal spherical wave. According to FIG. 13A, in the phase distribution of the diffractive lens, a light beam at a height r from the optical axis is deflected as shown, and an optical path difference $\rho(r)$ between the light beam and the reference spherical surface is designed according to equation (4).

$$\rho(r)=(f^2+r^2)^{1/2}-f \tag{4}$$

In order to obtain this optical path difference, it is acceptable if the optical phase distribution $\phi(r)$ within the plane at the diffractive lens output surface satisfies equation (5) shown below.

$$\phi(r)=2\pi/\lambda \cdot \rho(r) \tag{5}$$

Figure 13B:
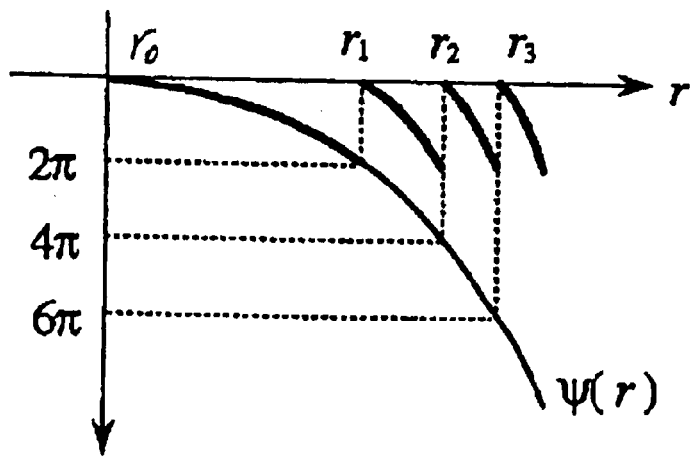
Figure 13C:
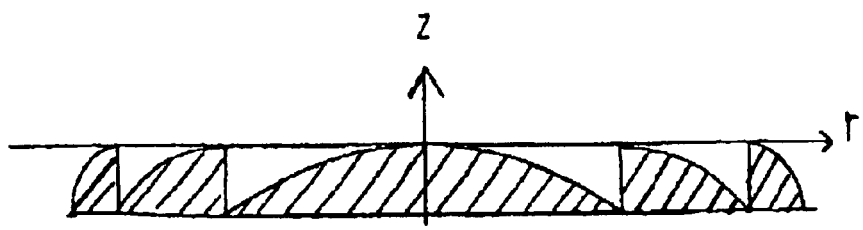

Here, $\lambda$ is the light wavelength. Furthermore, a characteristic of the diffractive lens is that the cyclic component per $2\pi$ in equation (5) can be treated the same. That is, the components of $\phi$=0 and $2\pi \cdot m$ (m is a positive integer) can have the same structure. This corresponds to treating $\rho$=0 and $\lambda \cdot m$ the same. FIG. 13B is a diagram explaining this principle. Adding correction of index of refraction to this phase distribution yields the surface shape of the diffractive lens. Therefore, the shape of the diffractive lens is a sawtooth shape as shown in FIG. 13C. Points rm (m is a positive integer) which divide each sawtooth are points at which the optical path difference $\rho(r)$ is an integer multiple of the wavelength, and can be obtained by solving equations (6) and (7):

$$(f^2+r^2)^{1/2}-f=m \cdot \lambda, \tag{6}$$

$$rm=[(m\lambda)^2+2m\lambda f]^{1/2} \tag{7}$$

Furthermore, the phase distribution of the diffractive lens in which m·$\lambda$ is considered the same is given by the following equation (8) by using rm.

$$\rho(r)=(f^2+r^2)^{1/2}-f-m \cdot \lambda (rm<r<rm+1) \tag{8}$$

Here, r can be given by the following equation (9) according to the X, Y coordinates.

$$r=(x^2+y^2)^{1/2} \tag{9}$$

That is, if the focal length f, the wavelength $\lambda$, and the positions (x, y) at which the surface shape is determined are given, r is determined from equation (9) and the interval [rm, rm+1] in which r is included is determined from equation (7). As a result, the optical path difference $\rho(r)$ at the position (x, y) is determined according to equation (8). Furthermore, if the index of refraction of the substrate of the diffractive lens is n, the height distribution at point r, that is, the shape function h(r) of the diffractive lens, can be obtained by the following equation (10) (see FIG. 13C).

$$h(r) = \pm \rho(r)/(n-1) \quad (10)$$

Here, a minus symbol represents a convex lens, and a plus symbol represents a concave lens. Additionally, the index of refraction of an air layer is 1.

Figure 14:
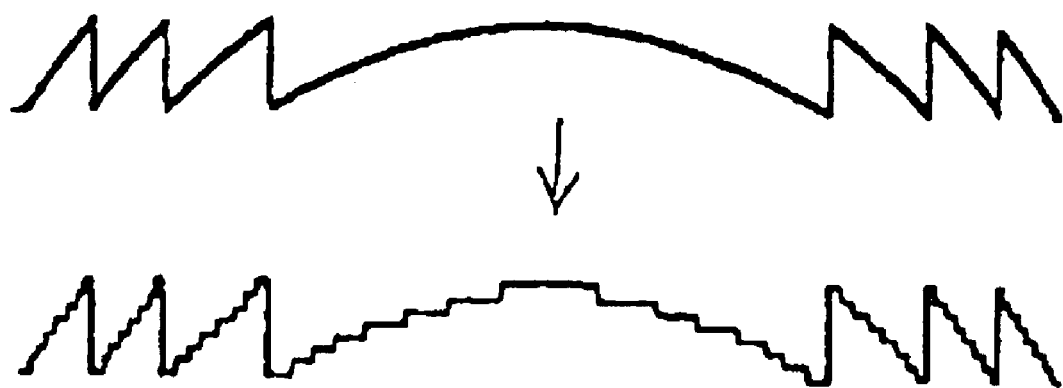
FIG. 14 is a diagram showing a structure of a continuous surface lens and of a binary diffractive lens.

In the above description, the case in which the phase distribution within the respective distances of rm<r<rm+1 in the continuous distribution shown in equation (8) is described, but a so-called binary diffractive lens has been recently proposed in which this distribution is approximated in a stepped shape. The number of steps within each length of the binary diffractive lens is called the number of quantizations. FIG. 14 shows a structural example of a binary diffractive lens in which the number of quantizations=8. The binary diffractive lens can be created with an arbitrary number of quantizations by repeatedly exposing and etching using binary masks with different pitches. Therefore, there is an advantage such that an arbitrary shape of the lens can be easily formed. Therefore, it is particularly effective when a complicated shape of the partial optical elements that are rearranged in a condensed state as in this embodiment is formed by a binary diffractive lens.

Next, a rule of quantization of the binary diffractive lens is explained. The number of quantizations of the binary diffractive lens is L. The phase distribution ρ(r) within the respective distances rm<r<rm+1 can be quantized by the following procedure of equation (11):

In the case of 0<ρ(r)<λ/L, it is replaced with

→ρb(r)=0 (constant);

in the case of λ/L<ρ(r)<2·λ/L, it is replaced with

→ρb(r)=λ/L (constant); and in the case of (L−2)·λ/L<ρ(r)<(L−1)·λ/L, it is replaced with →ρb(r)=(L−2)·λ/L (constant). (11)

Furthermore, ρ(r) of equation (11) corresponds to equation (8). By applying equation (11) to an arbitrary r (that is determined by x, y) and to corresponding m, quantization of the entire diffractive lens surface can be performed. Additionally, by substituting the phase distribution ρb(r) of the binary diffractive lens that was obtained in the replacement procedure of equation (11) into equation (10), the surface shape h(r) of the binary diffractive lens can be obtained.

Next, as the most simple example, a binary diffractive lens is specifically explained in which the number of quantizations is 2. The phase distribution ρb(r) within the respective distances rm<r<rm+1 of the binary diffractive lens in which the number of quantizations is 2 can be given by the following equation (12) in which L=2 is substituted into equation (11).

In the case of 0<ρ(r)<λ/2, it is replaced with →ρb(r)=0 (constant); and in the case of λ/2<ρ(r)<λ, it is replaced with
→b(r)=λ/2 (constant). (12)

Here, ρ(r) is determined from equation (8). FIG. 15 shows a diagram showing a schematic structure seen from an optical axis direction when the binary diffractive lens in which the number of quantizations is 2 is applied as the virtual diffractive lens 47. In FIG. 15, the ring-shaped parts of ρ(r)=−λ/2 and the ring-shaped parts of ρ(r)=0 are alternately arranged. If the index of refraction of the substrate of the diffractive optical element is n, there is a gap of λ/[2(n−1)] between the two areas. Each square part of FIG. 15 shows one of the divided groups of the partial optical elements shown in FIG. 8. That is, the bi-quantized binary diffractive lens is divided at the divided group units shown in FIG. 15 and becomes the shape distribution of the new basic optical elements 51 that are rearranged in a condensed state as described above.

Figure 16:
FIG. 16 is a diagram showing a partial structure of a binary diffractive lens after being rearranged.

As explained above, if the focal length fsub of the partial optical elements is determined, the surface shape of the virtual diffractive lens is determined by equations (7)–(10) (equation (11) is also included in the case of the binary lens) and is divided into the partial optical elements, and the shape of the basic optical element can be determined by rearranging the partial optical elements in a condensed state. Furthermore, by repeatedly arranging the partial optical elements a plurality of times, the surface shape of the entire diffractive optical element 21 can be determined. With respect to the arrangement of the partial optical elements that constitute the diffractive optical element 21, the second light source row is symmetrical with respect to the central axis of the diffractive optical element 21 and can be rearranged to be distributed on the entire effective diameter of the diffractive optical element 21. FIG. 16 is a diagram showing a structure in which the bi-quantized binary diffractive lens is rearranged in a condensed state.

FIG. 16 is a diagram showing a structure of a basic optical element 51 that was obtained by rearrangement in a condensed state by dividing the pattern shown in FIG. 15 into groups. Repeating this 17 times in the Y direction yields the diffractive optical element 21. Furthermore, a mask corresponding to this pattern is created by an EB (Electron Beam) writing, Then, a quartz glass substrate coated by photoresist is arranged under the mask, the pattern is exposed onto the photoresist, developed, and etched, and thus the diffractive optical element 21 is formed.

Figure 17:
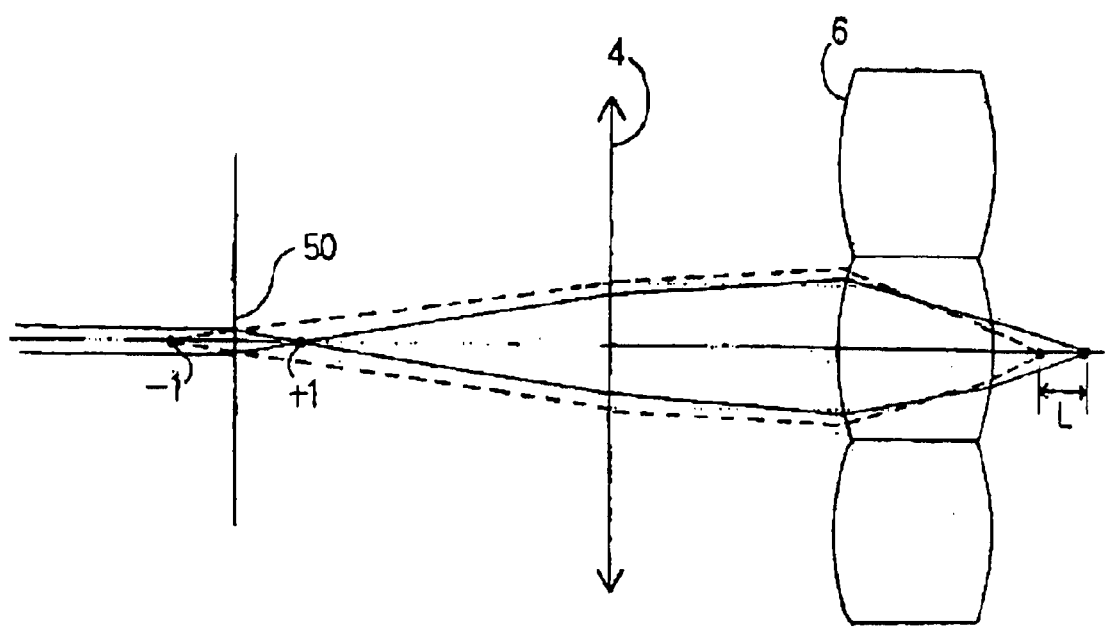
FIG. 17 is a light beam diagram for a binary diffractive lens.

Furthermore, because the diffractive lens in which the number of quantizations is 2 simultaneously has a concave lens effect and a convex lens effect, the ±primary diffraction light is symmetrically generated with respect to a normal line of the diffractive lens. This ±primary light can be effectively used as shown in FIG. 17. FIG. 17 shows an example in which the effective diameter of the element lens of the fly eye integrator 6 and the illumination area of the partial optical elements 50 have a 1:1 correspondence. Because the partial optical elements 50 are formed by the binary diffractive lens in which the number of quantizations is 2, a +primary light (solid line) and a −primary light (dotted line) are simultaneously generated. However, as clarified in FIG. 17, only the focal point position is different between the +primary light and the −primary light, and they are superimposed in the same area on the input surface of the element lens of the fly eye integrator. Furthermore, two spots are formed on the element lens output side, but the distance L between the spots is extremely close, so there is no substantial difference. Furthermore, the spot corresponding to a concave lens is located closer to the element lens than is the spot corresponding to the convex lens, and it is preferable that it is designed so that the spot cannot be formed within the element lens member. Additionally, an example is explained in which the effective diameter of the element lens of the fly eye integrator 6 and the illumination area of the partial optical elements 50 have a 1:1 correspondence, but the same principles can be applied to the case where the correspondence is not 1:1.

As a result of the +primary light and the −primary light of the diffractive lens being able to be effectively used when the number of quantizations is 2, each diffractive effective ratio of the ±primary light is 41%, but the total effective ratio is 82%, so a high diffractive effective ratio can be obtained.

The following is a specific numerical value example. A case is considered in which, as shown in FIGS. 8B and 9, the diffractive optical element 21 is formed by 34×34 partial optical elements. Furthermore, the following values are used, considering restrictions such as the exposure area and the entire length of the optical system.

$$\phi DOE=40\ mm\ \phi FE=4\ mm\ fFE=20\ mm \tag{13}$$

Additionally, $\rho sub=\phi FE$, and $\phi 3rd=\phi FE$. First, $\phi DOE$ and k=34 are substituted into equation (1), and the effective diameter $\phi sub$ of the partial optical elements 50 is obtained.

$$\phi sub=\phi DOE/k=1.176\ mm \tag{14}$$

Because $\phi sub$ is determined, the effective diameter $\phi 2nd$ of the second light source is determined. In the case of the arrangement shown in FIGS. 8B and 9, as already considered, $$\phi 2nd=40\phi sub=47.059\ mm \tag{15}$$

can be established. Next, by substituting the value obtained above in the right side of equation (2), fL can be obtained.

$$fL = \phi 2nd / \phi 3rd \cdot fFE \tag{16}$$
$$= 235.294\ mm$$

Furthermore, fsub can be obtained from equation (3).

$$fsub = fL \cdot \phi sub / \rho sub \tag{17}$$
$$= 69.204\ mm$$

Furthermore, by substituting fsub, the wavelength λ, and the index of refraction n into equations (7)–(10), the phase distribution and the surface shape of the partial optical elements 50 can be determined. In the case of using the binary refractive lens, ρb of equation (11) can be used as the phase distribution ρ of equation (10). Thus, all the surface shapes of the partial optical elements 50 can be determined, and a pattern of the basic optical elements can be seen in which the partial optical elements 50 are arranged as in FIG. 8B. Furthermore, arrangement of the basic optical elements as shown in FIG. 9 is a pattern of the entire diffractive optical element 21. Additionally, according to this pattern, by EB writing the pattern on a mask, transferring this pattern to a glass substrate coated by a resist, and etching the pattern, the diffractive optical element 21 can be fabricated.

The following explains aberration correction of an optical system. In a design procedure of the above-described diffractive optical element, the explanations were given without particularly discussing aberration that is generated in an illumination optical system. However, various aberrations are generated in an actual illumination system. As a typical light beam aberration of this type of illumination optical system, there is aberration in which the element lens of the fly eye integrator does not satisfy a sine condition. Because there is only one diffractive surface of the input surface in the element lens, it cannot satisfy a sine condition. If the sine condition cannot be satisfied, because there is a change in the light beam density of the element lens input surface and the light beam density of the reticle surface, intensity of the illumination light of the reticle surface cannot be homogeneous. In addition to this, homogeneousness of the illumination light of the reticle surface can be affected by aberration generated by a relay lens, a condenser lens, or the like.

Figure 18:
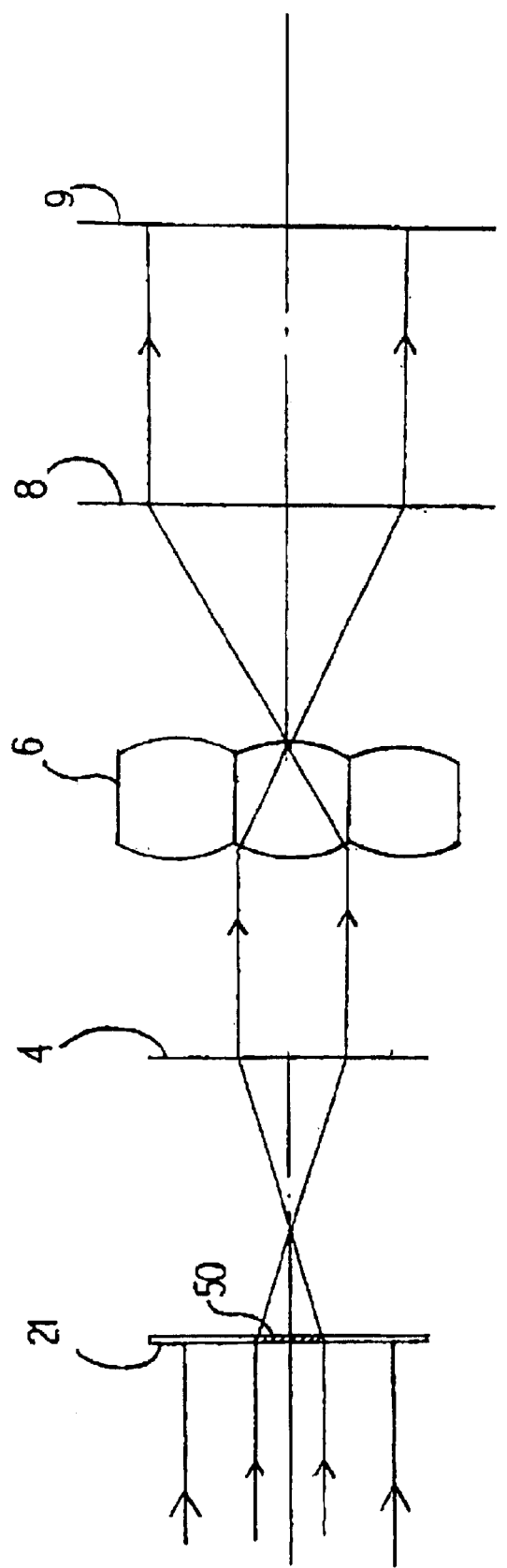
FIG. 18 is a diagram explaining a principle in which aberration of the entire illumination optical system is corrected by partial optical elements.

In an arrangement in which the element lens of the fly eye integrator and the partial optical elements 50 correspond 1:1, as in this embodiment, the effects of diffraction and aberration all can be corrected together. FIG. 18 is a diagram schematically showing a diffractive optical element and the reticle surface. Here, the light beams that pass through one partial optical element 50 must correspond to an element lens of the fly eye integrator and eventually have a conjugate relationship with the reticle surface. In the optical path, there is no optical element unit smaller than the element lens, so aberration within all the effective diameters can be corrected by the partial optical elements 50 that correspond 1:1 with these elements. The following steps (1)–(4) explain a procedure that corrects this aberration.

(1) The phase distribution of the respective partial optical elements 50 within a diffractive optical element in which aberration correction is not performed is $\phi k\ (x, y)$. Here, k=1~1156, (x, y) shows the position coordinates within the respective partial optical elements 50. As shown in FIG. 18, the combined system from the respective partial optical elements 50 to the condenser lens is considered as one afocal system. That is, 1,156 afocal systems are considered.

(2) The wavefront aberration of the above-mentioned afocal systems is calculated for k=1~1156. The wavefront aberration that was obtained is converted into a phase unit, and $\phi k'=(x, y)$, k=1~1,156.

(3) The phase distribution $\phi"k\ (x, y)$ of the partial optical elements 50 in which the wavefront aberration of the above-mentioned step (2) is corrected is determined as $\phi"k\ (x, y)=\phi k\ (x, y)-\phi'k\ (x, y)$. This is a component of aberration that is absorbed in the partial optical elements 50. At this time, when $\phi"k\ (x, y)$ exceeds 0~2π, the balance of 2π is redefined as $\phi"k\ (x, y)$. Furthermore, in the case of using the binary diffractive lens, $\phi"k\ (x, y)$ is converted into a phase distribution corresponding to quantization.

(4) According to $\phi"k\ (x, y)$, the surface shape of the respective partial optical elements 50 is determined.

By replacing the partial optical elements 50 of a diffractive optical element in which aberration correction is not performed, which was first explained, with the partial optical elements 50 having a surface shape determined by the above-explained procedure, an illumination optical system in which aberration has been corrected can be obtained.

The following explains an integration effect and spatial coherence. In this embodiment, an area illuminated by each partial optical element 50 corresponds to an element lens of the fly eye integrator. Therefore, the number of the partial optical elements 50 within the diffractive optical element 21 is the number of divisions of the beam cross sections, and this is superimposed on the reticle surface. The integration effect is the total number, 34×34=1,156, of the partial optical elements 50. Furthermore, the spatial coherence of an excimer laser with a wavelength of 246 mm can be expressed as coherent distances Lx and Ly in the respective X and Y directions (however, the Y direction is a direction of the Gaussian distribution). Typical values of Lx and Ly are 0.5 mm and 1 mm, respectively, in the case of enlarging this to a 40 mm×40 mm cross section. The effective diameter of the partial optical elements 50 of this embodiment is 1.176 mm×1.176 mm, so it is arrayed at a pitch larger than the coherent distance. Therefore, the degree of coherence of the light beams that pass through the respective partial optical elements 50 and are eventually superimposed on the reticle surface can be made extremely small. Furthermore, it is preferable that the angle of the oscillating mirror 5 of FIG. 1 is changed during the exposure in order to remove the remaining slight coherent noise and make the coherent noise homogeneous. Furthermore, instead of an oscillating mirror, it is also acceptable to arrange a disk glass plate (not depicted) with a slight wedge in front of the diffractive optical element 21, and to rotate the plate substantially once during the entire exposure period in synchronization with the exposure pulse. Furthermore, instead of the wedge glass plate, substantially the same effect can be obtained by arranging a rotating diffusion plate (a so-called lemon skin plate).

Figure 19:
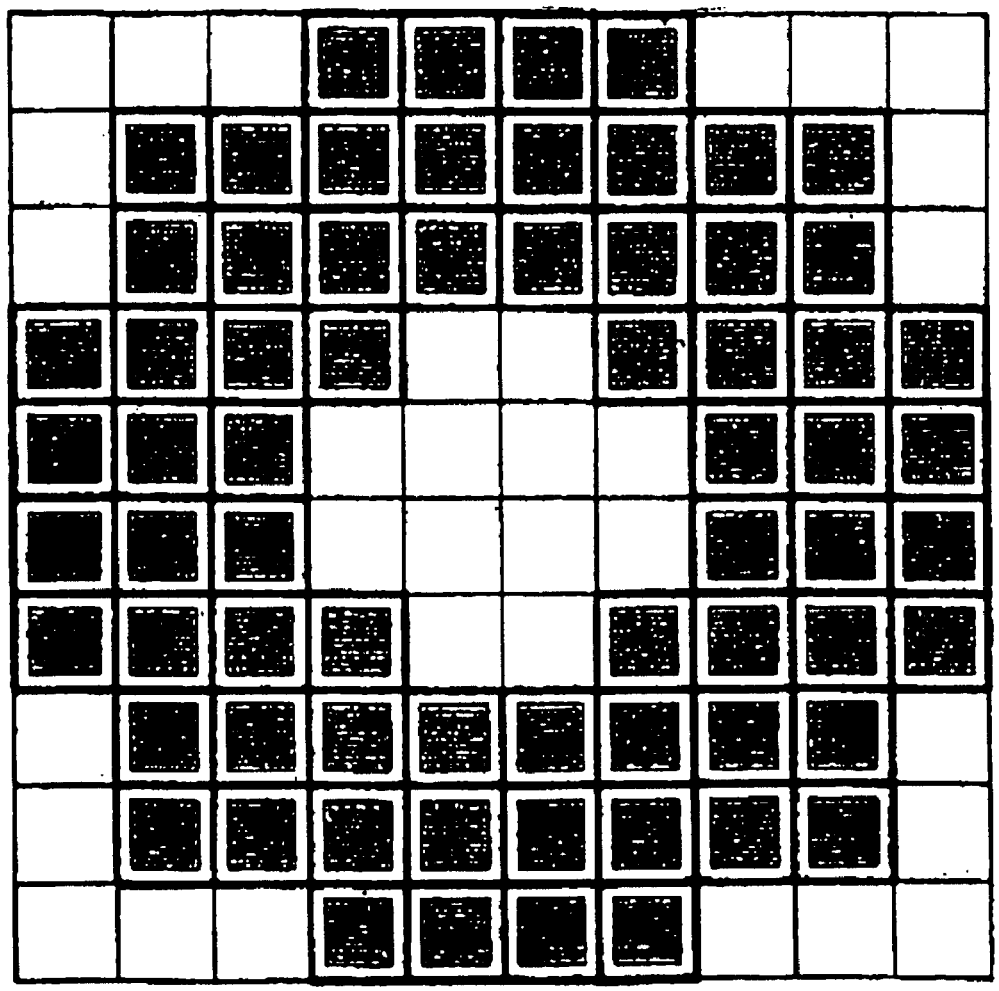
FIG. 19 is a diagram showing the margins of partial illumination areas.
Figure 20A:
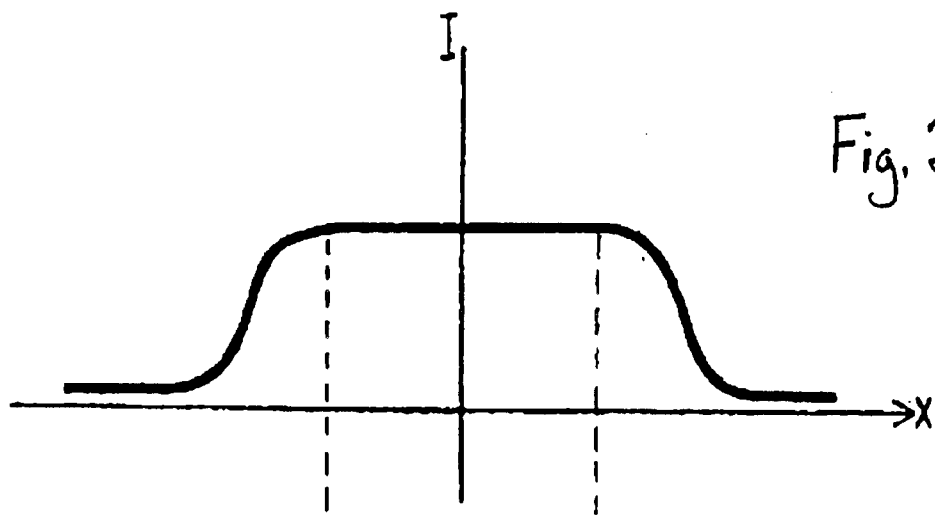
FIGS. 20A and 20B are diagrams explaining a shielding effect by a reticle blind.
Figure 20B:
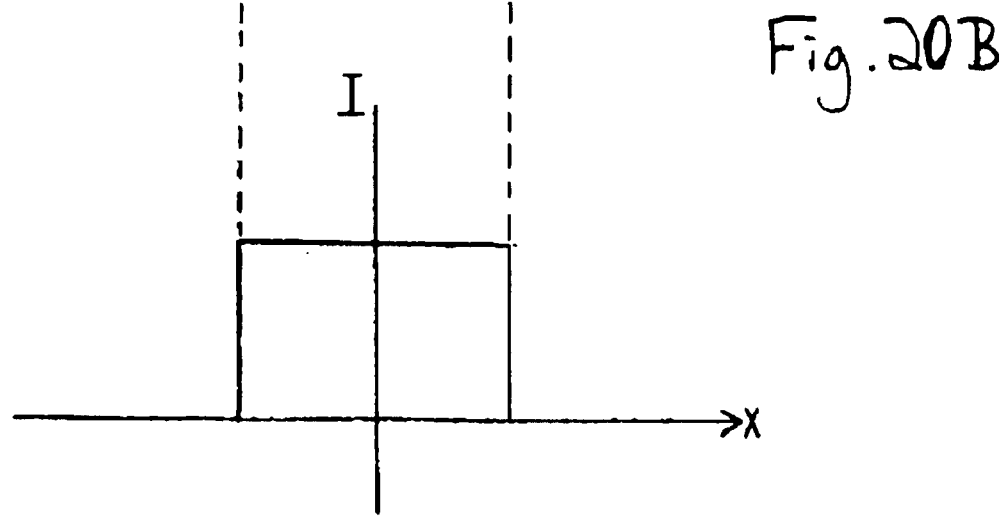

Furthermore, in the above example, an area that is the same size as an element lens of the fly eye integrator is a partial illumination area, but the size is not limited to this, and as shown in FIG. 19, areas that are slightly smaller than the fly eye element lenses can also be the partial illumination areas. The surrounding area of the respective partial illumination areas generates eclipse due to fabricating errors or expanding diffraction, but as shown in FIG. 20A, by shielding the eclipse with a reticle blind, only the homogeneous part of the center can be used as an exposure area (see FIG. 20B). The reticle blind refers to a field diaphragm arranged in a position conjugated with the reticle surface between the fly eye integrator 6, and the reticle blind plays a role of cutting the surrounding unhomogeneous light amount as described above.

Second Embodiment

In the second embodiment, ordinary round illumination is performed by the diffractive optical element 22. In FIG. 1, the revolver 3 is rotated by the motor MT1, the diffractive optical element 22 is inserted into the optical path, the revolver 7 is rotated by the motor MT2, and the aperture diaphragm 35 is selected.

Figure 21:
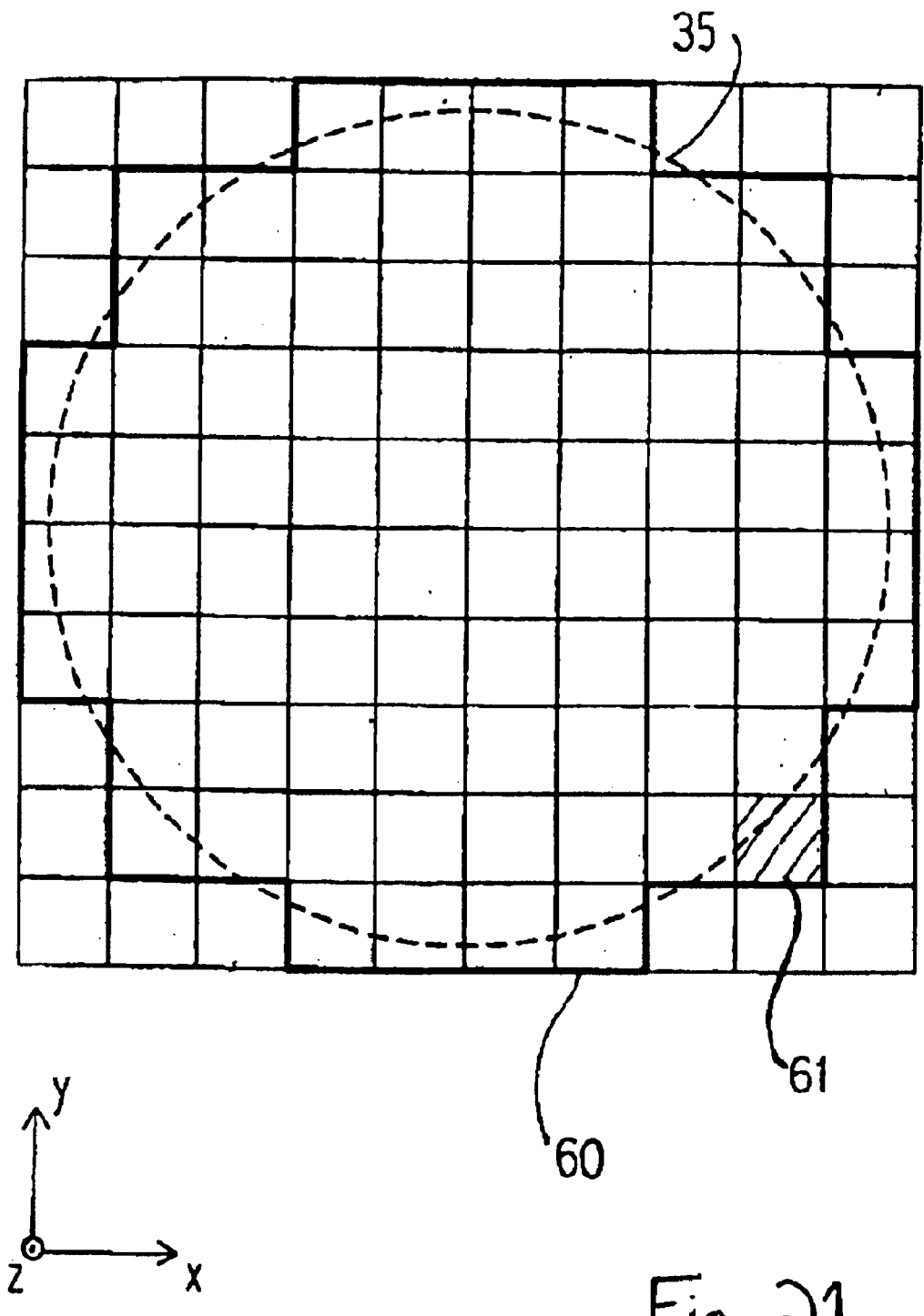
FIG. 21 is a diagram showing an illumination area on a fly eye integrator in a second embodiment of this invention.

The following explains details of the diffractive optical element 22 related to this embodiment. A design procedure of the diffractive optical element 22 is the same as for the diffractive optical element 21 described above, so that explanation is omitted. In this embodiment, the intensity distribution generated on the fly eye integrator 6 is different from that in the first embodiment because it is a round illumination. FIG. 21 shows an X-Y cross section of an input surface of the fly eye integrator 6. The part surrounded by a thick line is the basic illumination area 60 generated at the input surface of the fly eye integrator 6 by each of the respective basic optical elements. Additionally, in the same manner as in the first embodiment, the partial illumination areas 61 are made to be matched with the element lens input surfaces of the fly eye integrator 6.

Figures 22A, 22B:
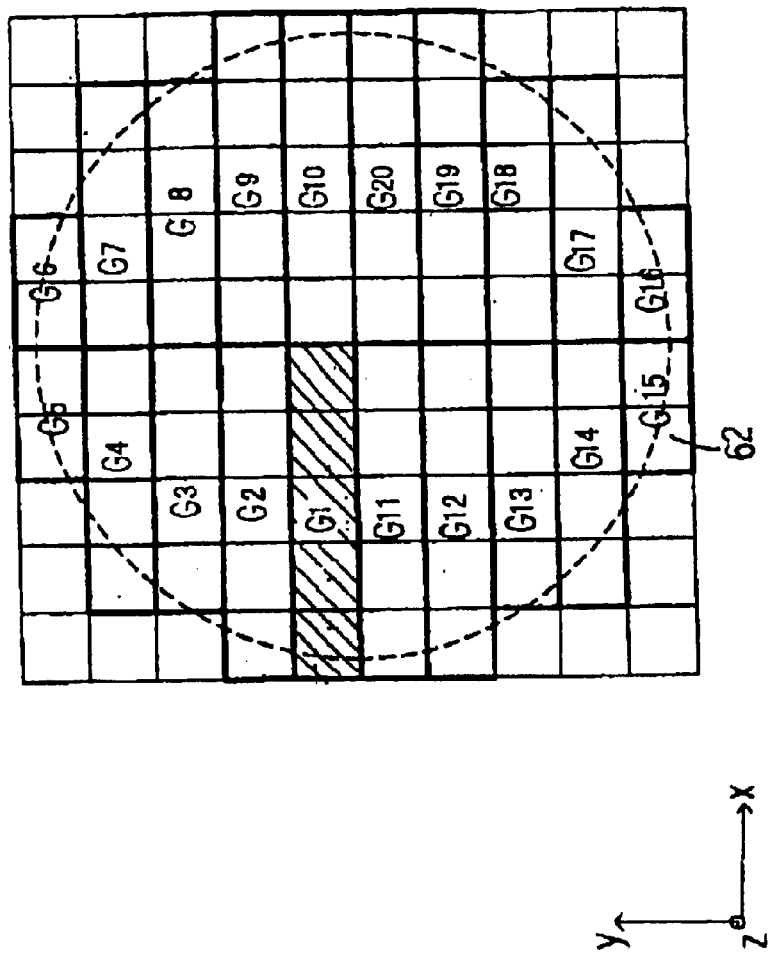
FIGS. 22A and 22B are diagrams explaining division and rearrangement of a virtual diffractive lens.

A design procedure of the diffractive optical element 22 is the same as in the case of the first embodiment. That is, the divided pattern of the basic illumination area 60 and the partial illumination areas 61 are projected onto a virtual diffractive lens, and arrangement of the partial optical elements within the diffractive optical element 22 is determined. Furthermore, the effective diameter and the focal length of the partial optical elements are determined, and the phase distribution and the surface shape of the final partial optical elements are determined by using the determined effective diameter and focal length. As shown in FIG. 22A, the virtual diffractive lens is divided into 20 groups, that is, groups G1–G20. Here, each group is formed by a plurality of partial optical elements 62. Furthermore, as shown in FIG. 22B, rearranging the plurality of partial optical elements 62 into 10 columns×2 rows in a condensed state yields a new basic optical element 63. In other words, the new basic optical element is formed by 40 columns×2 rows of the partial optical elements 62. Finally, by repeatedly arranging 20 basic optical elements 63 in a Y direction, a new diffractive optical element 22 with a square-shaped area is formed, that is formed overall by 40×40 partial optical elements 62.

The following description relates to a specific numerical value example. This embodiment has the same values as in the first embodiment with respect to $\phi$DOE, $\phi$FE, and fFE because the revolver is rotated in the first embodiment. Additionally, $\rho$sub=$\phi$FE, and $\phi$3rd=$\phi$FE.

By substituting $\phi$DOE and k=40 into equation (1), the effective diameter $\phi$sub of the partial optical elements 62 can be obtained.

$$\phi sub = \phi DOE/k \qquad (18)$$
$$= 1.000 \text{ mm}$$

Because $\phi$sub is determined, the effective diameter $\phi$2nd of the second light source is determined. In the same manner as in the first embodiment, the following result of $\phi$2nd is obtained with respect to the arrangement of the partial optical elements.

$$\phi 2nd = 46\phi sub \qquad (19)$$
$$= 46.000 \text{ mm}$$

Next, by substituting the above-mentioned value into the right side of equation (2), fL can be obtained.

$$fL = \phi 2nd/\phi 3rd \cdot fFE \qquad (20)$$
$$= 230.000 \text{ mm}$$

Furthermore, fsub is obtained by equation (3).

$$fsub = fL \cdot \phi sub/\rho sub \qquad (21)$$
$$= 57.500 \text{ mm}$$

Furthermore, by substituting fsub, the wavelength $\lambda$, and the index of refraction n into the equations (7)–(10), the phase distribution and the surface shape of the partial optical elements 62 can be determined. In the case of using a binary diffractive lens, $\rho$b of equation (11) can be used as the phase distribution $\rho$ of equation (10). The entire surface shape of the partial optical elements 62 is determined by this procedure, and arrangement of these elements as shown in FIG. 22B is the pattern of the basic optical element 63. Furthermore, repeated arrangement of 20 basic optical elements 63 in the Y direction is the pattern of the diffractive optical element 22. According to the pattern, the diffractive optical element 22 can be formed by EB writing a pattern on a mask, transferring this pattern to a glass substrate coated by a photoresist, and etching the pattern.

Here, by changing the illumination method, the effective diameter $\phi$2nd of the second light source plane changes, so in the case of maintaining the filling factor at a constant value, the focal length fL of the relay lens changes. Therefore, it is preferable that the relay lens has a structure in which the focal length is variable. For example, in the second embodiment, as the lens elements that form the relay lens are moved in an optical axis direction, or a lens element with a different focal length is inserted into or removed from the relay lens (including, replacing a lens element, as well as the case of merely removing or inserting a lens element), the focal length fL is changed by having an arrangement different from that in the first embodiment.

Additionally, due to the same reason, the second embodiment has a focal length fsub of the partial optical elements that is different from that in the first embodiment. Therefore, it is preferable that the diffractive optical element is arranged in a revolver upon considering the difference of the focal length. For example, when the focal plane of the relay lens is made constant in the first and second embodiments and only the focal length is changed, it is necessary to shift the Z direction position of the diffractive optical element by the shift amount of the focal length fsub of the partial optical elements. Specifically, the focal length fsub of the partial optical elements in the second embodiment is 11.704 mm shorter than the focal length fsub of the partial optical elements in the first embodiment. Therefore, it is preferable that the diffractive optical element 22 of the second embodiment is arranged in a position shifted 11.704 mm closer to the fly eye integrator 6 compared to the diffractive optical element 21 of the first embodiment.

Here, it is possible to have a structure in which the focal plane and focal length of the relay lens are simultaneously changed. Furthermore, the focal plane position of the relay lens can be set to absorb the shift amount of the focal length fsub of the partial optical elements of the first embodiment and the second embodiment. In this case, the position in the Z direction of the diffractive optical element 22 and of the diffractive optical element 21 can be made the same. Furthermore, when the filling factor is not constant, it is possible to make the focal length fL of the relay lens constant in a range where the light beam is not shaded.

Additionally, with respect to the aberration correction of the illumination system, a procedure that is the same as in the first embodiment can be performed. In addition, when the filling factor is set and arranged where the light beam is not shaded and aberration correction is not performed, even if the illumination method is changed, the focal lengths fL and fsub can be constant. In this case, it is acceptable for the position at which the diffractive optical element is arranged to be fixed.

Here, the integration effect of this embodiment is 40×40=1,600. Furthermore, the partial optical elements 63 have a size of 1 mm×1 mm, so this is more than a typical spatial coherent distance (Lx=0.5 mm, Ly=1 mm) of an excimer laser with a wavelength of 246 nm. Therefore, the degree of interference of the light beams that are ultimately superimposed on the reticle surface can be made extremely small by passing through the respective partial optical elements 63. Furthermore, it is more preferable that the remaining slight interference noise is made homogeneous during the exposure by a structure such as an oscillating mirror, as in the first embodiment.

Third Embodiment

In the third embodiment, this invention is applied to a scanning type exposure apparatus. A scanning type exposure apparatus can obtain a broad exposure range as the reticle and wafer in FIG. 1 are moved in synchronization during exposure. This scanning exposure apparatus is provided with an exposure area that is rectangular-shaped, and by scanning, the entire exposure area can be obtained. Therefore, the shape of the element lenses of the fly eye integrator of the scanning exposure apparatus are not square-shaped but are rectangular-shaped, which is different from the above-mentioned embodiments.

Figure 23:
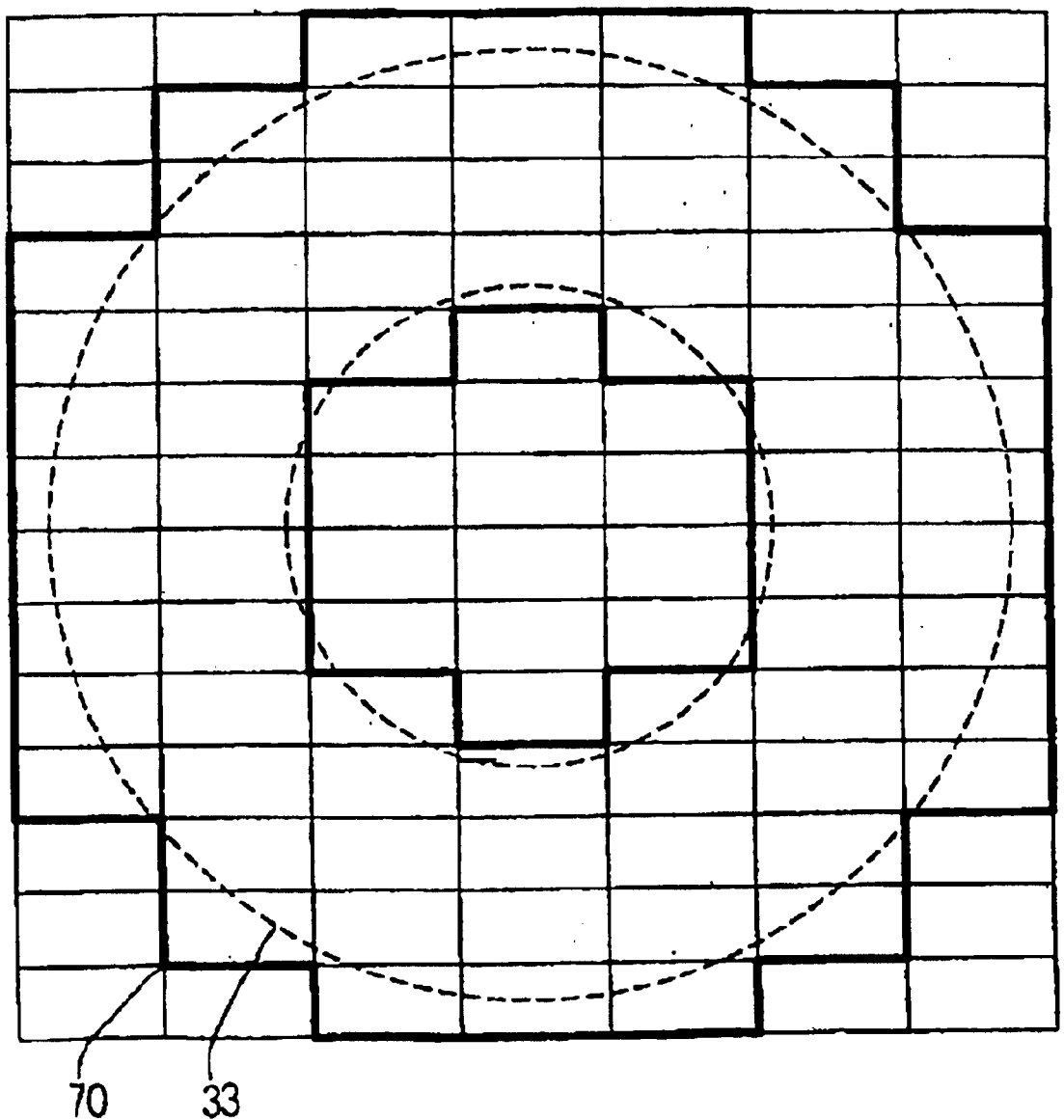
FIG. 23 is a diagram showing an illumination area on a fly eye integrator in a third embodiment of this invention.

The following explains a diffractive optical element used when ring illumination is performed in this scanning exposure apparatus. FIG. 23 is a diagram showing a structure of an X-Y plane of a fly eye integrator. In FIG. 23, the Y direction corresponds to a scanning direction. The dotted line shows a ring diaphragm of a fly eye integrator output surface, and the thick line shows an illumination area, that is, the basic illumination area 70, of a fly eye integrator input surface corresponding to this ring illumination. The rectangular-shaped parts divided by the thin lines show the element lenses of the fly eye integrator. The effective diameter of the element lenses is 8 mm×4 mm and they are arranged in 7 columns×14 rows with respect to the X-Y plane. Therefore, the entire effective diameter of the fly eye integrator is 56 mm×56 mm.

Figure 24:
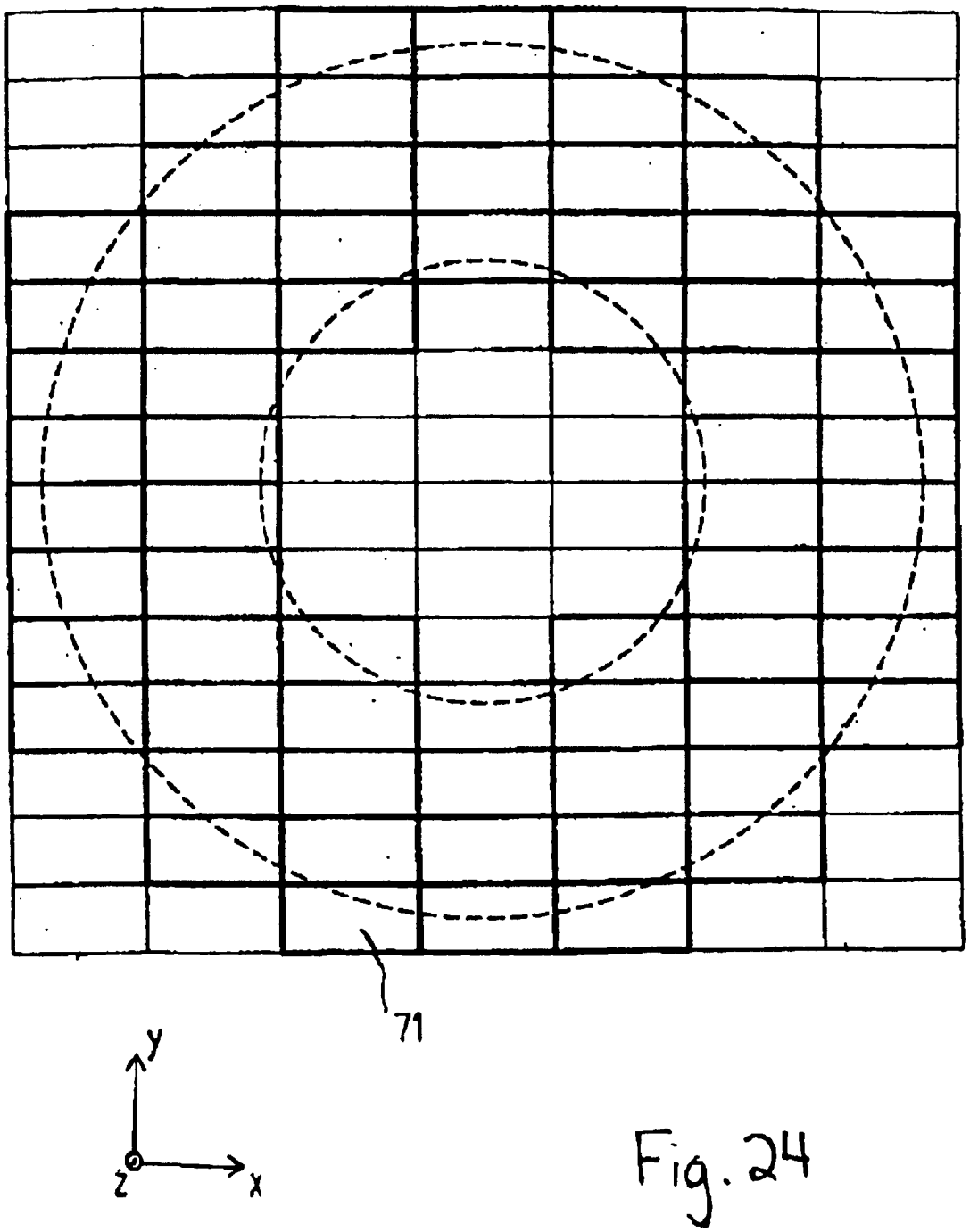
FIG. 24 is a diagram showing partial illumination areas.
Figures 25A, 25B:
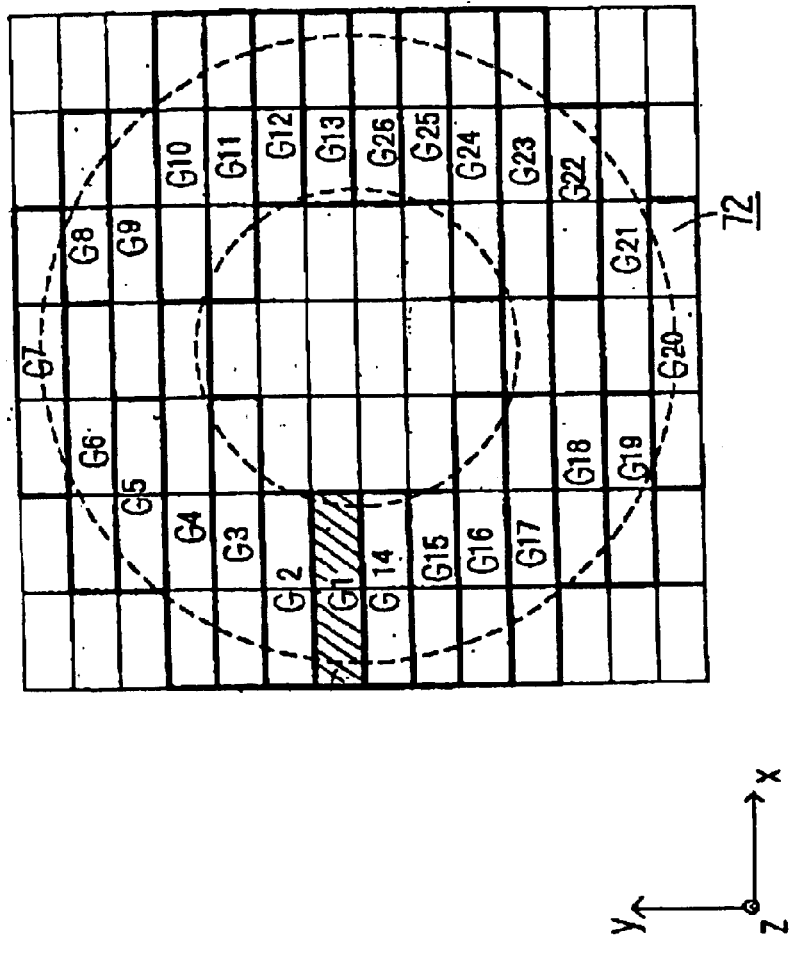
FIGS. 25A and 25B are diagrams showing division and rearrangement of a virtual diffractive lens of the third embodiment.
Figure 26:
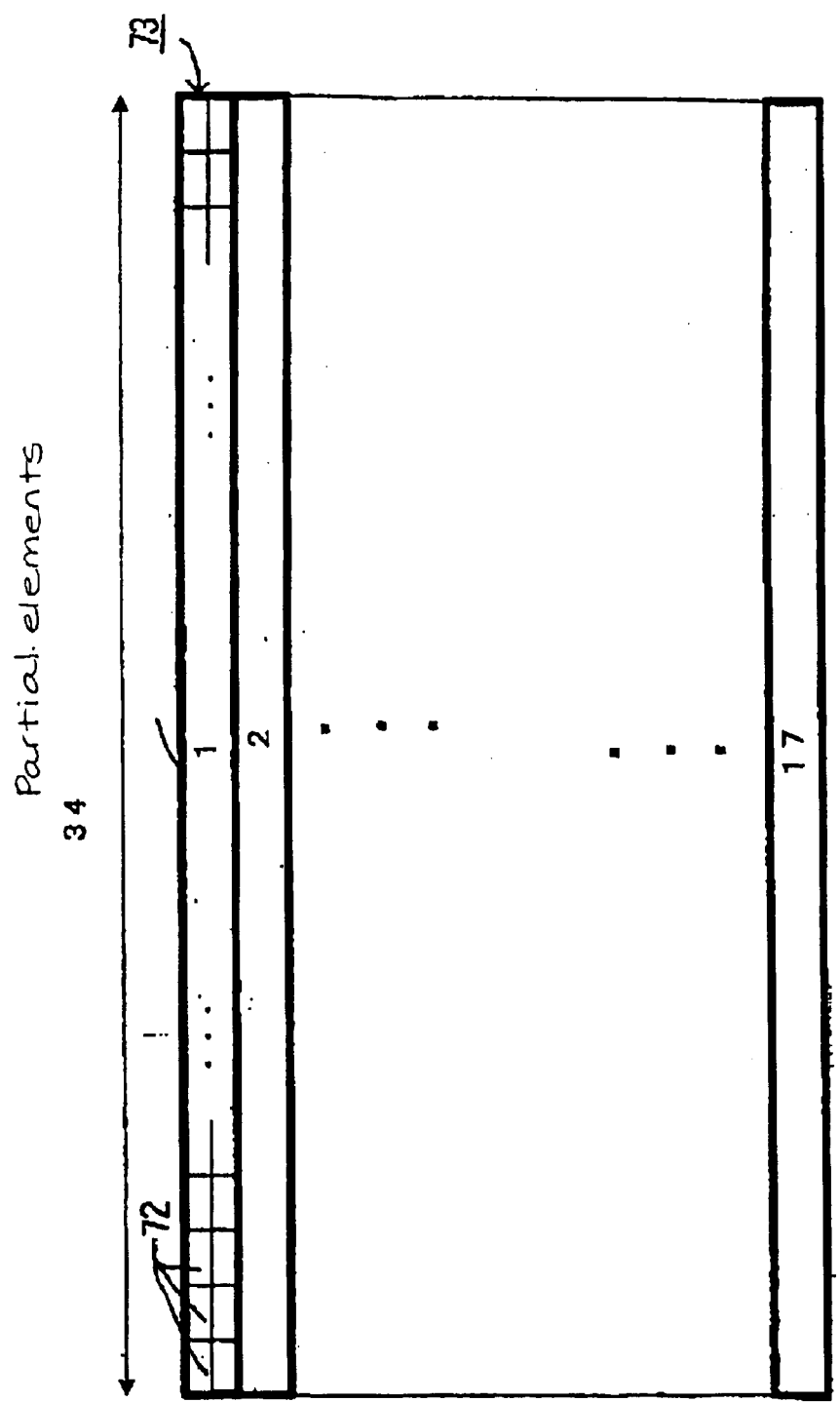
FIG. 26 is a diagram showing the overall arrangement of basic optical elements.
Figure 27A:
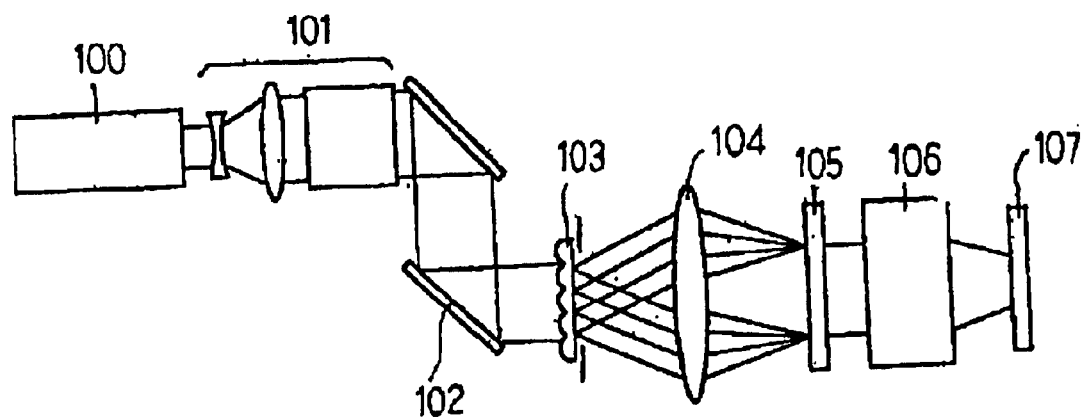
FIG. 27A is a diagram explaining a schematic structure of a conventional exposure device.
Figure 27B:
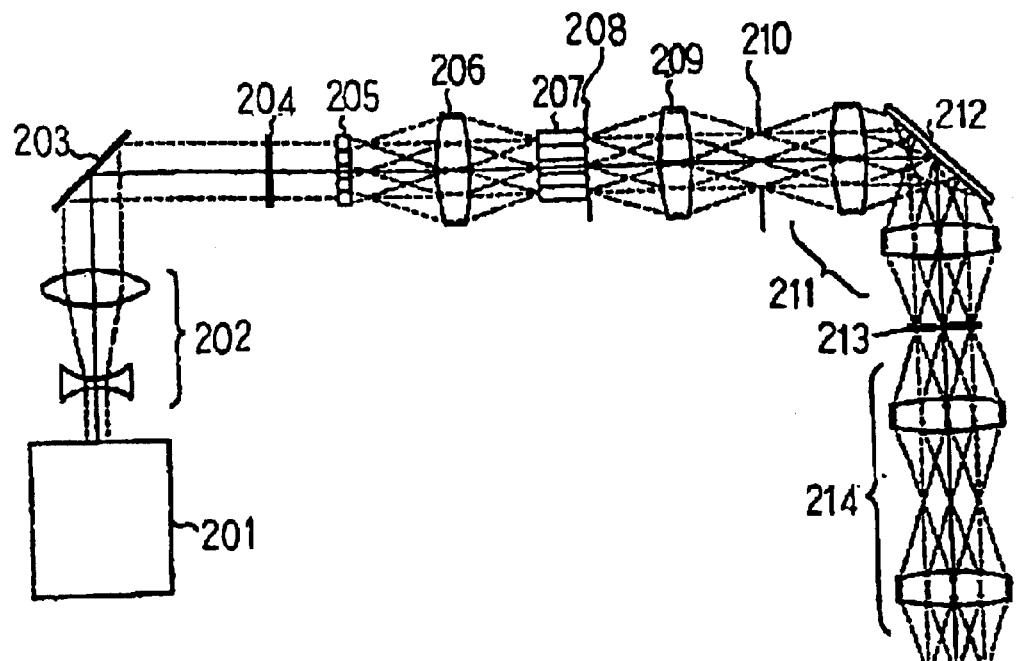
FIG. 27B is a diagram explaining a double fly eye lens system.
Figure 28:
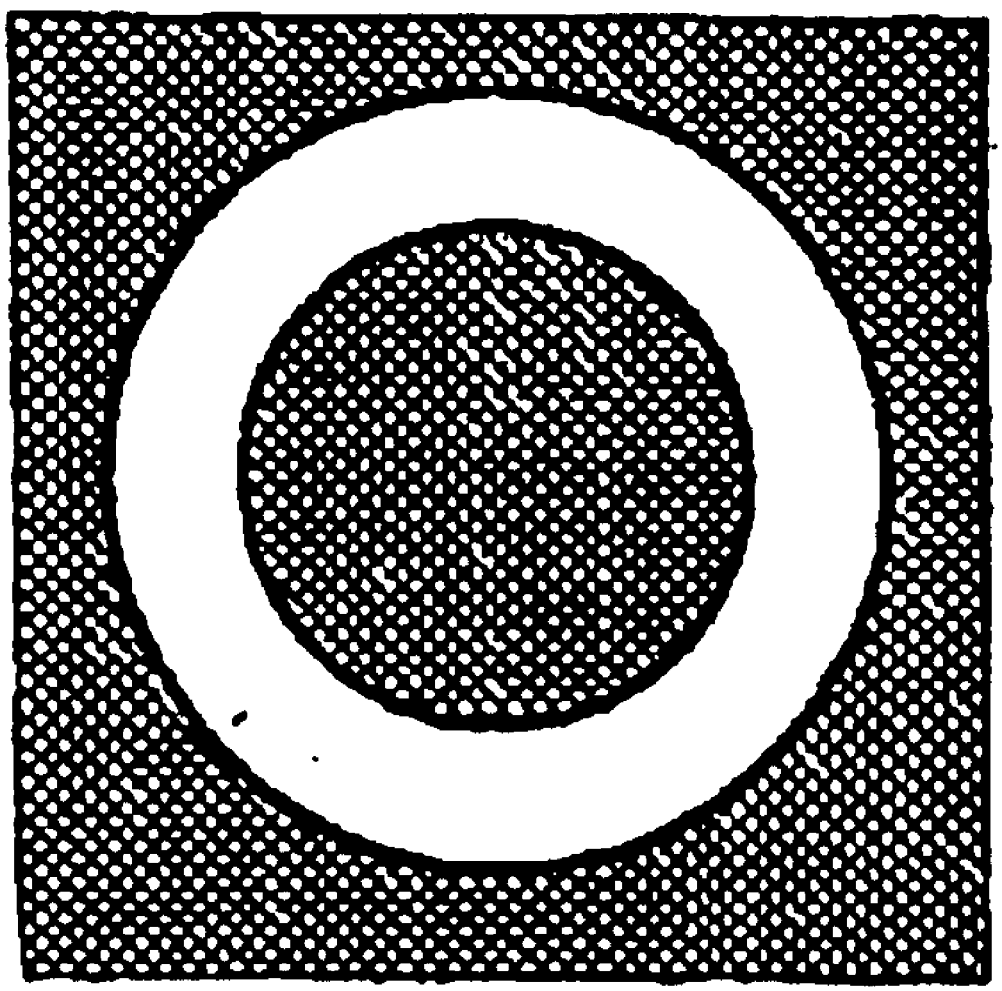
FIG. 28 is a diagram showing a structure of a ring-shaped aperture diaphragm.
Figure 29:
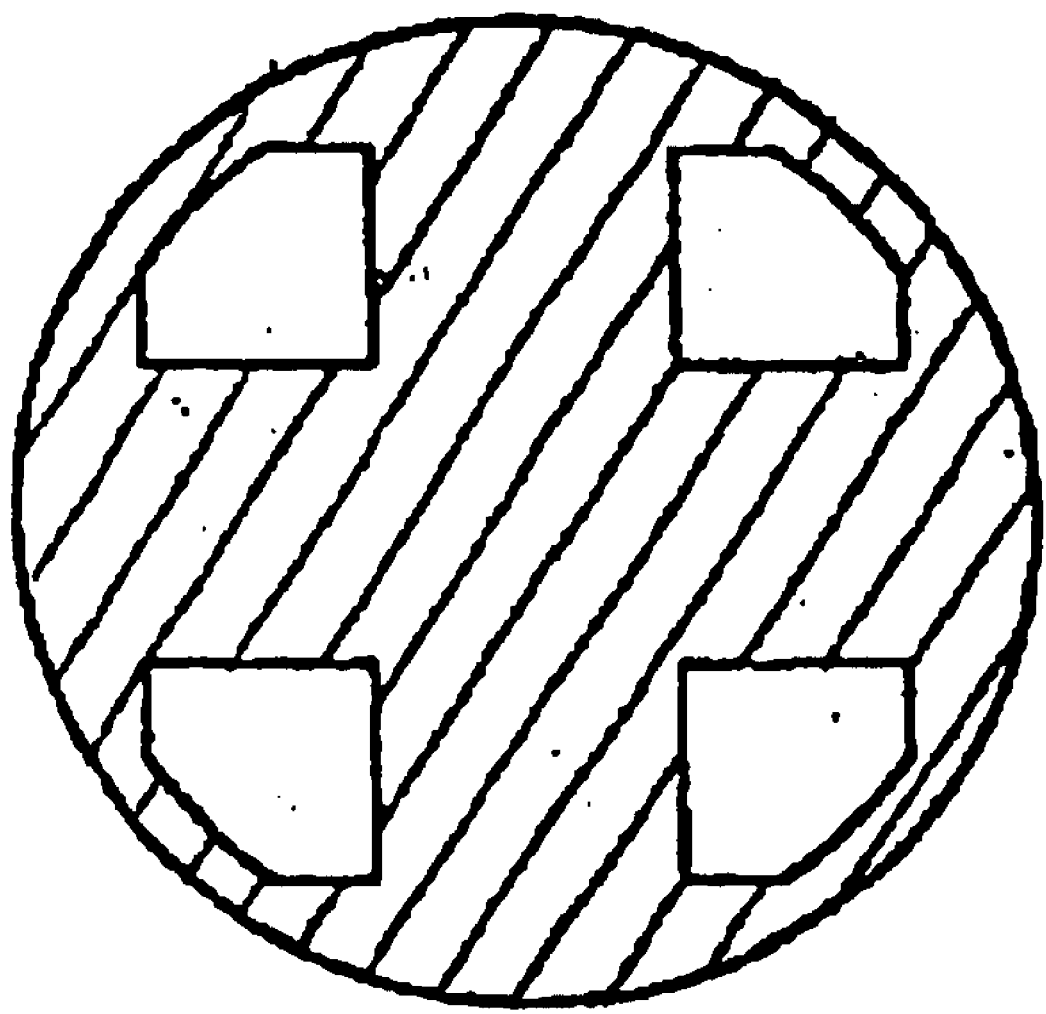
FIG. 29 is a diagram showing a structure of an aperture diaphragm for a quadru-pole illumination.

FIG. 24 is a diagram showing a structure that divides the basic illumination area 70 into partial illumination areas 71. The partial illumination areas 71 correspond to the respective fly eye element lenses. This diffractive optical element can also be formed in the same manner as in the above-mentioned embodiments. First, the divided pattern of the basic illumination area 70 and the partial illumination areas 71 are projected onto a virtual diffractive lens and arrangement of the partial optical elements within the diffractive optical element is determined. Next, the effective diameter and focal length of the partial optical elements are determined, and the final phase distribution and surface shape of the partial optical elements are determined by using the determined effective diameters and focal lengths. FIG. 25A is a diagram showing a method of dividing a virtual diffractive lens in the third embodiment. The virtual diffractive lens is divided into 26 groups G1–G26. Here, each group is formed by a plurality of partial optical elements 72. Next, as shown in FIG. 25B, by rearranging each group into 34 columns×2 rows in a condensed state, a new basic optical element 73 is defined. Furthermore, as shown in FIG. 26, by arranging 17 new basic optical elements 73 in a Y direction, a diffractive optical element is formed. Here, the number of partial optical elements in the X and Y directions is 34×34. Furthermore, the shape of the respective partial optical elements 72 is rectangular, which corresponds to the fly eye element lenses, so the entire effective diameter is also rectangular. Therefore, it is preferable that the beam input to the diffractive optical element is made to be substantially adjusted to a rectangular shape having the same size.

The following describes a specific numerical value example. First, a case is considered in which the diffractive optical element is arranged as shown in FIGS. 25A, 25B and 26 and formed by 34×34 partial optical elements. Furthermore, the following values are determined by the restriction of the exposure area, the entire length of the optical system, and the like. The following shows X and Y, respectively, for the X direction component and the Y direction component.

$$\phi DOE\_x = 40 \text{ mm} \quad (22)$$

$$\phi DOE\_y = 20 \text{ mm}$$

$$\phi FE\_x = 8 \text{ mm}$$

$$\phi FE\_y = 4 \text{ mm}$$

$$fFE = 20 \text{ mm}$$

and, $$\rho sub\_x = \phi FE\_x.$$

-continued $$\rho\text{sub\_y} = \phi\text{FE\_y},$$

$$\phi\text{3rd\_x} = \phi\text{FE\_x},$$

$$\phi\text{3rd\_y} = \phi\text{FE\_y}.$$

First, by substituting φDOE_x, φDOE_y and k=34 into equation (1), the effective diameter φsub_x, φsub_y of the partial optical elements 72 is obtained.

$$\phi\text{sub\_x} = \phi\text{DOE\_x}/\text{k\_x} \quad (23)$$
$$= 40 \text{ mm}/34$$
$$= 1.176 \text{ mm}$$
$$\phi\text{sub\_y} = \phi\text{DOE\_y}/\text{k\_y}$$
$$= 20 \text{ mm}/34$$
$$= 0.588 \text{ mm}$$

Here, because φsub is determined, the effective diameter φ2nd_x, φ2nd_y of the second light source is determined. In the same manner as in the first embodiment, φ2nd can be considered with respect to the arrangement of the above-mentioned partial optical elements.

$$\phi\text{2nd\_x} = 26 \cdot \phi\text{sub\_x} \quad (24)$$
$$= 30.588 \text{ mm}$$
$$\phi\text{2nd\_y} = 44 \cdot \phi\text{sub\_y}$$
$$= 25.882 \text{ mm}$$

Thus, φ2nd_x is larger than φ2nd_y, but if it is considered that the X Y effective diameter ratio of the fly eye element lenses is 2:1 and that the relay lens disposed before the fly eye element lenses is a rotationally symmetrical lens, it is understood that it is necessary to determine fL by a Y direction value so that the light beam will not be shaded in the third light source. Therefore, by substituting φ2nd_y, φ3rd y, and fFF into the right side of equation (2), fL is obtained.

$$fL = \phi\text{2nd\_y}/\phi\text{3rd\_y} \cdot fFF \quad (25)$$
$$= 129.412 \text{ mm}$$

Furthermore, fsub is obtained by equation (3).

$$fsub = fL \cdot \phi\text{sub\_y}/\rho\text{sub\_y} \quad (26)$$
$$= 19.031 \text{ mm}$$

By substituting fsub, the wavelength ρ, and index of refraction n into equations (7)–(10), the phase distribution and the surface shape of the partial optical elements 72 can be determined. In the case of using a binary diffractive lens, ρb of equation (11) can be used as the phase distribution ρ of equation (10). Thus, the entire surface shape of the partial optical elements 72 is determined, and as shown in FIG. 25B, rearrangement of the partial optical elements in a condensed state yields a pattern of the basic optical element 73. Furthermore, as shown in FIG. 26, a plurality of the basic optical elements 73 are repeatedly arranged, and this becomes a pattern of the entire diffractive optical element. According to this pattern, the diffractive optical element can be formed by EB writing a pattern on a mask, transferring this pattern to a glass substrate coated by a resist, and etching the pattern.

The integration effect in the third embodiment is 34×34= 1,156. Furthermore, the effective diameter of the respective partial optical elements 72 is 1.176 mm×0.588 mm. Additionally, when the beam diameter is enlarged to 40 mm×20 mm, a typical spatial coherence distance in an excimer laser with a wavelength of 246 mm is Lx=0.5 mm, Ly=0.5 mm. That is, with respect to the X and Y directions, the effective diameter of the partial optical elements 72 is larger than the coherent distance. Therefore, the degree of interference of the light beams that are ultimately superimposed on the reticle surface can be made extremely small by passing through the respective partial optical elements 72. Furthermore, it is more preferable that the remaining slight interference noise is made homogeneous during the exposure time by an oscillating mirror or the like in the same manner as in the first embodiment.

Fourth Embodiment

The following explains a fourth embodiment of this invention. The basic setting of this embodiment is the same as in the first embodiment. The following explains characteristics of the design procedure in this embodiment. In the first embodiment, the design was implemented by using a virtual lens. However, in this embodiment, the design is implemented by dividing the basic illumination area into partial illumination areas and grouping the partial illumination areas. In this embodiment, the partial optical elements 50 can be formed by diffractive grids. First, the design procedure of the diffractive grids is explained. In this embodiment, one partial optical element is designed so as to illuminate one partial illumination area. Because of this, it is preferable that the following two conditions (A) and (B) are satisfied.

(A) The light beams input to the partial optical elements are converted to the width of the partial illumination areas.
(B) The irradiating relationship of the above-mentioned (A) is shifted in a desired direction in order to illuminate arbitrary partial illumination areas.

Figure 30:
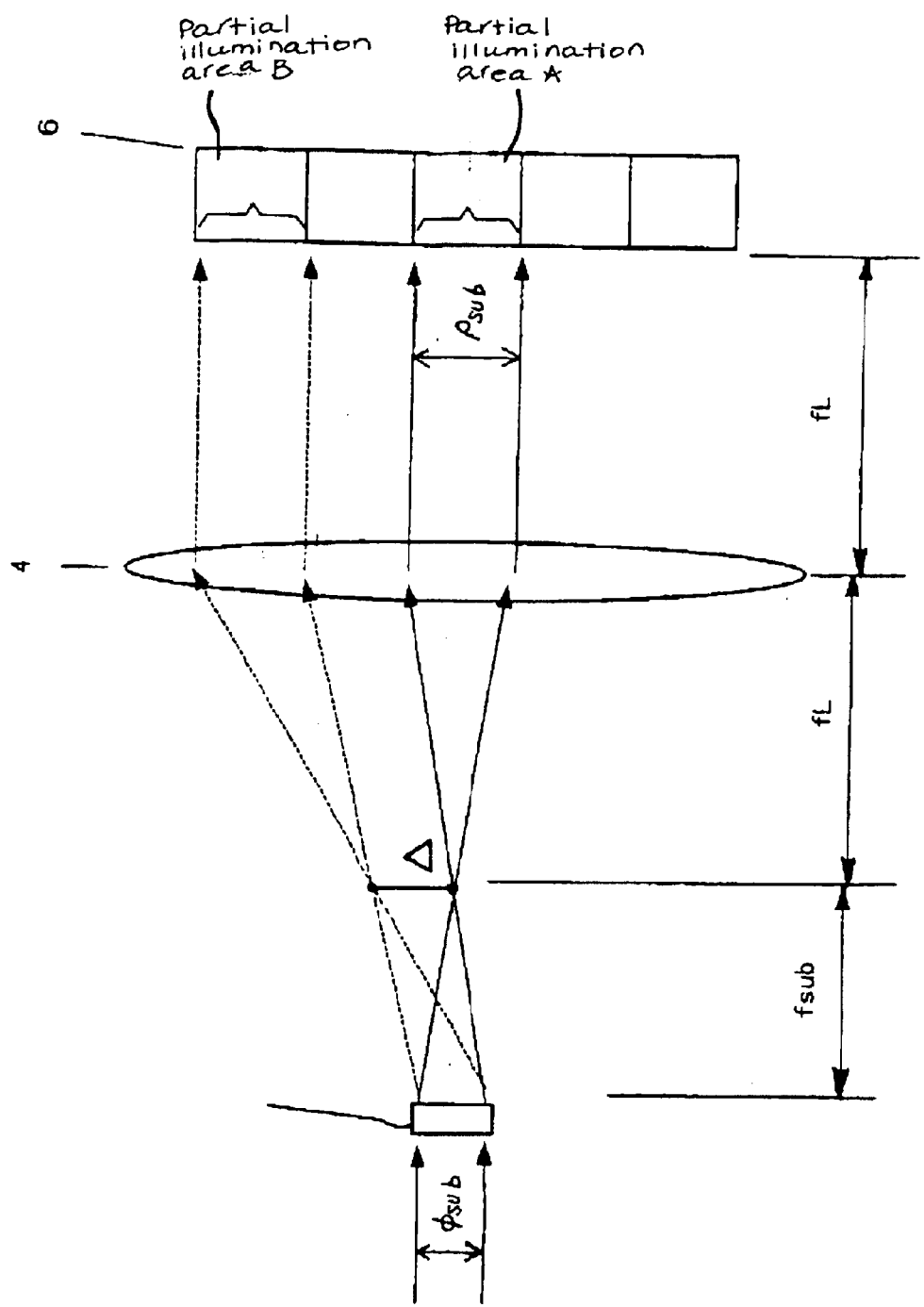
FIG. 30 is a diagram explaining a design principle of partial optical elements.

The above-mentioned conditions are explained with reference to FIG. 30. FIG. 30 is a diagram showing an optical path (solid line) of a light beam when a diffractive grid 50 with a phase distribution that is the same as a lens component that is rotationally symmetrical to an ordinary optical axis is used as the partial optical elements. The light beam having a diameter φsub (same as the effective diameter of the partial optical elements) input to the partial optical elements is converted to a light beam having a diameter ρsub by an optical system that is formed by the partial optical elements 50 and the relay lens 4 and illuminates a partial illumination area A on the optical axis.

Here, a case is considered in which the partial optical elements 50 have phase components that generate deflection in addition to the above-mentioned rotational symmetrical component as the phase distribution. In this case, the light beam can be deflected as shown in FIG. 30 by a dotted line and illuminate a partial illumination area B that is offset from the optical axis. By appropriately selecting a phase distribution that generates this type of deflection for each partial optical element, a desired partial illumination area can be illuminated. This is a principle of the partial optical elements in this embodiment. Furthermore, it is preferable that the effective diameter φsub of the partial optical elements, the focal length fsub, the size ρsub of the partial illumination areas, and the focal length FL of the relay lens 4 satisfy the above-mentioned equation (3).

The following explains a method of determining a surface shape of this type of partial optical element. First, a method of determining a phase distribution of the partial optical elements 50 is described. An ordinary diffractive lens (the case in which deflection components are not included) is explained.

A. Diffractive Lens (The Case Without Deflection Components)

As described above, it is generally known that a diffractive lens having a focal length f (=fsub) can be designed as an element that converts parallel light to an ideal spherical wave. A procedure that determines a surface shape of a diffractive lens without deflection components and that illuminates the partial illumination area A in FIG. 30 is the same as in the case of the diffractive lens explained with reference to FIGS. 13A–13C. Additionally, this diffractive lens can be formed as a binary diffractive lens by the same procedure as in the case explained with reference to FIG. 14.

B. Diffractive Lens (The Case Without Deflection Components)

A diffractive lens including a deflection component (for illuminating the partial illumination area B) can be designed by adding a deflection component to the above-mentioned ordinary diffractive lens. Therefore, a method of determining a phase distribution of a deflection component is described. Here, a design is implemented as the deflective phase component is considered to be the same as a one-dimensional grating phase component. First, this one-dimensional grating is explained.

A one-dimensional grating is a grating that converts an input light beam to a light beam that has been deflected by a certain angle. One example of a one-dimensional grating is shown in FIG. 31A. FIG. 31A is a Fresnel lens type phase grating, and substantially all of the input light is emitted in a one-dimensional diffractive light beam direction. Here, the relationship between pitch P and the output angle $\theta$ of the one-dimensional diffractive light beam can be given by the following equation (27), with the wavelength as $\lambda$.

$$P=\lambda/\sin\theta \quad (27)$$

Figure 31B:
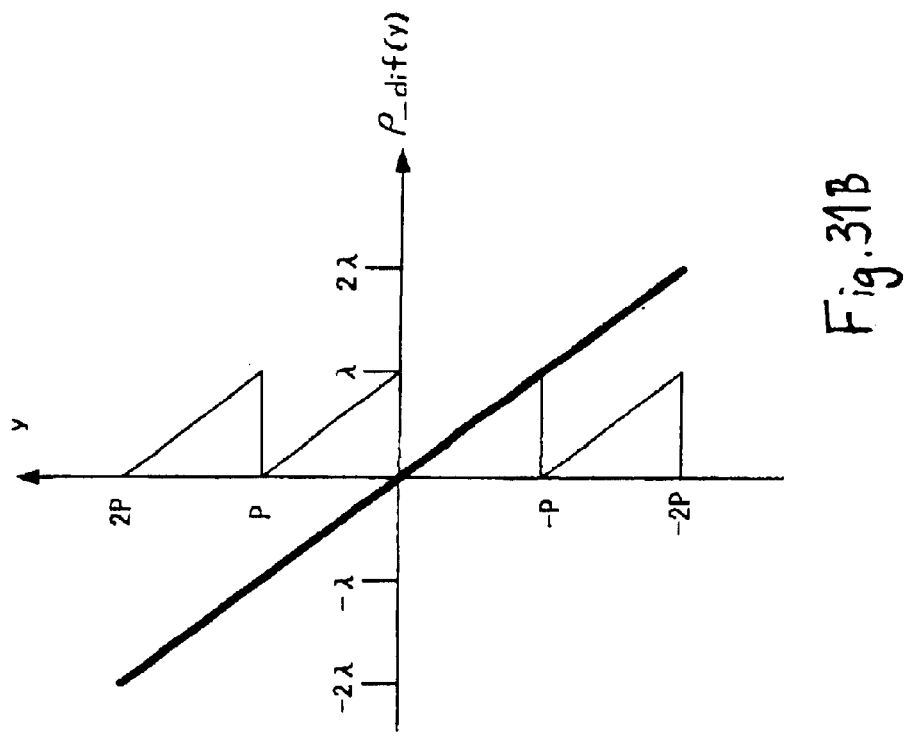
FIGS. 31A and 31B are diagrams explaining a grating.
Figure 31A:
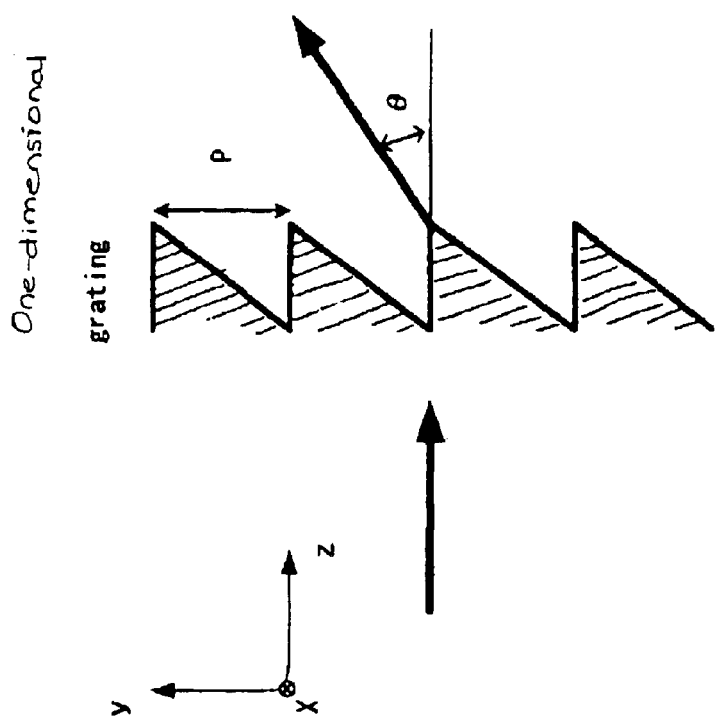

With respect to the phase distribution $\rho\_dif(y)$ of this grating, as shown in FIG. 31B, the phase change of $\lambda$ is generated per one pitch.

$$\rho\_dif(y)=-y\cdot\lambda/P \quad (28)$$

Figure 32:
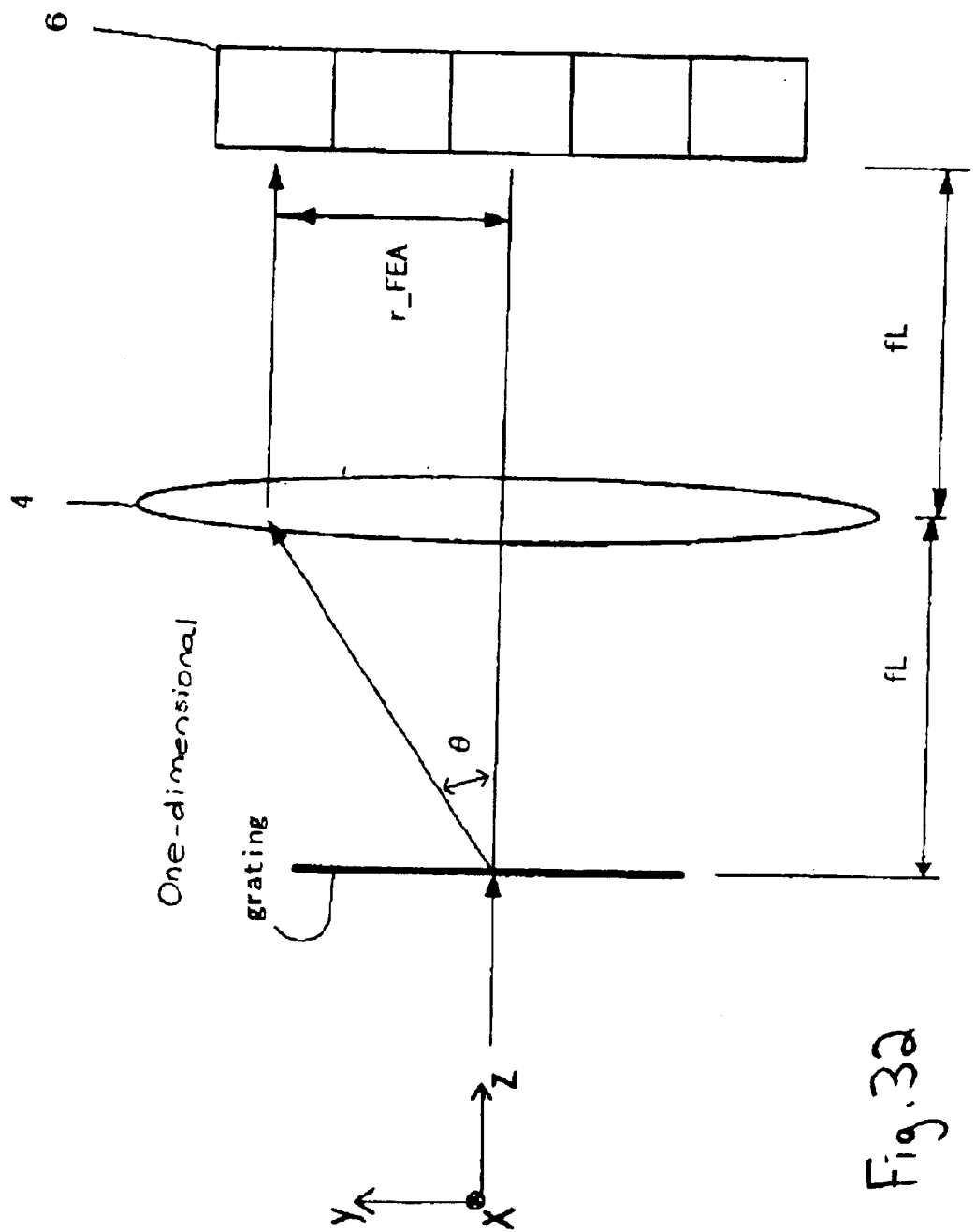
FIG. 32 is a diagram explaining an operation of a one-dimensional grating.

If this type of one-dimensional grating is arranged in front of the relay lens 4, as shown in FIG. 32, a light beam on the optical axis is converted to a light beam input to the fly eye integrator 6 at a position at a height $r\_FEA$ from the optical axis. According to this principle, the illuminated light shown by dotted lines in FIG. 30 can be obtained. Furthermore, the relay lens 4 can be an ideal lens that converts the light beam of the angle $\theta$ to a position on the fly eye integrator 6 at a height $r\_FEA$, based on the following equation (29).

$$r\_FEA=fL\cdot\sin\theta \quad (29)$$

By eliminating $\sin\theta$ from equations (27) and (29), the following equation (30) can be obtained by solving for P.

$$P=\lambda\cdot fL/r\_FEA \quad (30)$$

By substituting this P into equation (28), the phase distribution $\rho\_dif(y)$ of the one-dimensional grating is determined.

$$\rho\_dif(y)=-y\cdot r\_FEA/fL \quad (31)$$

As is clear from equation (31), if the Y coordinate on the grating, the focal length fL of the relay lens 4, and the centroid coordinate $r\_FEA$ of the illumination area on the fly eye integrator 6 are determined, the phase distribution $\rho\_dif(y)$ of the one-dimensional grating for deflection can be determined. As the partial optical elements are formed by adding this phase distribution $\rho\_dif(y)$ to the phase distribution $\rho(r)$ of the rotationally symmetrical lens of equation (4), light beams having an optical path as shown by dotted lines in FIG. 30, that is, light beams having deflection components, can be obtained. Furthermore, the case was explained in which the one-dimensional grating is arranged in the focal position of fL, but even if the one-dimensional grating is arranged backward from the focal position (the position at which the partial optical elements are actually arranged) by fsub, the light beam of the angle $\theta$ eventually reaches the position of $r\_FEA$, so that the above-mentioned principle can be applied as-is.

In the above explanation, deflection in the Y direction was described, but deflection to an arbitrary two-dimensional coordinate position within the input surface of the fly eye integrator is actually needed. Because of this, the deflected phase distribution when the light beam is deflected to an arbitrary position is explained based on FIG. 33.

Figure 33:
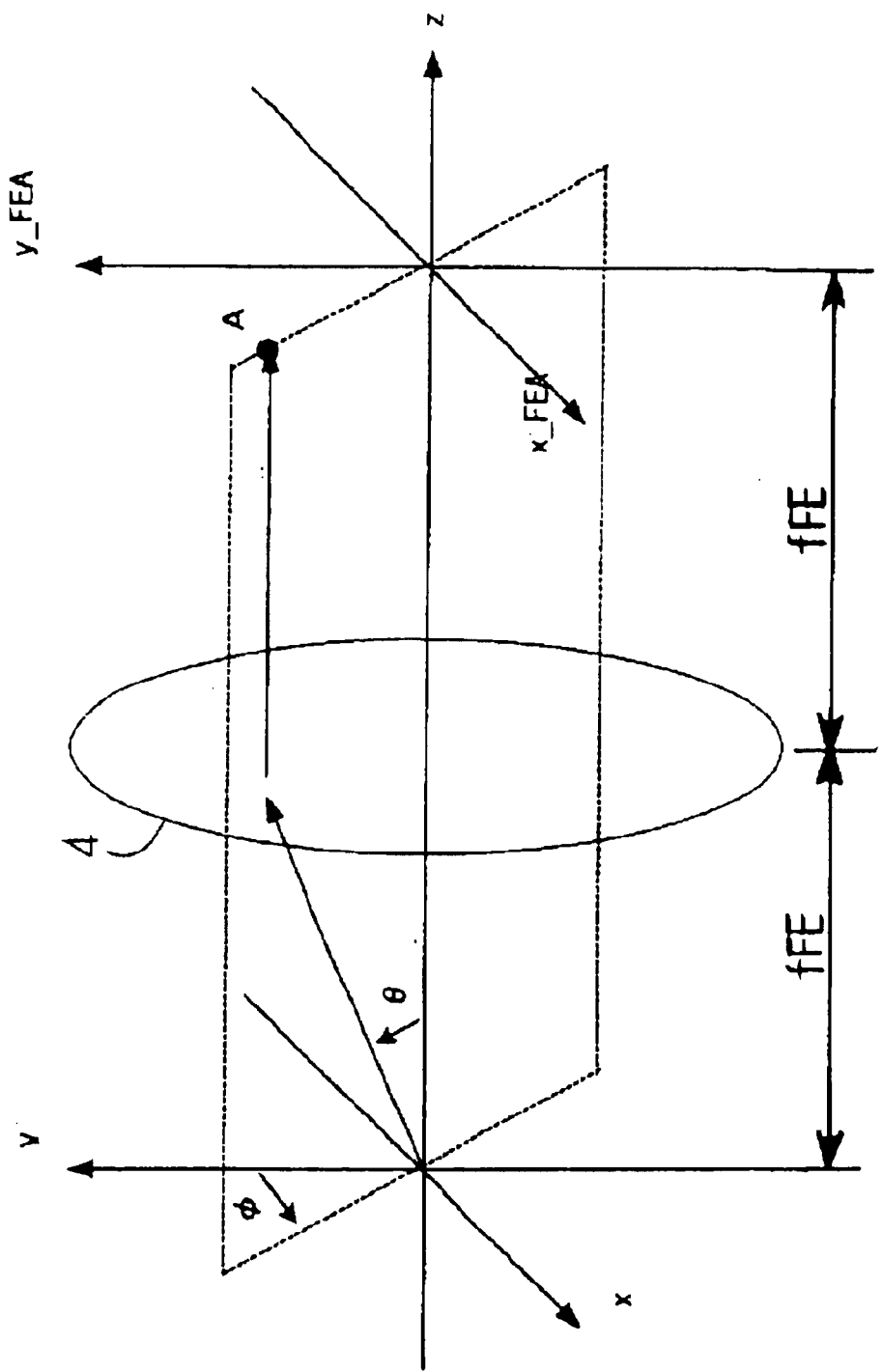
FIG. 33 is a diagram explaining a principle of illuminating an arbitrary two-dimensional position by a one-dimensional grating.

FIG. 33 shows that a one-dimensional grating is arranged in front of the relay lens, and that a light beam on the optical axis is deflected to point A (the coordinates are $x\_FEA$, $y\_FEA$) on the fly eye integrator input surface. Here, as a relay lens, it is assumed that equation (29) is satisfied.

In the above arrangement, the phase distribution $\rho\_dif(x,y)$ at the coordinate $(x,y)$ on the one-dimensional grating can be calculated by considering a plane inclined at the angle $\phi$ with respect to the above-mentioned Y direction in FIG. 33.

$$\rho\_dif(x,y)=-s\cdot\lambda/P \quad (32)$$

Here, $$s=y\cdot y\_FEA/r\_FEA+x\cdot x\_FEA/r\_FEA \quad (33)$$

$$P=\lambda\cdot fL/r\_FEA \quad (34)$$

$$r\_FEA=[y\_FEA^2+x\_FEA^2]^{1/2} \quad (35)$$

Furthermore, in the above explanation, the relay lens 4 converts the light beam with angle $\theta$ to the height of $fL\cdot\sin\theta$, but in general, other cases may also occur due to aberration and arrangement of the lens. This can be obtained as the actual relay lens is traced by a light beam. In this case, it is preferable that equations (32)–(35) are set after adding correction to equation (29) based on the result of the light beam tracing.

C. Summary of the Diffractive Lens Including a Deflection Component

The phase distribution $\rho tot$ of the diffractive lens can be obtained by adding equation (4) and equation (32) for illuminating the partial illumination area of the fly eye integrator 6 at which the position $(x\_FEA, y\_FEA)$ on the input surface is the centroid.

$$\rho tot(x,y)=\rho(x,y)+\rho\_dif(x,y) \quad (36)$$

$\rho(x,y)$ is a phase of a rotationally symmetrical lens component, and is given by the following equation (37).

$$\rho(x,y)=((fsub^2+r^2)^{1/2}-fsub) \quad (37)$$

$$r=[y^2+x^2]^{1/2} \quad (38)$$

Furthermore, $\rho\_dif(x,y)$ is obtained from equations (32)–(35).

By substituting the coordinates (x,y) that calculate the phase, the focal length fsub of the partial optical elements, the focal length fL of the relay lens, and the centroid (x_FEA, y_FEA) of the partial illumination areas into equations (32)–(38), the phase ρtot(x,y) of the partial optical elements to illuminate a desired partial illumination area can be calculated. Here, the phase distribution when the surface shape of the final partial optical element is determined uses ρtot' (x,y), that converts the above-mentioned ρtot (x,y) to a phase distribution that considers ρtot=0 and λ·m (m is a positive integer) the same. Furthermore, the phase distribution ρtot' (x,y) is further quantized and this can be fabricated as a binary optical element.

Furthermore, the surface shape h (x,y) of the final partial optical elements is given by ρtot' (x,y) as shown in the following equation (39).

$$h(x,y) = -\rho tot'(x,y)/(n-1) \qquad (39)$$

Here, n is the substrate index of refraction of the partial optical elements. Furthermore, the atmosphere in the vicinity of the disk is filled with air, and the index of refraction is 1. The procedure explained above is a detail of the method of designing the partial optical elements.

Furthermore, the procedure by which the focal length fsub of the partial optical elements and the focal length fL of the relay lens are determined is the same as the procedure explained based on the above-mentioned equations (2) and (3) with reference to FIGS. 12A and 12B.

The following explains an arrangement of the partial optical elements. For example, a method of arranging the partial optical elements corresponding to the 68 partial illumination areas shown in FIG. 6 is considered. First, according to the irradiation relationship between the partial illumination areas in FIG. 30 and the light input to the partial optical elements, it is understood that the partial optical elements and the partial illumination areas are correspondingly-shaped. As for the case shown in FIG. 6, one partial optical element is square. Therefore, the basic optical element is formed by arranging 68 square elements in desired areas. This example is explained based on FIGS. 34A and 34B. FIG. 34A shows a case that gathers 68 partial illumination areas on the fly eye integrator 6 into 20 groups G1–G20. Here, as clarified from the above explanation, the partial optical elements are also gathered as groups G1–G20 in a corresponding shape. FIG. 34B is an example in which groups G1–G20 of the partial optical elements are arranged in a condensed state to illuminate groups G1–G20 of the partial illumination areas. Furthermore, the groups together become the basic optical element 51. Here, the arrangement of the partial illumination areas within the respective groups of FIG. 34A and the corresponding arrangement of the partial optical elements of FIG. 34B within the respective groups are arranged rotated by 180°.

In the basic optical element 51, group G1, for example, is formed of three partial optical elements 50. This corresponds to a structure in which group G1 of the corresponding partial illumination area is formed by three partial illumination areas. In the same manner, the basic optical element 51 is formed by 34 columns×2 rows of partial optical elements with respect to the X and Y directions. Each partial optical element 50 of FIG. 34B illuminates a partial illumination area of FIG. 34A 1:1 in a case in which a beam is input that is the same shape as the basic optical element 51. That is, only the ring part that is shown in a thick line in FIG. 34A is illuminated, and other unnecessary parts are not illuminated. Thus, the basic optical element 51 can perform desired ring illumination without losing any light amount.

Furthermore, it is preferable that a plurality of basic optical elements 51 are arranged in the Y direction in this embodiment, and this is the same as in the explanation with reference to FIG. 9. In FIG. 9, 17 basic optical elements 51 are repeatedly arranged in the Y direction. This becomes the diffractive optical element 21. The input light can be made more homogenous by this arrangement. As mentioned above, the basic optical element 51 is formed of 34×2 partial optical elements, so the diffractive optical element 21 is formed by 34×34 partial optical elements.

Based on the procedure explained above, a method of arranging the partial optical elements within the diffractive optical element 21 is determined. This effective diameter of the diffractive optical element 21 corresponds to φDOE. Therefore, the effective diameter of the partial optical elements can be obtained by equation (1) from φDOE and k, which represents the number of partial optical elements.

Furthermore, it was explained that φDOE and k are symmetrical to the X and Y directions, but in the case of non-symmetry, equation (1) can be calculated in the respective directions.

Next, the effective diameter φ2nd of the second light source that is generated at the output surface can be obtained for the case of the diffractive optical element of FIG. 9. This effective diameter is preferably calculated by adding shift Δ of the focal position in the deflection principle explained with reference to FIG. 30. As shown in FIG. 30, all the light spots that are generated at the back of the partial optical elements are shifted in various directions by deflection, so that the area including all the light spots that are generated at the output surface of the diffractive optical element 21 is the effective diameter φ2nd of the second light source.

Figure 35:
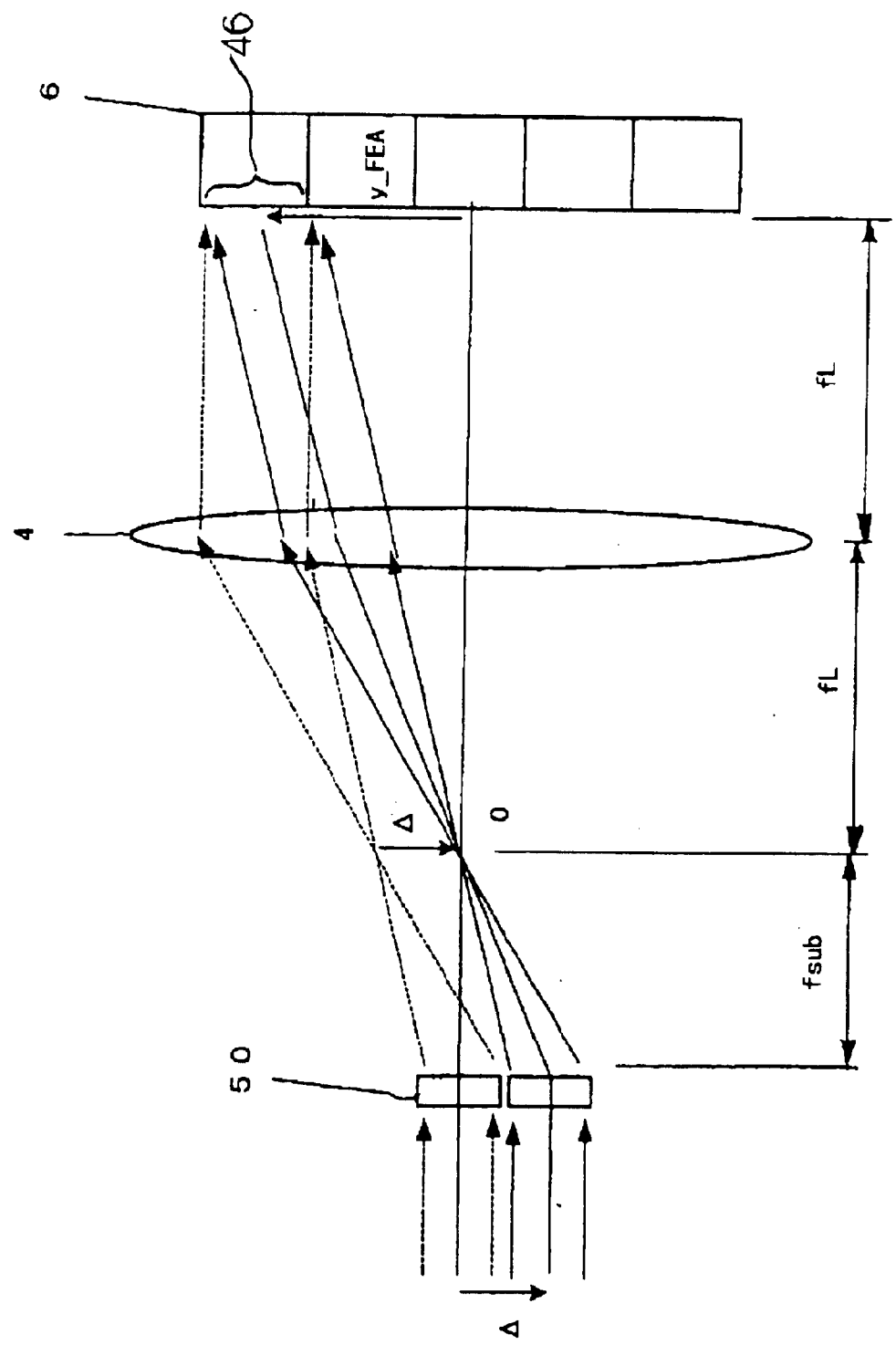
FIG. 35 is a diagram explaining a principle in which the partial optical elements of the fourth embodiment illuminate a fly eye integrator.

The shift amount of the light spots for the respective partial optical elements can be obtained in proportion to the centroid position of the partial illumination areas. FIG. 35 shows a case in which a partial illumination area 46, of which the centroid is y_FEA in the coordinate of the fly eye integrator surface, is illuminated by a partial optical element 50. The optical path shown by dashed lines in FIG. 35 is based on the design principles explained in FIG. 30. Furthermore, the optical path shown in a solid line is the case in which the partial optical elements 50 are shifted so that the light spot is matched on the optical axis by being moved the spot shift amount Δ that has been generated by deflection. Even if the partial optical element is shifted, the angle of the light beam does not change, so that even in the case of the arrangement shown by a solid line, the same partial illumination area can be illuminated as in the case of the optical path shown by dashed lines.

Here, the centroid position of the partial illumination area and the spot shift amount Δ have the relationship of the following equation (40) in the case of the chief ray of the solid line optical path.

$$\Delta = fsub/fL \cdot \text{y\_FEA} \qquad (40)$$
$$= \phi sub/\rho sub \cdot \text{y\_FEA}$$

In the above equation, if φsub/ρsub is constant, the spot shift amount Δ is determined by the centroid position y_FEA of the partial illumination area. By expanding the above principle to a two-dimensional X-Y direction, a two-dimensional spot shift amount can be estimated.

Arrows in FIGS. 34A and 34B estimate a two-dimensional spot shift amount according to this principle. That is, each arrow of FIG. 34A refers to the centroid on which the optical axis of each partial illumination area is based, so the centroid coordinate is substituted into an equation in which equation (40) is two-dimensionally expanded, and the two-dimensional spot shift amount can be calculated.

For example, the light beam from the center of the partial optical element A within group G1 shown in FIG. 34B is output as shown in the figure, and after the spot shift is generated, this reaches the center of the partial illumination area A' on the fly eye integrator of FIG. 34A. In this case, if the centroid of the partial illumination area A' is shown in units of ρsub, (x_FEA, y_FEA)=(−4.5 ρsub, 0.5 ρsub).

Therefore, the spot shift concerning the partial optical element A is (Δx, Δy)=(−4.5φsub, 0.5φsub)

according to an equation that two-dimensionally expands equation (40).

In the same manner, if the spot shift amount is estimated with respect the partial optical elements of the left end of group G5 and the left end of group G15 of FIG. 34B, the following equations are respectively established.

(Δx, Δy)=(−0.5φsub, 4.5φsub)

(Δx, Δy)=(−0.5φsub, −4.5φsub)

Furthermore, if the spot shift amount of all the partial optical elements is considered, ultimately, it is clear that the light beams from eight partial optical elements among the partial optical elements shown in FIGS. 34A and 34B determine the outer-most circumference of the spot. Thus, the X-Y effective diameter of the second light source that is generated at the output of the basic optical element 51 is 24φsub×8φsub. The effective diameter in the X and Y directions of the second light source that is generated at the output of the diffractive optical element 21 is 24φsub×40φsub according to the outer-most circumference of the collected group of light spots when a plurality of the basic optical elements 51 are arrayed as shown in FIG. 9.

Here, when an X-Y symmetrical system is considered as the image magnifying system of FIGS. 12A and 12B, φ2nd needs to be 40φsub so that the light beam is not shaded. Thus, the effective diameter φ2nd of the second light source cannot be simply equal to φDOE (=34φsub).

According to the procedure explained above, the number of alignments of the partial optical elements is determined, so φsub is determined by equation (1). Furthermore, because φ2nd is determined, fL is determined by equation (2). By substituting fL and ρsub that were thus obtained into equation (3), fsub can be determined.

Furthermore, by substituting fL and the centroid coordinates of the partial illumination areas that were thus obtained into equations (32)–(35), the deflected phase component ρ_dif (x,y) is determined. Furthermore, by substituting fsub into equation (37), the phase components ρ(x,y) of a rotationally symmetrical lens can be determined, and by substituting this into equation (36), the phase distribution ρtot of the respective partial optical elements can be determined.

Furthermore, in the above-mentioned explanation, FIGS. 12A and 12B and equations (1)–(3) are explained with respect to one direction only, but these can also be applied to a case in which the X direction and the Y direction are non-symmetrical. In this case, it is preferable that the X and Y directions are considered based on the relationship equations in the same manner as described above.

The following is a specific numerical value example. The specific numerical value example of this embodiment is the same as the numerical value example of the first embodiment. The diffractive optical element 21 is formed by 34×34 partial optical elements as shown in FIG. 34B and FIG. 9. Additionally, considering the entire length of the optical system, the limit of the exposure area, and the like, values that are the same as in the above-mentioned equation (13) are used.

$$\phi DOE=40 \text{ mm } \phi FE=4 \text{ mm } fFE=20 \text{ mm} \tag{13}$$

Furthermore, ρsub=φFE, φ3rd=φFE. First, by substituting φDOE and k=34 into equation (1), the effective diameter φsub of the partial optical elements 50 is obtained.

$$\phi sub=\phi DOE/k=1.176 \text{ mm} \tag{14}$$

Because φsub is determined, the effective diameter φ2nd of the second light source is determined. In the case of the arrangement of FIG. 34B and FIG. 9, as already considered, $$\phi 2nd=40\phi sub=47.059 \text{ mm} \tag{15}$$

Next, by substituting the above-obtained value into the right side of equation (2), fL is obtained.

$$fL = \phi 2nd / \phi 3rd \cdot fFe \tag{16}$$
$$= 235.294 \text{ mm}$$

Furthermore, fsub can be obtained by equation (3).

$$fsub = fL \cdot \phi sub / \rho sub \tag{17}$$
$$= 69.204 \text{ mm}$$

Furthermore, by substituting the centroid coordinate (x_FEA, y_FEA) of a desired partial illumination area, the wavelength λ, and the substrate index of refraction n of the diffractive optical element into equations (32)–(39), the surface shape h (x,y) of the partial optical elements 50 for illuminating the partial illumination areas can be determined.

By performing the above procedure for all of the partial illumination areas, the surface shape of all of the corresponding partial optical elements can be determined. Arrangement of a plurality of partial optical elements 50 that were thus determined as shown in FIG. 34B is the pattern of the basic optical element 51. Furthermore, arrangement of the basic optical elements 51 as shown in FIG. 9 is a pattern of the entire diffractive optical element 21. According to this pattern, by EB writing a pattern on a mask, transferring this pattern to a glass substrate coated by a resist, and etching the pattern, the diffractive optical element 21 can be fabricated.

Furthermore, the integration effect, the spatial coherence, and aberration correction in this embodiment are the same as in the first embodiment, so that explanation is omitted.

Fifth Embodiment

This embodiment performs an ordinary round illumination by a diffractive optical element. In FIG. 1, the revolver 3 is rotated by the motor MT1, the diffractive optical element related to this embodiment is inserted into the optical path, the revolver 7 is rotated by the motor MT2, and the aperture diaphragm 35 is selected. The basic setting is the same as in the second embodiment. A characteristic of this embodiment is a design procedure that will be discussed below. In the second embodiment, the design was implemented by using a virtual lens, but in this embodiment, a design is implemented in which the basic illumination area is divided into partial illumination areas, and the partial illumination areas are grouped.

Figures 36A, 36B:
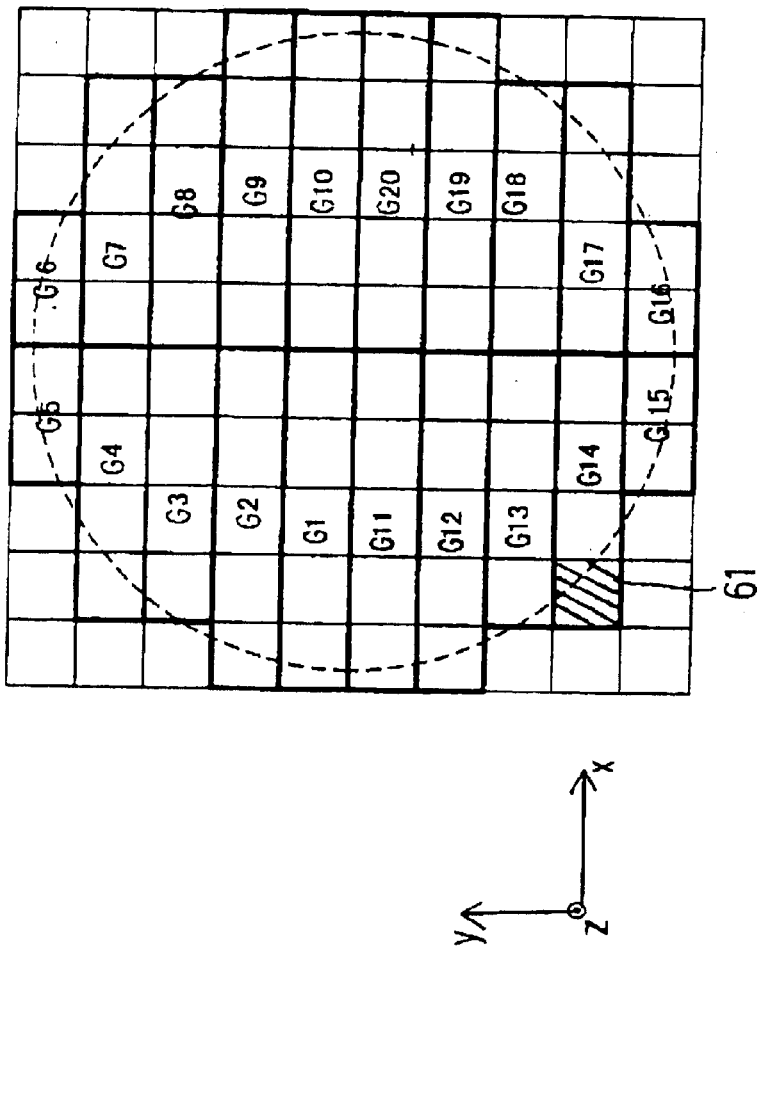
FIGS. 36A and 36B are diagrams showing the division of a basic illumination area of a fifth embodiment of this invention, and a condensed alignment of the corresponding partial elements, respectively.

FIG. 36A is a diagram showing that the basic illumination area 60 is divided into partial illumination areas 61, and the partial illumination areas are grouped into groups G1–G20. In this embodiment as well, the partial illumination areas 61 are matched with the element lens input surfaces of the fly eye integrator. Additionally, as explained in the second embodiment, groups G1–G20 of the partial illumination areas and groups G1–G20 of the partial optical elements are correspondingly shaped.

Furthermore, as shown in FIG. 36B, arrangement of 10 columns×2 rows of groups G1–G20 of the partial optical elements 62 for illuminating groups G1–G20 of the partial illumination areas 61 yields a new basic optical element 63. Here, arrangement of the partial optical elements within the respective groups G1–G20 of FIG. 36B is in a 180° rotated relationship with respect to the arrangement of the partial illumination areas corresponding to the respective groups G1–G20 of the partial illumination areas of FIG. 36A. Finally, by repeatedly arranging 20 basic optical elements 63 in the Y direction, a new square-shaped diffractive optical element is formed with 40×40 partial optical elements.

The following shows a specific numerical value example. The specific numerical value example of this embodiment is the same as the numerical value example of the second embodiment. A state of this embodiment is a state in which the revolver is rotated in the second embodiment, so $\phi$DOE, $\phi$FE, and fFE are the same values as in the second embodiment. Additionally, $\rho$sub=$\phi$FE, and $\phi$3rd=$\phi$FE.

First, by substituting $\phi$DOE and k=40 into equation (1), the effective diameter $\phi$sub of the partial optical elements 62 can be obtained.

$$\phi\text{sub}=\phi\text{DOE}/k=1.000 \text{ mm} \quad (18)$$

Because $\phi$sub is determined, the effective diameter $\phi$2nd of the second light source is determined. In the same manner as in the case of the first embodiment, $\phi$2nd can obtain the following result with respect to the case of the arrangement of the partial optical elements.

$$\phi\text{2nd}=46\phi\text{sub}=46.000 \text{ mm} \quad (19)$$

Next, by substituting the above-obtained value into the right side of equation (2), fL can be obtained.

$$fL = \phi\text{2nd}/\phi\text{3rd} \cdot fFE \quad (20)$$
$$= 230.000 \text{ mm}$$

According to equation (3), fsub can be obtained.

$$f\text{sub} = fL \cdot \phi\text{sub}/\rho\text{sub} \quad (21)$$
$$= 57.500 \text{ mm}$$

By substituting the numerical value calculated as described above, the centroid coordinates (x_FEA, y_EFA) of a desired partial illumination area, the wavelength λ, and the substrate index of refraction n of the diffractive optical element into equations (32)–(39), the surface shape h(x, y) of the partial optical elements 62 for illuminating the partial illumination area can be determined.

As the above-mentioned procedure is performed for all the partial illumination areas, the surface shape of all of the corresponding partial optical elements can be determined. Arrangement of a plurality of partial optical elements that have been thus determined as shown in FIG. 36B yields the pattern of the basic optical element 63. Furthermore, arrangement of 20 basic optical elements 63 in the Y direction is the entire pattern of the diffractive optical element 22. According to this pattern, by EB writing a pattern on a mask, transferring this pattern to a glass substrate coated by a resist, and etching the pattern, the diffractive optical element 22 can be fabricated.

Additionally, in the same manner as in the second embodiment, when the illumination method is changed, the effective diameter $\phi$2nd of the second light source surface changes, so that the focal length fL of the relay lens changes when the filling factor is maintained at a constant value. Therefore, it is preferable that the relay lens is structured to have a variable focal length. For example, in the fifth embodiment, by moving a lens element(s) that structures the relay lens in the optical axis direction or inserting or removing a lens element with a different focal length into/from the relay lens (including the case of replacing a lens, in addition to the case of simply inserting or removing a lens), the focal length fL is changed by making the arrangement different from that in the fourth embodiment.

Additionally, for similar reasons, the focal length fsub of the partial optical elements in the fifth embodiment is different from the focal length in the fourth embodiment. Therefore, it is preferable that the diffractive optical elements are arranged in the revolver upon considering the difference of the focal length. For example, when the focal plane of the relay lens is made constant in the fourth and fifth embodiments and only the focal length changes, it is necessary to shift the Z direction position of the diffractive optical element by the shift amount of the focal length fsub of the partial optical elements. Specifically, the focal length fsub of the partial optical elements in the fifth embodiment is 11.704 mm shorter than the focal length fsub of the partial optical elements in the fourth embodiment. Therefore, it is preferable that the diffractive optical element of the fifth embodiment is arranged at a position that is shifted 11.704 mm farther toward the fly eye integrator than the diffractive optical element 21 of the fourth embodiment.

Here, a structure is possible in which the focal plane and focal length of the relay lens are simultaneously changed. Additionally, the focal plane position of the relay lens can be set so as to absorb the shift amount of the focal length fsub of the partial optical element between the fourth and fifth embodiments. In this case, the Z direction position of the diffractive optical element 22 and the diffractive optical element 21 can be the same in this embodiment. Furthermore, when the filling factor is not made constant, the focal length fL of the relay lens can be made constant within a range in which the light beam is not shaded.

Furthermore, with respect to aberration correction of the illumination system, the same procedure as in the second embodiment can be performed. Additionally, when the filling factor is set within an area in which the light beam is not shaded and aberration is not corrected, even if the illumination method is changed, the focal lengths fL and fsub can be made constant. In this case, the position at which the diffractive optical element is arranged can be fixed.

Furthermore, the integration effect and the spatial coherence are the same as in the second embodiment, so that explanation is omitted here.

Sixth Embodiment

This invention is applied to a scanning exposure apparatus in the sixth embodiment. The basic setting is the same as in the third embodiment. A characteristic of this embodiment is a design procedure that will be discussed hereafter. In the third embodiment, the design was performed by using a virtual lens, but in this embodiment, the design is performed as a basic illumination area is divided into partial illumination areas, and the partial illumination areas are grouped. The structure of the scanning exposure apparatus and the ring illumination of the diffractive optical element are the same as in the third embodiment, so redundant explanation is omitted here.

FIG. 37A is a diagram showing a basic illumination area 70 divided into partial illumination areas 71 and grouped into groups G1–G26. In this embodiment as well, the partial illumination areas 71 match the element lens input surfaces of the fly eye integrator. Furthermore, as explained in the first embodiment, groups G1–G26 of the partial illumination areas 71 and groups G1–G26 of the partial optical elements 72 are correspondingly shaped.

Next, as shown in FIG. 37B, based on the above-mentioned procedure, groups G1–G26 of the partial optical elements 72 for illuminating groups G1–G26 of the partial optical illumination areas 71 are arranged in 34 columns×2 rows in a condensed state. These become a new basic optical element 73. Here, arrangement of the partial optical elements within the respective groups G1–G26 of FIG. 37B is in a 180° rotated relationship with respect to the arrangement of the corresponding partial illumination areas within groups G1–G26 of the partial illumination areas of FIG. 37A. Furthermore, by repeatedly arranging 17 new basic optical elements 73 in the Y direction, the diffractive optical element is structured. The number of partial optical elements is 34×34 in the X-Y direction.

FIG. 23 is an overall diagram of a diffractive optical element of this sixth embodiment. In this figure, the diffractive optical element is formed by 17 basic optical elements 73 arranged in the Y direction. The number of partial optical elements with respect to the X-Y direction is 34×34. Additionally, the partial optical elements 72 are rectangular in correspondence to the shape of the fly eye element lenses, so the entire effective diameter is also rectangular. Therefore, it is preferable that the beam input to the diffractive optical element is adjusted to substantially the same rectangular shape.

The following shows a specific numerical value example. A specific numerical value example of this embodiment is the same as the numerical value example of the third embodiment. First, a case is considered in which arrangement of the diffractive optical element is shown in FIG. 37B and FIG. 26, and the diffractive optical element is formed by 34×34 partial optical elements. Furthermore, it is assumed here that the following values are set according to the entire length of the optical system and the limits of the exposure area.

$$\phi DOE\_x = 40 \text{ mm} \tag{22}$$

$$\phi DOE\_x = 20 \text{ mm}$$

$$\phi FE\_x = 8 \text{ mm}$$

$$\phi FE\_y = 4 \text{ mm}$$

$$fFE = 20 \text{ mm}$$

and, $$\rho \text{sub}\_x = \phi FE\_x.$$

$$\rho \text{sub}\_y = \phi FE\_y,$$

-continued $$\phi 3\text{rd}\_x = \phi FE\_y,$$

$$\phi 3\text{rd}\_y = \phi FE\_y.$$

First, by substituting φDOB_x, φDOF_y and k=34 into equation (1), the effective diameter φsub_x and φsub_y of the partial optical elements 72 is obtained.

$$\phi \text{sub}\_x = \phi DOE\_x / k\_x \tag{23}$$

$$= 40 \text{ mm} / 34$$

$$= 1.176 \text{ mm}$$

$$\phi \text{sub}\_y = \phi DOE\_y / k\_y$$

$$= 20 \text{ mm} / 34$$

$$= 0.588 \text{ mm}$$

Here, because φsub is determined, the effective diameters φ2nd_x and φ2nd_y of the second light source are determined. In the same manner as in the fourth embodiment, φ2nd can be considered with respect to arrangement of the above-mentioned partial optical elements.

$$\phi 2\text{nd}\_x = 26 \cdot \phi \text{sub}\_x \tag{24}$$

$$= 30.588 \text{ mm}$$

$$\phi 2\text{nd}\_y = 44 \cdot \phi \text{sub}\_y$$

$$= 25.882 \text{ mm}$$

Thus, φ2nd_x is larger than φ2nd_y, but if it is considered that the X Y effective diameter ratio of the fly eye element lens is 2:1, and the relay lens arranged in front of the fly eye element lens is a rotationally symmetrical lens, it is understood that fL needs to be determined by the value of the Y direction so that the light beam is not shaded at the third light source. Therefore, by substituting φ2nd_y, φ3rd_y, and fFF into the right side of equation (2), fL is obtained.

$$fL = \phi 2\text{nd}\_y / \phi 3\text{rd}\_y \cdot fFF \tag{25}$$

$$= 129.412 \text{ mm}$$

Furthermore, fsub is obtained by equation (3).

$$fsub = fL \cdot \phi \text{sub}\_y / \rho \text{sub}\_y \tag{26}$$

$$= 19.031 \text{ mm}$$

Furthermore, by substituting the numerical values calculated as described above, the center coordinate (x_FEA, y_FEA) of a desired partial illumination area, the wavelength λ and the substrate index of refraction n of the diffractive optical element into equations (32)–(39), the surface shape h(x, y) of the partial optical elements 72 for illuminating the partial illumination areas can be determined.

By performing this procedure for all of the partial illumination areas, the surface shape of all of the corresponding partial optical elements can be determined. Arrangement of a plurality of partial optical elements 72 that have been thus determined as shown in FIG. 37B yields the pattern of the basic optical element 73. Furthermore, as shown in FIG. 26, repeated arrangement of 17 basic optical elements 73 in the Y direction yields the pattern of the entire diffractive optical element. According to this pattern, by EB writing a pattern on a mask, transferring this pattern to the glass substrate coated by a resist, and etching the pattern, the diffractive optical element can be fabricated.

Furthermore, the integration effect and the spatial coherence in this embodiment are the same as in the third embodiment, so that explanation is omitted.

Additionally, in the third through sixth embodiments, for example, a one-dimensional grating having a deflection component and a lens component in one plane of the substrate was explained as the diffractive optical element, but this invention is not limited to this construction. The following representative modified examples (A)–(E) can be implemented. Furthermore, a diffractive optical element is called a DOE and a microlens array is called an MLA.

(A) An MLA that functions the same as the partial optical elements of the third through the sixth embodiments is formed on one surface of a substrate;
(B) A DOE is formed on the light source side surface of a substrate, and a DOE is formed on the other side;
(C) An MLA is formed on the light source side surface of the substrate, and a DOE is formed on the other side;
(D) A DOE is formed on the light source side surface of the substrate, and an MLA is formed on the other side; and
(E) An MLA is formed on the light source side surface of the substrate, and an MLA is formed on the other side.

Furthermore, with respect to the examples of (B)–(E), it is preferable that the DOE or MLA formed on the light source side surface is formed by a lens component and that the DOE or MLA formed on the other side is formed by a deflection component. Additionally, as another modified example, there is a possibility that an MLA that functions the same as the partial optical elements of the first through third embodiments is formed on one surface of the substrate.

The diffractive optical element in the case of the ring illumination was explained above, but even in the case of illumination with other than ring illumination, the diffractive optical element can be structured by the same procedure as described above. However, if the illumination state is changed, there is a case that the focal length fL of the relay lens and the focal lengths fsub of the partial optical elements change, as shown in the first and second embodiments. Therefore, it is preferable that the relay lens has a variable focal length. Furthermore, it is preferable that the respective diffractive optical elements are set at a Z direction (optical axis direction) position within a revolver according to the focal length of the partial optical elements and the focal plane position of the relay lens.

The following explains the seven through eleventh embodiments with respect to an optical homogenizer.

Seventh Embodiment

Figure 39:
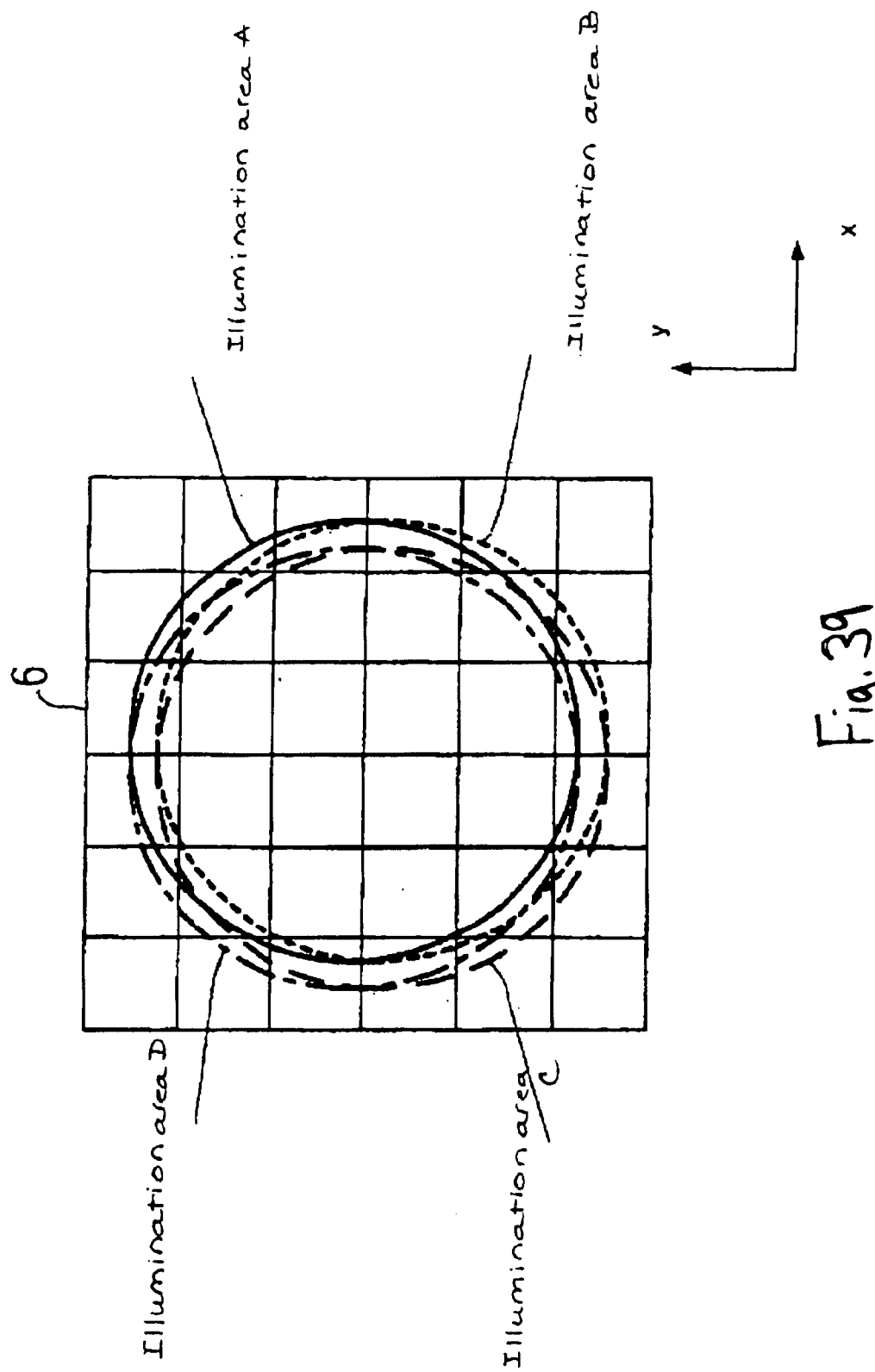
FIG. 39 is a principle diagram (within an X-Y plane) of the seventh embodiment of this invention.

As shown in FIG. 3, an optical homogenizer can be formed by arranging the basic optical elements 40 in columns and rows. In the seventh embodiment, non-homogeneousness of illumination that is generated by various noise patterns is decreased by modifying the basic optical elements 40. FIG. 38 is a principle diagram of the seventh embodiment. In FIG. 38, light beams from the basic elements A and B superimposingly illuminate the fly eye integrator 6. In the same figure, the intensity distribution by the basic element A is shown by solid lines, and the intensity distribution by the basic element B is shown by dashed lines. The respective intensity distributions include noise patterns affected by diffraction or the like as shown in the figures. Therefore, as shown in FIG. 38, the basic elements A and B are pre-designed so that the positions of the illumination areas formed on the fly eye integrator 6 by the basic elements A and B are slightly shifted. At that time, homogeneousness of the composite intensity distribution by the basic elements A and B can be improved as the shift amount fills in the convex and concave parts of the noise pattern. Here, FIG. 38 is an explanation in the case of a one-dimensional noise pattern. When a noise pattern is two-dimensionally generated, it is preferable that a plurality of illumination areas A–D are two-dimensionally shifted and arranged in the X and Y directions as shown in FIG. 39.

Here, calculation of the shift amount can be performed by simulating the intensity distribution of the basic element A in a wave operational optical manner and obtaining the intensity pattern on the fly eye integrator. Furthermore, Fresnel diffraction intensity distribution of an edge that is conventionally performed can be used for a simplified estimate. Additionally, if testing is actually performed, noise patterns due to fabricating errors can be overlapped, so it is preferable that the position of the illumination area of the basic elements is redesigned so as to measure the intensity distribution and cancel any noise pattern. For example, it is preferable that two kinds of basic elements are included that are designed so that the illumination area shifts by ½ the width of the partial illumination area generated by the partial elements that constitute the basic element.

A typical value of the shift amount of the illumination area is several 10 $\mu$m through several 100 $\mu$m or more, but it is possible to control the position of the illumination area with sufficient accuracy in the case of an optical homogenizer that is fabricated by etching a plurality of basic elements on a glass substrate as in this embodiment of the invention. Additionally, in the above explanation, the case of a so-called conventional illumination is explained, but in the case of a modified illumination such as ring illumination or a quadru-pole illumination, it is preferable that two kinds of basic elements are designed so that the illumination area shifts by ½ the width of the partial illumination area generated by the partial elements that constitute the basic element.

Eighth Embodiment

Figure 40:
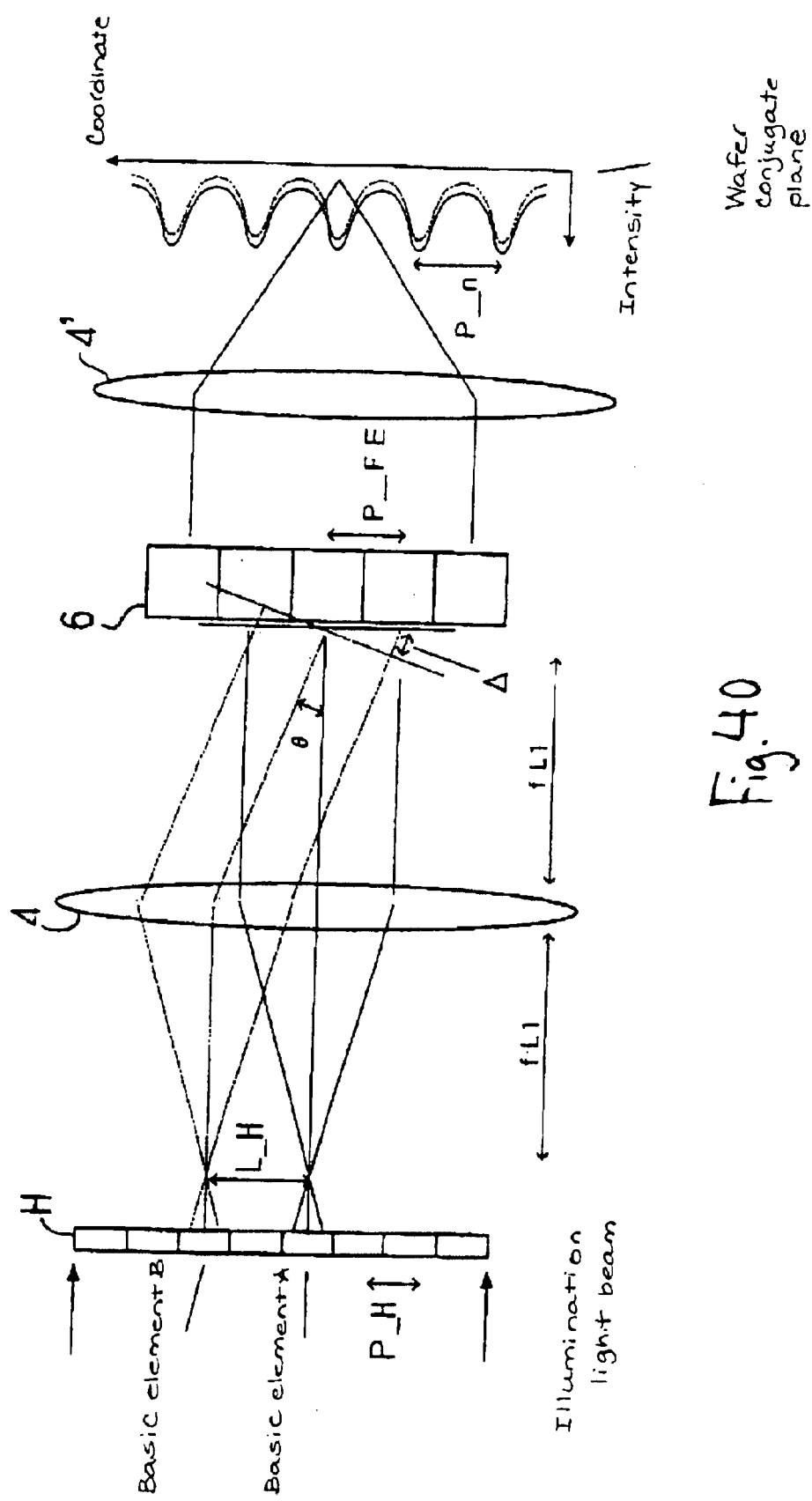
FIG. 40 is a diagram explaining a principle of an eighth embodiment of this invention.

As shown in FIG. 3, the optical homogenizer is formed by arranging basic elements 40 in columns and rows. In the eighth embodiment, non-homogeneousness of illumination that is generated by interference noise is decreased by modifying this arranging method. FIG. 40 shows a relationship of the arrangement of the optical homogenizer and the interference noise superposition. In the same figure, regarding interference noise, when the fly eye integrator 6 is illuminated with a light beam that contains interference, the wavefront of the light beam is divided and regenerated when it is recomposed at the wafer conjugate plane surface. The pitch P_n of the interference noise is given as follows, with the pitch of the fly eye integrator being P_FE, the focal length of the relay lens 4' being fL2, and the wavelength use being $\lambda$.

$$P\_n = \lambda \cdot fL2 / P\_FE \qquad (27)$$

In FIG. 40, the interference noise from the light beam from the basic element A is shown by solid lines (interference noise A), and the interference noise by the basic element B is shown by dashed lines (interference noise B). Interference noises A and B are superimposed and intensify each other as shown in FIG. 40 when the phase difference $\Delta$ due to the illumination optical inclination on the fly eye integrator is equal to n·$\lambda$ (n is an integer).

Here, the phase difference Δ is given as follows when the inclination angle of the light beam of the basic elements A and B is θ.

$$\Delta = P\_FE \cdot \sin\theta \quad (28)$$

The resonant condition of the interference noise is as follows.

$$\Delta = n \cdot \lambda \quad (n \text{ is an integer}) \quad (29)$$

Here, it is seen that the inclination angle θ is determined by the focal length fL1 of the relay lens 4 and the distance L\_H between the basic elements A and B. As one example, the following concerns the case of a relay lens 4 that is an f·sin θ type lens. In this case, sin θ can be given by the following equation (30).

$$\sin\theta = L\_H/fL1 \quad (30)$$

If Δ/λ is calculated according to equations (28) and (30), the following equation (31) can be established.

$$\Delta/\lambda = L\_H \cdot P\_PE/(fL1 \cdot \lambda) \quad (31)$$
$$= L\_H/P\_FT$$

Furthermore, equation (31) was established by using P\_FT=fL1·λ/P\_FE. P\_FT corresponds to a pitch of a pattern in which a periodic pattern of the fly eye integrator has been optically Fourier transformed by a relay lens 4. According to equation (29), when the right side of equation (31) is an integer, it is clear that the interference noises intensify each other. However, by skillfully selecting L\_H, it is possible to decrease the interference noise. The distance L\_H between the basic elements is measured from an outer-most element (m=1) of the optical homogenizer. The distance L\_H of the outer-most basic element and an $m^{th}$ basic element can be given by the following equation (32).

$$L\_H = (m-1) \cdot P\_H \, (m=1, 2, \ldots m\_\max) \quad (32)$$

Here, P\_H is a basic element pitch of the optical homogenizer in a direction which we consider, and m\_max is the number of the basic elements that are located in this direction. Furthermore, P\_H can be generally given by the following equation (33) according to an arbitrary integer k and an arbitrary number φ.

$$P\_H = k \cdot P\_FT + \phi \quad (33)$$

By substituting equations (32) and (33) into equation (31), the following equation (34) can be obtained.

$$\Delta/\lambda = (m-1) \cdot k + (m-1) \cdot (\phi/P\_FT) \quad (34)$$

Because the first part, (m−1)·k, is always an integer in equation (34), this can be ignored when the phase difference is considered. In short, only the second part of equation (34) needs to be considered. By looking at this part, in order to efficiently decrease the interference noise, it can be seen that $$\phi/P\_FT = 1/m\_\max \quad (35)$$

is appropriate. By substituting this into equation (34) and ignoring the first part of the equation, the following equation (36) can be obtained.

$$\Delta/\lambda = (m-1)/m\_\max \quad (36)$$

Figure 41:
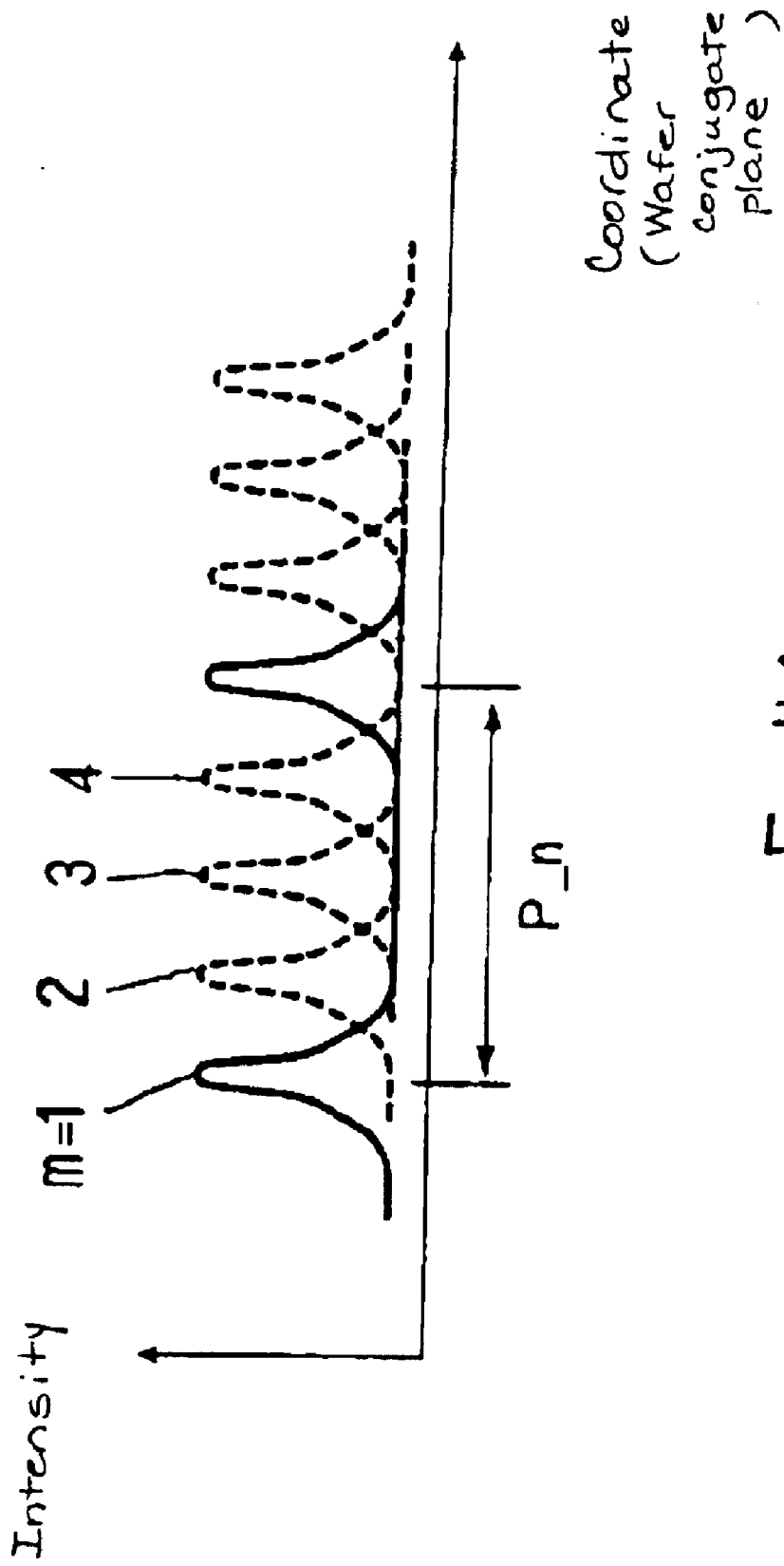
FIG. 41 is a diagram showing a principle of decreasing interference noise in the eighth embodiment of this invention.

As an example, when the number of basic elements m\_max is 4, $$\Delta/\lambda = 0, 1/4, 2/4, 3/4 \quad (37)$$

can be established. In this case, the phase of the interference noise by 4 basic elements is gradually shifted, and the basic cycle P\_n can be filled at equal intervals. This is shown in FIG. 41.

A numerical value example is shown in which φ is actually determined according to equation (35), and P\_H is obtained according to equation (33). First, as basic parameters, $$P\_FE=2 \text{ mm, } fL1=200 \text{ mm, and } \lambda=0.248 \, \mu m \quad (38)$$

Next, P\_FT is obtained.

$$P\_FT = fL1 \cdot \lambda / P\_FE \quad (39)$$
$$= 24.8 \, \mu m$$

The case is considered in which there are 20 basic elements m\_max. By substituting this and equation (39) into equation (35), φ is obtained.

$$\phi = P\_FT/m\_\max \quad (40)$$
$$= 1.24 \, \mu m$$

By substituting equations (39) and (40) into equation (33), the following equation (41) can be obtained.

$$P\_H = k \cdot 24.8 \, \mu m + 1.24 \, \mu m \quad (41)$$

By selecting an appropriate numerical value 40 as k, $$P\_H = 993.24 \, \mu m \quad (42)$$

can be established. The above-mentioned description is a typical value, but in the case of an optical homogenizer that is fabricated by etching a plurality of basic elements on a glass substrate as in this embodiment of the invention, the pitch P\_H can be controlled with sufficient accuracy, and the above-mentioned method can be implemented. By fabricating an optical homogenizer with this type of pitch, the effect of the interference noise can be effectively decreased. In the case of a first fly eye integrator like in the prior art, the phase difference was determined by the outer diameter difference of the element lens (approximately 10 μm), and this type of regular phase control was not possible. That is, the deterioration of the interference noise was determined by a random rule, and the effectiveness was poor.

Furthermore, when the spatial coherence of the illumination light beam incident to the optical homogenizer is considered, it is preferable that k is set so that the basic element pitch P\_H is larger than the spatial coherence distance. Furthermore, it is also possible to consider any direction of pitch of the fly eye integrator or the interference noise pattern regardless of the arrangement of FIG. 40. In this case, the above-mentioned calculation can be used with respect to a cross section of the direction. Therefore, this can correspond to a case of an arbitrary internal arrangement of the fly eye integrator. Additionally, this can also be implemented when a microlens array or rod integrator is used instead of using a fly eye integrator.

Ninth Embodiment

Figure 42:
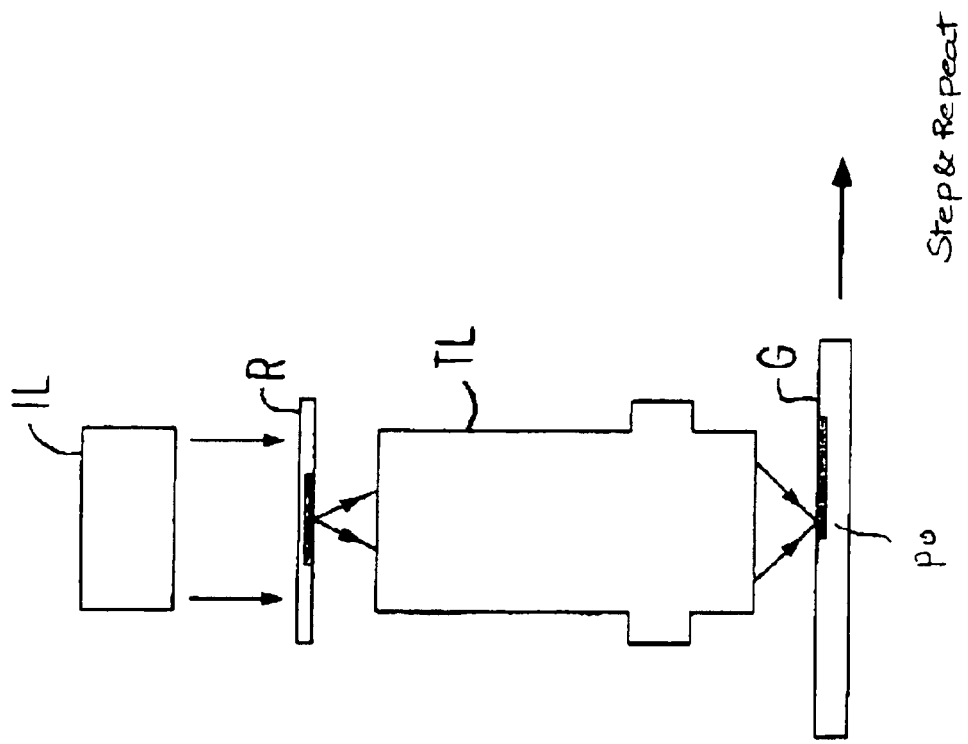
FIG. 42 is a conceptual diagram of a ninth embodiment of this invention.

The ninth embodiment relates to a basic method of fabricating an optical homogenizer by etching. FIG. 42 shows a principle of fabricating an optical homogenizer. In FIG. 42, a reticle R is set in which a basic element pattern (one or a plurality of patterns) of an optical homogenizer is written, irradiation is performed by a desired illumination light from an illumination optical system IL, the basic element pattern is reduction exposed on a glass substrate G coated by a photoresist via a projection lens TL, and the latent image of the basic element(s) is generated in an array state as this exposure operation is repeated as the position of the glass substrate G is shifted. Then, by developing and etching the latent image, an optical homogenizer with high accuracy can be fabricated. Here, a conventional stepper method or a scanning stepper method can also be used as a reduction projection exposure apparatus. UV, DUV, and EUV can be used for the exposure wavelength.

Figure 43B:
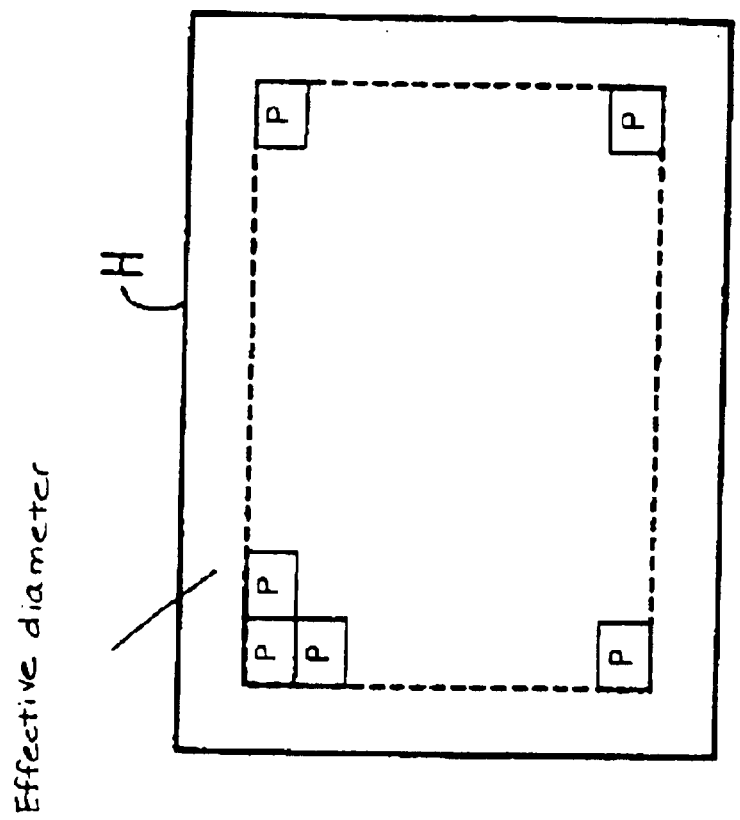
FIGS. 43A and 43B are diagrams showing a reticle in the ninth embodiment of this invention, and a patterning rule of an optical homogenizer using the reticle.
Figure 43A:
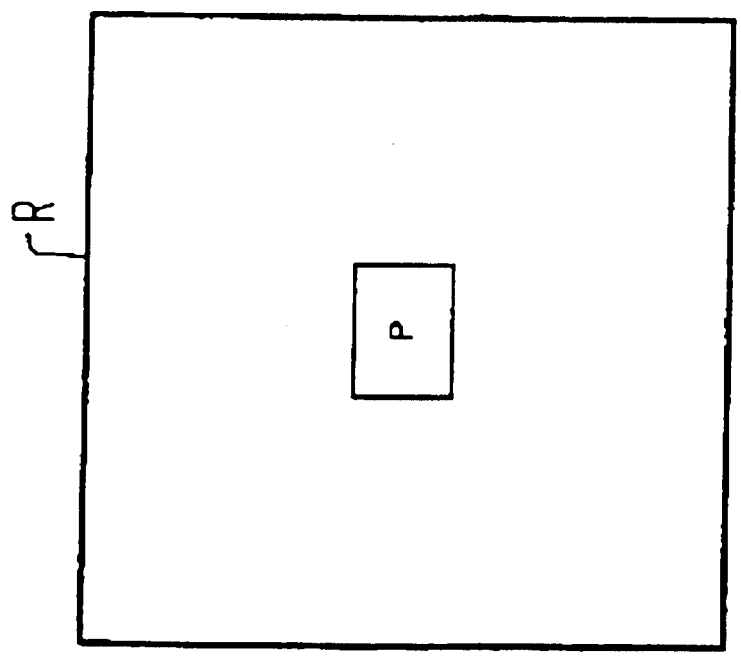

Furthermore, electron beam writing or an optical writing method can be used for the reticle. FIG. 43A shows a reticle pattern of a basic element and FIG. 43B shows a final two-dimensional arrangement of a corresponding relationship of an optical homogenizer. In FIGS. 43A and 43B, the basic element (=basic unit P0) P that is drawn on the reticle can be repeated and patterned in an arrayed state within an effective diameter of a glass substrate.

Tenth Embodiment

Figure 44B:
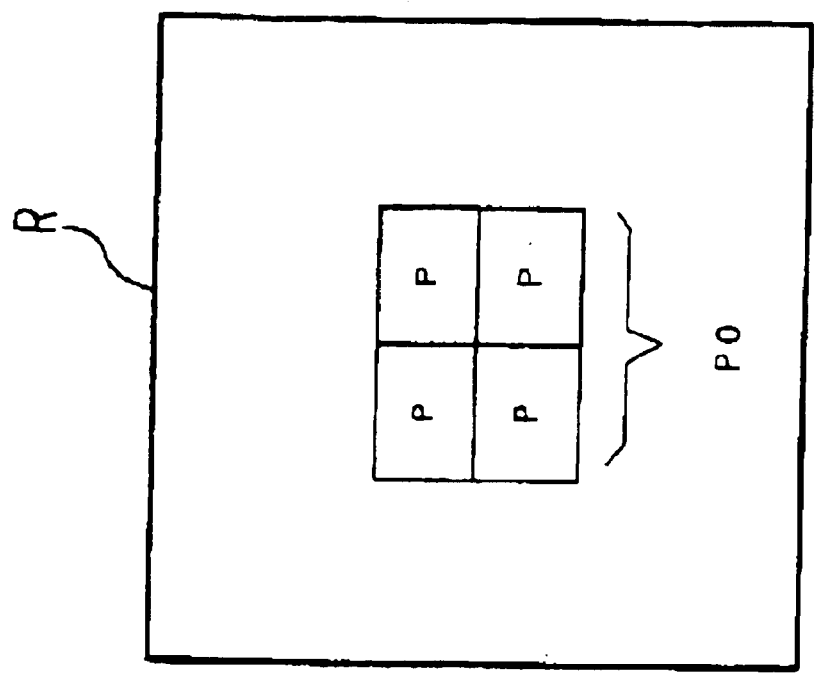
FIGS. 44A and 44B are diagrams showing a reticle in a tenth embodiment of this invention, and a patterning rule of an optical homogenizer using the reticle.
Figure 44A:
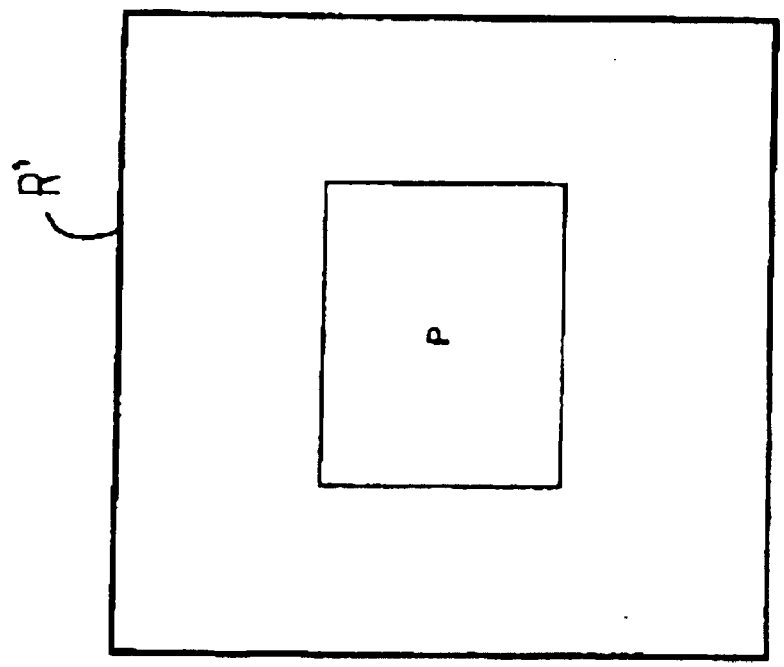

The tenth embodiment relates to a case including a plurality of basic elements as a basic unit on a reticle. FIG. 44B shows a case including four basic elements P as a basic unit P0 on a reticle. In the case of using this reticle, four basic patterns can be exposed in one exposure period. That is, in order to expose the pattern of FIG. 43B, compared to the case in which the pattern is exposed by using the reticle of FIG. 43A, the number of exposures can be reduced to ¼. Because of this, fabrication throughput of optical homogenizers is improved, and the cost of the optical homogenizer can be reduced. As a method of fabricating the reticle shown in FIG. 44B, there is a method in which an original reticle R' including one basic element pattern shown in FIG. 44A is written by electron beam writing and exposed a plurality of times by an optical exposure apparatus, which is not depicted, and patterned. Furthermore, as another method, it is also acceptable to directly write a plurality of basic element patterns by electron beam writing. In this case, writing errors generated when the respective basic patterns are written vary, and since the respective elements are eventually used in an array state, there is an effect such that the reticle writing errors are canceled.

Figure 45B:
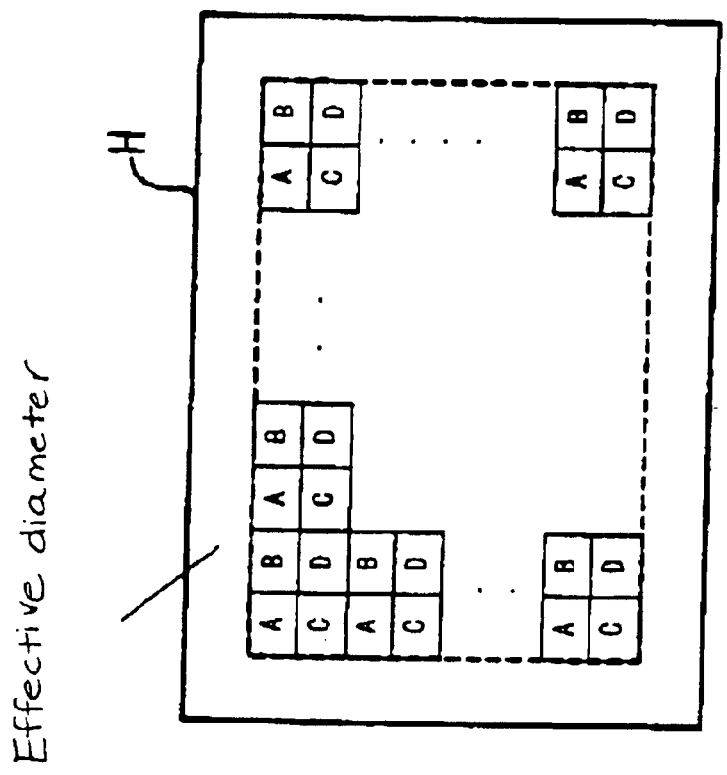
FIGS. 45A and 45B are diagrams showing the reticle in the tenth embodiment of this invention, and a patterning rule of an optical homogenizer using the reticle.
Figure 45A:
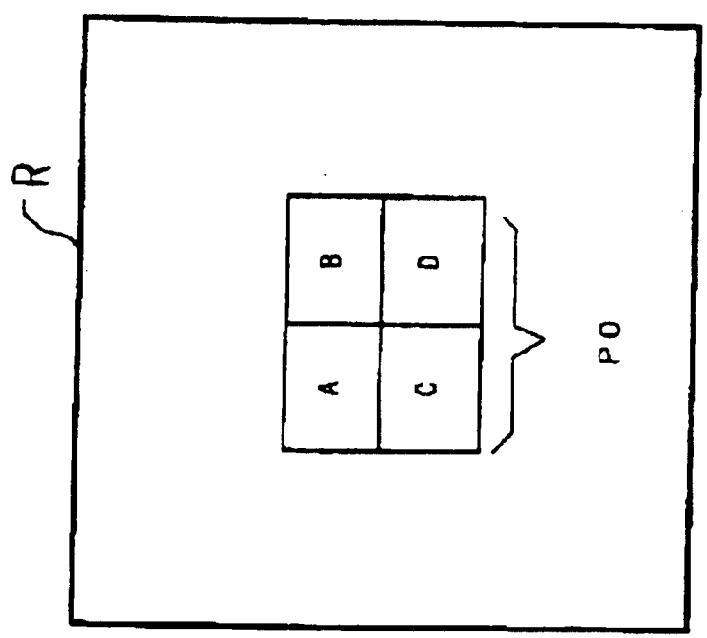

Here, the tenth embodiment can also be applied to patterning described in the seventh embodiment. FIG. 45A is a reticle R including basic elements A–D as a basic unit P0. The basic elements A–D are respectively patterned so as to generate illumination areas A–D of FIG. 39. FIG. 45B is an optical homogenizer fabricated by transferring the reticle of FIG. 45A a plurality of times onto a glass substrate, and patterning. By using this optical homogenizer, non-homogeneousness of illumination due to diffraction, fabricating errors, or the like can be controlled, and a desired illumination pattern can be obtained. Furthermore, it is preferable that the same number of each of the basic elements A–D are included within the effective diameter of the optical homogenizer.

Eleventh Embodiment

Figure 46B:
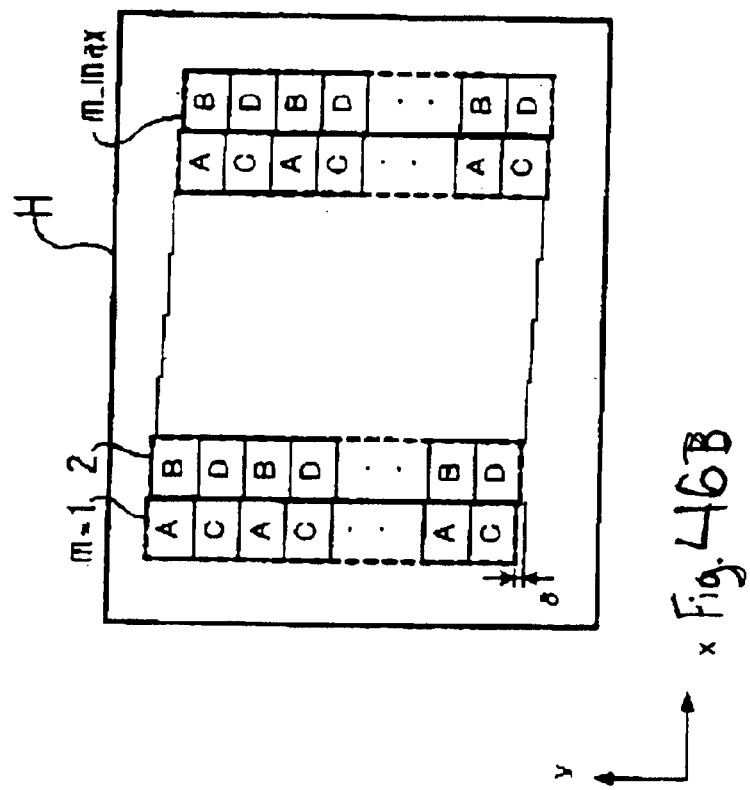
FIGS. 46A and 46B are diagrams showing a patterning rule of an optical homogenizer in an eleventh embodiment of this invention.
Figure 46A:
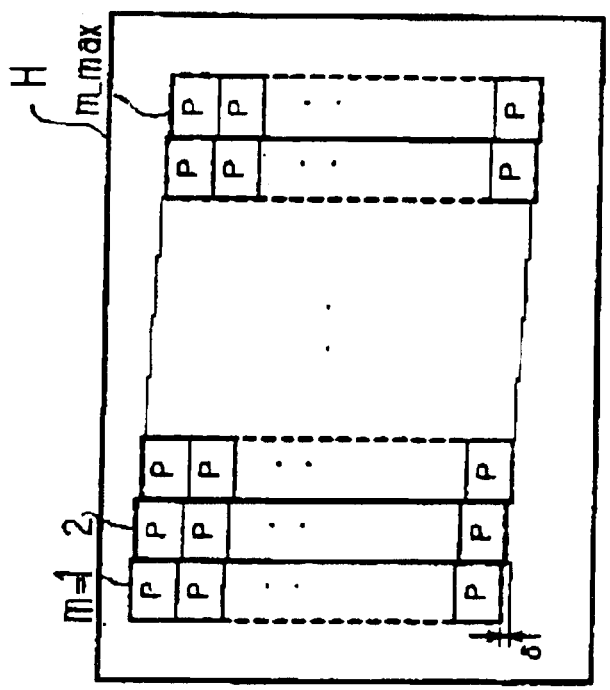

The eleventh embodiment is for reducing interference noise in a specified direction. FIG. 46A is an example of a case in which interference noise that periodically changes in a Y direction is reduced. In the eleventh embodiment, the basic patterns within an optical homogenizer are patterned as columns (sets of basic elements of which the X coordinate is equal), such that the Y coordinates of the different columns are gradually shifted. By this arrangement, if two or more independent coherent areas exist within the effective diameter of the optical homogenizer, the interference noises generated by these independent coherent areas are shifted to the Y direction and superimposed on the wafer (conjugate) plane.

The phase shift amount of the intensity distribution is proportional to the coordinate shift LH of the respective columns, and is given by the following equation (43).

$$\Delta/\lambda = L\_H/P\_FT \tag{43}$$

Here, $L\_H$ is measured from the far left column, which is a reference column. Furthermore, $P\_FT = fL1 \cdot \lambda/P\_FE$ can be established.

Next, if the shift pitch of each column is $\delta$ and the index of the column is m (the far left column is m=1), $L\_H=(m-1)\times\delta$ can be established. By substituting this into equation (43), the following equation (44) can be obtained.

$$\Delta/\lambda = (m-1)\times\delta/P\_FT \quad (m=1,\ldots,m\_max) \tag{44}$$

$m\_max$ is the number of columns. According to equation (44), in order to effectively reduce the interference noise, $$\delta/P\_FT = 1/m\_max \tag{45}$$

can be established. That is, $$\Delta/\lambda = (m-1)/m\_max \tag{46}$$

can be established. If the number of columns $m\_max$ is 4, as one example, $$\Delta/\lambda = 0, 1/4, 2/4, 3/4 \tag{47}$$

It is clear that the phase of the interference noise generated in each column of m=1 through 4 is gradually shifted, and that the interference noise can be effectively filled at an equal interval. The following equation (48) is obtained by solving equation (45) for $\delta$.

$$\delta = P\_FT/m\_max \tag{48}$$

By substituting the calculated value of $P\_FT$ and $m\_max$ into equation (48), $\delta$ can be obtained. The following shows an actual numerical value example.

When the basic parameters are the same as in the eighth embodiment and equation (38), $P\_FT$ is the same as in equation (39).

$$P\_FT = 24.8 \, \mu m \tag{39}$$

When the column number $m\_max$ is 40, $\delta$ can be obtained by substituting this and equation (39) into equation (48).

$$\delta = P\_FT/m\_max = 0.62 \, \mu m \tag{40}$$

Figure 47B:
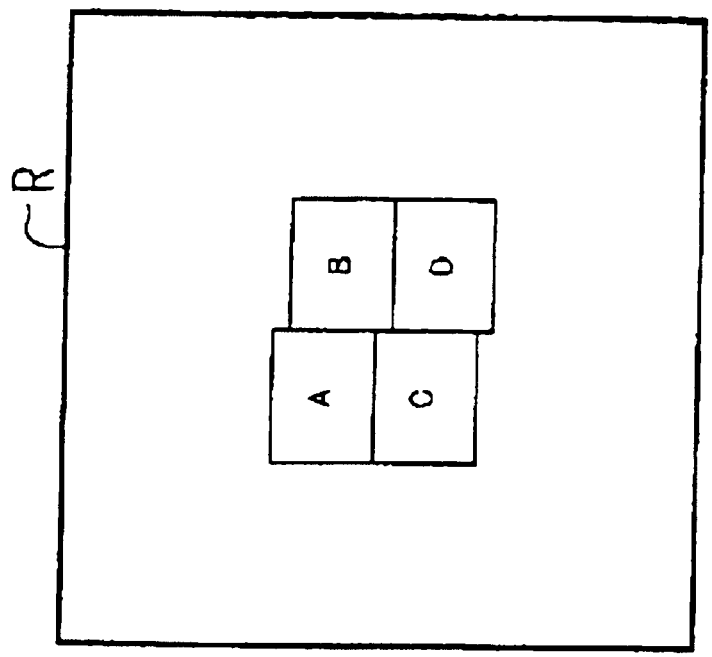
FIGS. 47A and 47B are diagrams showing an example of a reticle original substrate of an optical homogenizer in the eleventh embodiment of this invention.
Figure 47A:
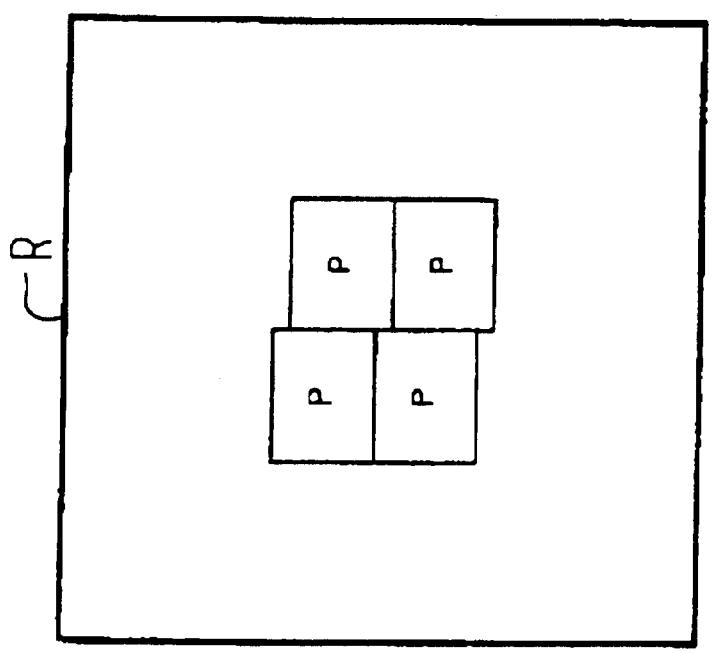

The above-mentioned value is typical, but in the case of an optical homogenizer that is fabricated by etching a plurality of basic elements on a glass substrate like this embodiment of the invention, it is possible to control the pitch $\delta$ of the shift of each column with sufficient accuracy, and the above-mentioned method can be implemented. By fabricating an optical homogenizer with this type of pitch, the effect of the interference noise was effectively reduced. Here, an embodiment is also possible in which the eleventh and tenth embodiments are combined. The pattern of the optical homogenizer for this case can be given as shown in FIG. 46B. Additionally, as a reticle to pattern an optical homogenizer in FIGS. 46A and 46B, a reticle that includes a desired column direction shift in advance, such as in FIGS. 47A and 47B, can be used.

Furthermore, in the eleventh or eighth embodiments, it is also acceptable to fill an interference noise with an unequal interval (that is, k is not constant, but gradually changes). Various embodiments are also possible in which the first through eleventh embodiments are combined.

In each embodiment explained above, the Y direction effective diameter of the second light source plane by the diffractive optical element completely fills the effective diameter of the fly eye element lens, that is, arrangement is performed without any space. However, this invention is not limited to this, and it is also acceptable to fill the effective diameter of the fly eye element lens with some spaces in order to avoid the scattering noise at the edge of the fly eye element lens.

Furthermore, for the basic optical elements within the diffractive optical element, elongate basic optical elements were repeatedly arranged in the Y direction, but the shape of the basic optical elements can be polygonal. Additionally, the basic optical elements do not need to be constantly a certain shape. Furthermore, with respect to the arrangement of the partial optical elements within the basic optical elements, an arrangement can be used that is different from the above-mentioned embodiments. Furthermore, the diffractive optical element can be formed by a plurality of basic optical elements, but it is also acceptable to have one basic optical element that is included in the diffractive optical element. In this case, the basic optical element itself is the diffractive optical element.

In addition, in the above-mentioned embodiments, the partial illumination areas formed by the partial optical elements match the element lenses of the fly eye integrator, but it is possible to make the partial illumination areas wider or narrower than in the above-mentioned embodiments. Furthermore, the shape of the partial optical elements can be polygonal. Additionally, the partial optical elements do not need to be a specified shape. Various embodiments are possible for the shape and the method of arranging the basic optical elements and the partial optical elements with respect to the shape of the effective diameter of the diffractive optical elements and the shape of the effective diameter of the fly eye integrator. Furthermore, as described above, when aberration is not corrected, even if the illumination method changes, the position of the diffractive optical element can be constant. Therefore, in this case, the structure of the mechanism holding the diffractive optical element can be simplified.

Furthermore, approximately 100 element lenses of the fly eye integrator were used in the description given above, but needless to say, this invention also can be applied to the case when the number of elements is approximately 1,000. The greater the number of elements, the more evenness of the illumination of the illumination light of the diaphragm surface can be improved.

Additionally, this invention is not limited to ring illumination and normal illumination, but can be applied to an arbitrary modified illumination such as quadru-pole illumination or normal illumination.

As described above, switching of the illumination state (normal illumination, ring illumination, quadru-pole illumination, and the like) is synchronized with switching of the diffractive optical element and the aperture diaphragm, but this invention can also be applied to a case without an aperture diaphragm. That is, in this invention, it is possible to generate an arbitrary illumination distribution, so that the intensity distribution that the diffractive optical elements of the respective illumination states generate on the fly eye integrator can also play a role of the diaphragm of the respective illumination states.

However, without completely eliminating the aperture diaphragm, in order to eliminate an optical noise, it is also possible to fix and arrange an aperture diaphragm substantially corresponding to a pupil surface shape of the projection lens. Furthermore, there are many cases in which a normal diffractive optical element generates the zeroth order light (direct light) that is not diffracted due to fabricating errors or the like. This zeroth order light is concentrated in the vicinity of the center element of the fly eye integrator and becomes optical noise. Because of this, regardless of the illumination state, it is preferable that the area in the vicinity of the center of the fly eye integrator (in the vicinity of the optical axis) is constantly shielded. The shielding device can be arranged at an arbitrary position between the vicinity of the input surface of the fly eye integrator and the vicinity of the output surface of the fly eye integrator.

In the embodiments of this invention described above, as an optical integrator, a fly eye lens is used in which a plurality of optical elements are accumulated, but this invention is not limited to a fly eye lens. For example, as a second fly eye lens, a rod type integrator with an internal reflective surface along the optical axis direction may be used. Furthermore, as a relay optical system, a device may be used in which a plurality of light source images formed at the output surface side or the output end surface of the first fly eye lens are in a conjugate relationship with the input surface of a rod type integrator. In this case, a substantially planar light source formed by the second optical integrator is formed by a virtual image of a plurality of light source images formed in the vicinity of the position of the input end surface of a rod type integrator. Furthermore, as an optical integrator, a microlens array also can be used in which a plurality of lenses are formed within one substrate plane.

Furthermore, as a light source 1 in the above-mentioned embodiments, a KrF excimer laser supplying a laser beam wavelength of 248 nm, an ArF excimer laser supplying a laser beam with a wavelength of 193 nm, an $F_2$ excimer laser supplying a laser beam with a wavelength of 157 nm, a high frequency wave of a YAG laser, an i beam (wavelength 365 nm) of a mercury lamp, or the like can be used.

Furthermore, the use of the projection exposure apparatus of the above-mentioned embodiments is not limited to the use of fabricating a semiconductor. For example, it can also be widely used as a liquid crystal exposure apparatus to expose a liquid crystal display element pattern on a square-shaped glass plate, or as an exposure apparatus to fabricate a thin film magnetic head.

Additionally, as the projection optical system of the above-mentioned embodiments, a refractive type projection optical system, a reflective type projection optical system, a reflective/refractive type projection optical system, or the like can be applied, and the projection magnification is not limited to a reduction magnification, but uniform magnification and enlargement magnification can also be used. Thus, this invention can be variously modified.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A diffractive optical element that converts an input light beam into an output light having a specified cross-sectional shape in a specified plane which is set in a vicinity of a focal plane of a lens or in a substantially far field plane from said diffractive optical element, the diffractive optical element comprising:

a plurality of partial optical elements, wherein each of the plurality of partial optical elements converts the input light beam into a respective partial light beam which substantially illuminates a division of said specified cross-sectional shape, wherein the plurality of partial optical elements have a first partial optical element which converts the input light beam into a first partial light beam, and a second partial optical element which converts the input light beam into a second partial light beam, wherein the first and the second partial light beams are adjacent to each other at the specified plane, and wherein the first and the second partial optical elements are separated from each other, wherein the partial optical elements have a power;

a sum of the respective partial light beams of all of the plurality of partial optical elements matches the specified cross-sectional shape of the output light beam, wherein said each of the plurality of partial optical elements have a respective zoned diffractive pattern which substantially corresponds to a pattern within a unique divided zone of a diffractive lens respectively, said each zoned diffractive pattern has an arc, a center of curvature of the arc is decentered from a center of the partial optical element, wherein said each zoned diffractive pattern of said partial optic elements can be connected in a substantially continuous manner while superposing each center of curvature of said arc, and a shape of a border line of a whole continued pattern of all zoned diffractive patterns substantially has a figure similar to said specified cross-sectional shape.

2. The diffractive optical element of claim 1, wherein the diffractive optical element includes a plurality of basic optical elements, each of the basic optical elements including a plurality of the partial optical elements.

3. An illumination device that illuminates a mask having a pattern, the illumination device comprising:

a light source that supplies a light beam;

a light beam converter including the diffractive optical element of claim 2, the light beam converter positioned to receive the light beam supplied by the light source;

an optical integrator positioned to receive the output light beam output from the light beam converter, the optical integrator forms a substantially planar light source on a specified plane based on the output light beam from the light beam converter; and a condenser optical system that guides the light beam from the optical integrator to the mask;

wherein the light beam converter is adjustable to change an optical intensity distribution on the specified plane.

4. A projection exposure apparatus comprising:

a first stage for holding a mask;

the illumination device of claim 3 positioned relative to the first stage to illuminate a mask held by the first stage;

a second stage for holding a substrate to be exposed; and a projection optical system between the first stage and the second stage to project and expose an image of the pattern of the mask that has been illuminated by the illumination device onto the substrate to expose the substrate.

5. An exposure method, comprising the steps of:

illuminating a mask utilizing the illumination device of claim 3; and forming an image of a pattern of the mask that has been illuminated onto a substrate that is coated by a sensitive material.

6. The diffractive optical element of claim 2, wherein the plurality of basic optical elements includes a first basic optical element and a second basic optical element, and a specified cross-sectional shape formed by the first basic optical element is the same as a specified cross-sectional shape formed by the second basic optical element.

7. The diffractive optical element of claim 6, wherein a position of the specified cross-sectional shape formed by the first basic optical element and a position of the specified cross-sectional shape formed by the second basic optical element are different.

8. The diffractive optical element of claim 2, wherein the plurality of basic optical elements are arranged in a condensed state.

9. The diffractive optical element of claim 2, wherein the plurality of basic optical elements are arranged in a rectangular shape.

10. An illumination device that illuminates a mask having a pattern, the illumination device comprising:

a light source that supplies a light beam;

a light beam converter including the diffractive optical element of claim 1, the light beam converter positioned to receive the light beam supplied by the light source;

an optical integrator positioned to receive the output light beam output from the light beam converter, the optical integrator forms a substantially planar light source on a specified plane based on the output light beam from the light beam converter; and a condenser optical system that guides the light beam from the optical integrator to the mask;

wherein the light beam converter is adjustable to change an optical intensity distribution on the specified plane.

11. A projection exposure apparatus comprising:

a first stage for holding a mask;

the illumination device of claim 10 positioned relative to the first stage to illuminate a mask held by the first stage;

a second stage for holding a substrate to be exposed; and a projection optical system between the first stage and the second stage to project and expose an image of the pattern of the mask that has been illuminated by the illumination device onto the substrate to expose the substrate.

12. An exposure method, comprising the steps of:

illuminating a mask utilizing the illumination device of claim 10; and forming an image of a pattern of the mask that has been illuminated onto a substrate that is coated by a sensitive material.

13. The diffractive optical element of claim 1, wherein the diffractive lens has a curved pattern of a Fresnel Zone Plate.

14. A diffractive optical element that converts an input light beam into an output light beam having a specified cross-sectional shape, the diffractive optical element comprising a plurality of partial optical elements, each of the plurality of partial optical elements converts the input light beam into a respective partial light beam that does not have the specified cross-sectional shape, and a sum of the respective partial light beams of all of the plurality of partial optical elements matches the specified cross-sectional shape of the output light beam, wherein the diffractive optical element includes a plurality of basic optical elements, each of the basic optical elements including the plurality of partial optical elements, and wherein each of the partial optical elements has a shape corresponding to a phase distribution that combines a phase distribution of a rotationally symmetrical lens and a phase distribution of a diffractive grid that deflects the input light beam in a specified direction.

15. An illumination device that illuminates a mask having a pattern, the illumination device comprising:

a light source that supplies a light beam;

a light beam converter including the diffractive optical element of claim 14, the light beam converter positioned to receive the light beam supplied by the light source;

an optical integrator positioned to receive the output light beam output from the light beam converter, the optical integrator forms a substantially planar light source on a specified plane based on the output light beam from the light beam converter; and a condenser optical system that guides the light beam from the optical integrator to the mask;

wherein the light beam converter is adjustable to change an optical intensity distribution on the specified plane.

16. A projection exposure apparatus comprising:

a first stage for holding a mask;

the illumination device of claim 15 positioned relative to the first stage to illuminate a mask held by the first stage;

a second stage for holding a substrate to be exposed; and a projection optical system between the first stage and the second stage to project and expose an image of the pattern of the mask that has been illuminated by the illumination device onto the substrate to expose the substrate.

17. An exposure method, comprising the steps of:

illuminating a mask utilizing the illumination device of claim 15; and forming an image of a pattern of the mask that has been illuminated onto a substrate that is coated by a sensitive material.

18. A method of making an optical homogenizer, the method comprising the steps of:

configuring an illumination area having a predetermined shape;

after configuring the illumination area, dividing the illumination area, or an area having a shape similar to the shape of the illumination area, into a plurality of rectangular partial areas;

dividing a single lens into a plurality of lens segments, each segment having a rectangular outer shape, based on the plurality of rectangular partial areas;

defining a basic optical element by densely arranging the plurality of lens segments into a rectangular shape;

creating a reticle on which a pattern of the basic optical element is formed;

coating a sensitive material onto a substrate;

reduction exposing the pattern onto the sensitive material on the substrate via a reduction projection optical system;

shifting a position of the substrate and repeating the reduction exposing step, thereby generating latent images of the basic optical element in an arrayed state on the sensitive material;

developing the latent images; and etching the substrate to form the optical homogenizer;

wherein the illumination area having the predetermined shape includes at least one enclosed area having a filled-up light distribution, the at least one enclosed area is divided into the rectangular partial area, and wherein the optical homogenizer is capable of forming the illumination area with a homogeneous light distribution.

19. The method of claim 18, wherein the reticle includes a plurality of patterns of the basic optical element.

20. The method of claim 19, wherein the pattern is formed on the reticle in the creating step by writing the pattern on the reticle with an electron beam.

21. The method of claim 19, wherein patterns of the plurality of the basic optical elements are different.

22. The method of claim 19, wherein a plurality of basic optical elements are formed in a two-dimensional matrix on the reticle, and a column direction of the basic optical elements and a line direction of the basic optical elements non-orthogonal relative to each other.

23. The method of claim 19, wherein a plurality of basic optical elements are formed in a two-dimensional matrix on the reticle, and at least one of a column direction of the basic optical elements and a line direction of the basic optical elements are non-parallel relative to a side of the basic optical elements.

24. The method of claim 18, wherein the pattern is formed on the reticle in the creating step by writing the pattern on the reticle with an electron beam.

25. The method of claim 18, wherein the basic optical element has a plurality of partial optical elements, and patterns of the partial optical elements are discrete.

26. The method of claim 18, wherein a plurality of latent image regions are formed in a two-dimensional matrix, and a column direction of the latent image regions and a line direction of the latent image regions are non-orthogonal relative to each other.

27. The method of claim 18, wherein a plurality of latent image regions are formed in a two-dimensional matrix, and at least one of a column direction of the latent image regions and a line direction of the latent image regions are non-parallel relative to a side of the latent image regions.

28. A method of making an optical homogenizer having a basic optical element that includes a plurality of partial optical elements, the optical homogenizer converting an input light beam into an output light beam having a shape corresponding substantially to a specified cross-sectional shape, the method comprising the steps of:

dividing the shape corresponding substantially to the specified cross-sectional shape into a plurality of partial areas;

arranging the plurality of partial optical elements, which correspond to the plurality of partial areas, into a condensed state, thereby defining the basic optical element;

creating a reticle on which a pattern of the basic optical element is formed; coating a sensitive material onto a substrate;

reduction exposing the pattern onto the sensitive material on the substrate via a reduction projection optical system;

shifting a position of the substrate and repeating the reduction exposing step, thereby generating latent images of the basic optical element in an arrayed state on the sensitive material;

developing the latent images; and etching the substrate, wherein the pattern is formed on the reticle in the creating step by writing the pattern on the reticle by optical writing.

29. A method of making an optical homogenizer comprising the steps of:

creating a reticle on which a pattern of a basic optical element is formed;

coating a sensitive material onto a substrate;

reduction exposing the pattern onto the sensitive material on the substrate via a reduction projection optical system;

shifting a position of the substrate and repeating the reduction exposing step, thereby generating latent images of the basic optical element in an arrayed state on the sensitive material;

developing the latent images; and etching the substrate, wherein the pattern is formed on the reticle in the creating step projection exposing the reticle with a pattern from an original substrate that was fabricated by electron beam writing.

* * * * *